US009755662B2

(12) United States Patent
Liu

(10) Patent No.: US 9,755,662 B2
(45) Date of Patent: Sep. 5, 2017

(54) DATA TRANSMISSION METHOD AND APPARATUS

(71) Applicant: Huawei Technologies Co., Ltd., Shenzhen, Guangdong (CN)

(72) Inventor: Yongjun Liu, Beijing (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 15/357,787

(22) Filed: Nov. 21, 2016

(65) Prior Publication Data

US 2017/0126247 A1     May 4, 2017

Related U.S. Application Data

(63) Continuation of application No. PCT/CN2014/078150, filed on May 22, 2014.

(51) Int. Cl.
    *H03M 7/34*      (2006.01)
    *H03M 7/30*      (2006.01)

(52) U.S. Cl.
    CPC ................ *H03M 7/3082* (2013.01)

(58) Field of Classification Search
    CPC ............... H03M 7/3082; H03M 7/00
    (Continued)

(56) References Cited

U.S. PATENT DOCUMENTS 4,905,259 A * 2/1990 Nardi ............... H04N 19/94
                                                                                                         348/390.1

2008/0288850 A1* 11/2008 Rhee ............... H04L 1/0066
                                                                                                         714/781

(Continued)

FOREIGN PATENT DOCUMENTS

| CN | 1665166 A1 | 9/2005 |
|---|---|---|
| CN | 101222297 A | 7/2008 |
| CN | 102437858 A | 5/2012 |

OTHER PUBLICATIONS

"IEEE Standard for Information Technology—Telecommunications and Information Exchange Between Systems—Local and Metropolitan Area Networks-Specific Requirements, Part 15.4: Wireless Medium Access Control (MAC) and Physical Layer (PHY) Specifications for Low-Rate Wireless Personal Area Networks (WPANs)," IEEE Standard 802.15.4™, IEEE Computer Society, Sep. 8, 2006, 323 pages.

(Continued)

*Primary Examiner* — Jean B Jeanglaude

(57) ABSTRACT

A data transmission method, which can improve an error correction capability during decoding, includes: determining, by a transmit end, a target code length L and an original code length K; generating an initial code block according to the original code length K, where the initial code block includes $2^K$ initial code words; generating a superposition code block according to the target code length and an arrangement order of the $2^K$ initial code words in the initial code block, and superposing the initial code words and the corresponding superposition code words to generate the block code words in the block code set, so that a difference between feature code distances in the block code set is ±1 or 0, where the feature code distance is a code distance between the block code words.

20 Claims, 8 Drawing Sheets

(58) Field of Classification Search
USPC .................................................. 341/50, 51
See application file for complete search history.

(56) References Cited

U.S. PATENT DOCUMENTS

2010/0318875 A1   12/2010   Xu et al.
2011/0214037 A1*   9/2011   Okamura ............. H03M 13/116
                                                            714/777

OTHER PUBLICATIONS

Baicheva, T., et al., "Binary and Ternary Linear Quasi-Perfect Codes with Small Dimensions," IEEE Transactions on Information Theory, vol. 54, No. 9, Sep. 2008, pp. 4335-4339.
Etzion, T., et al., "Quasi-Perfect Codes with Small Distance," IEEE Transaction on Information Theory, vol. 51, No. 11, Nov. 2005, pp. 3938-3946.

* cited by examiner

DATA TRANSMISSION METHOD AND APPARATUS

CROSS-REFERENCE TO RELATED APPLICATIONS

This application is a continuation of International Application No. PCT/CN2014/078150, filed on May 22, 2014, the disclosure of which is hereby incorporated by reference in its entirety.

TECHNICAL FIELD

The present invention relates to the field of communications, and in particular, to a data transmission method and apparatus.

BACKGROUND

Currently, in a known block coding technology, an information sequence of a source is coded according to an independent block, that is, during coding, every K information bits are grouped into one block for independent processing, and transformed into a binary code block with a length of L (L>K). For example, in a duplicate block coding technology, an information bit is simply duplicated twice or more than twice. For example, when K=2 and L=4, the following block codes can be obtained: 0000, 0101, 1010, and 1111.

However, in this duplicate block coding technology, an error correction capability during decoding is poor, that is, if any bit of four bits in each block code generated by using the duplicate block coding technology is erroneous, error correction cannot be implemented. For example, 0000 may be changed to 0001 if one bit is erroneous, but whether 0001 is generated due to a bit error in 0000 or a bit error in 0101 cannot be determined.

Therefore, it is expected to provide a technology capable that can improve an error correction capability during decoding.

SUMMARY

The present invention provides a data transmission method and apparatus, which can improve an error correction capability during decoding.

According to a first aspect, a data transmission method is provided, where the method includes: determining, by a transmit end, a target code length L, where the target code length is a quantity of bits included in each block code word in a block code set to be generated, and L≥3; determining an original code length K, where the original code length is a quantity of bits included in an original code word to be transmitted to a receive end, and L>K≥2; generating an initial code block according to the original code length K, where the initial code block includes $2^K$ initial code words; generating a superposition code block according to the target code length and an arrangement order of the $2^K$ initial code words in the initial code block, where the superposition code block includes $2^K$ superposition code words, and the $2^K$ initial code words correspond to the $2^K$ superposition code words in a one-to-one manner, and superposing the initial code words and the corresponding superposition code words to generate the block code words in the block code set, so that a difference between feature code distances in the block code set is ±1 or 0, where the feature code distance is a code distance between the block code words; performing coding processing on the original code word according to the block code set, so as to determine, from the block code words in the block code set, a target block code word corresponding to the original code word; and transmitting the target block code word to the receive end.

With reference to the first aspect, in a first implementation manner of the first aspect, when K≤3, the initial code block includes $2^K$ different initial code words, and each initial code word includes K bits; and the generating a superposition code block according to the target code length and an arrangement order of the $2^K$ initial code words in the initial code block includes: determining a maximum code distance w between the superposition code words in the superposition code block according to the target code length L and the original code length K; and generating the superposition code block according to the arrangement order of the $2^K$ initial code words in the initial code block and the maximum code distance between the superposition code words in the superposition code block.

With reference to the first aspect and the foregoing implementation manner of the first aspect, in a second implementation manner of the first aspect, the determining a maximum code distance w between the superposition code words in the superposition code block according to the target code length L and the original code length K includes: when K=2, if L is an integer multiple of 3, w=2L/3; when K=2, if L is not an integer multiple of 3, w=[2L/3]+1, where [2L/3] is a maximum integer that is less than or equal to 2L/3; and when K=3, w=[4L/7], where [4L/7] is a maximum integer that is less than or equal to 4L/7.

With reference to the first aspect and the foregoing implementation manners of the first aspect, in a third implementation manner of the first aspect, when K≥4, the generating an initial code block according to the original code length K, where the initial code block includes $2^K$ initial code words, includes: determining a sub block code set, where the sub block code set includes $2^{K-1}$ sub block code words, a quantity of bits included in each sub block code word is $L_0$, the sub block code set is generated according to a first initial code block and a first superposition code block, the first initial code block includes $2^{K-1}$ different first initial code words, each first initial code word includes K−1 bits, the first superposition code block is determined according to the quantity $L_0$ of bits included in the sub block code word and an arrangement order of the $2^{K-1}$ first initial code words in the first initial code block, the superposition code block includes $2^{K-1}$ superposition code words, each superposition code word includes $L_0-K+1$ bits, and in the sub block code set, code distances between code words are all s, where $L_0<L$; superposing four such sub block code sets to generate an intermediate block code set, where the intermediate block code set includes $2^K$ intermediate block code words, and intermediate block code words arranged in the $z^{th}$ and $(z+2^{K-1})^{th}$ positions in the intermediate block code set are formed by superposition of sub block code words arranged in the $z^{th}$ positions in two such sub block code sets; and interchanging an intermediate block code word arranged in the $v^{th}$ position with an intermediate block code word arranged in the $(2^{K-1}-v+1)^{th}$ position in the intermediate block code set, and interchanging an intermediate block code word arranged in the $(2^{K-1}+v)^{th}$ position with an intermediate block code word arranged in the $(2^K-v+1)^{th}$ position in the intermediate block code set to generate a sub initial code block, where the initial code block includes x such sub initial code blocks, v ∈[1, $2^{K-2}$], and x≥1; and the generating a superposition code block according to the target code length and an arrangement order of the $2^K$ initial code words in the initial code block includes: generating a superposition code block including y sub superposition code blocks, so that each sub superposition code block includes $2^K$ superposition code words with a code length $L_1$, where elements on an antidiagonal in a code distance matrix of each sub superposition code block are all q, and remaining non-zero elements are all p, where q>p>0, y≥1, and the following formulas are satisfied: x:y=(q-p):s, and $x*L_0+y*L_1=L$.

With reference to the first aspect and the foregoing implementation manners of the first aspect, in a fourth implementation manner of the first aspect, the $a^{th}$ initial code word in the $2^K$ initial code words corresponds to the $a^{th}$ superposition code word in the $2^K$ superposition code words, where a is a positive integer and $a≤2^K$.

With reference to the first aspect and the foregoing implementation manners of the first aspect, in a fifth implementation manner of the first aspect, when K=2 and L is an even number, the initial code block includes $2^K$ different initial code words, and each initial code word includes K bits; and the generating a superposition code block according to the target code length and an arrangement order of the $2^K$ initial code words in the initial code block includes: generating L/2-1 sub superposition code blocks, where each sub superposition code block includes $2^K$ sub superposition code words, and each sub superposition code word includes two bits; and performing first ordering processing on each sub superposition code block according to the arrangement order of the $2^K$ initial code words in the initial code block, so as to determine an arrangement order of the sub superposition code words in each sub superposition code block, and generating the superposition code block according to each sub superposition code block obtained after the first ordering processing, where a first sub superposition code word arranged in the first position in the $m^{th}$ sub superposition code block obtained after the first ordering processing is any code word in the $m^{th}$ sub superposition code block, and a second sub superposition code word in the $m^{th}$ sub superposition code block is arranged in the $i_1^{th}$ position, where the second sub superposition code word is a code word having a maximum code distance from the first sub superposition code word in the $m^{th}$ sub superposition code block, and for a first local block code set that is formed by m-1 sub superposition code blocks before the $m^{th}$ sub superposition code block and the initial code block and includes $2^K$ local block code words, a first local block code word arranged in the $i_1^{th}$ position is a code word having a minimum code distance from a second local block code word arranged in the first position in the $2^K$ local block code words; or performing second ordering processing on each sub superposition code block according to the arrangement order of the $2^K$ initial code words in the initial code block, so as to determine an arrangement order of the sub superposition code words in each sub superposition code block, and generating the superposition code block according to each sub superposition code block obtained after the second ordering processing, where a third sub superposition code word arranged in the first position in the $m^{th}$ sub superposition code block obtained after the second ordering processing is any code word in the $m^{th}$ sub superposition code block, and a fourth sub superposition code word in the $m^{th}$ sub superposition code block is arranged in the $i_2^{th}$ position, where the fourth sub superposition code word is a code word having a minimum code distance from the third sub superposition code word in the $m^{th}$ sub superposition code block, and for a second local block code set that is formed by m-1 sub superposition code blocks before the $m^{th}$ sub superposition code block and the initial code block and includes $2^K$ local block code words, a third local block code word arranged in the $i_2^{th}$ position is a code word having a maximum code distance from a fourth local block code word arranged in the first position in the $2^K$ local block code words.

With reference to the first aspect and the foregoing implementation manners of the first aspect, in a sixth implementation manner of the first aspect, when K=2 and L is an odd number, the initial code block includes $2^K$ different initial code words, and each initial code word includes K bits; and the generating a superposition code block according to the target code length and an arrangement order of the $2^K$ initial code words in the initial code block includes: generating (L-1)/2 sub superposition code blocks, where a first sub superposition code block includes $2^K$ sub superposition code words, each sub superposition code word includes two bits, and first sub superposition code blocks are the first (L-1)/2-1 sub superposition code blocks in the (L-1)/2 sub superposition code blocks; and a second sub superposition code block includes $2^K$ sub superposition code words, each sub superposition code word includes one bit, and the second sub superposition code block is a last sub superposition code block in the (L-1)/2 sub superposition code blocks; performing third ordering processing on each first sub superposition code block according to the arrangement order of the $2^K$ initial code words in the initial code block, so as to determine an arrangement order of the sub superposition code words in each first sub superposition code block, where a fifth sub superposition code word arranged in the first position in the $m^{th}$ first sub superposition code block is any code word in the $m^{th}$ first sub superposition code block, and a sixth sub superposition code word in the $m^{th}$ first sub superposition code block is arranged in the $i_3^{th}$ position, where the sixth sub superposition code word is a code word having a maximum code distance from the fifth sub superposition code word in the $m^{th}$ first sub superposition code block, and for a third local block code set that is formed by m-1 first sub superposition code blocks before the $m^{th}$ sub superposition code block and the initial code block and includes $2^K$ local block code words, a fifth local block code word arranged in the $i_3^{th}$ position is a code word having a minimum code distance from a sixth local block code word arranged in the first position in the $2^K$ local block code words; in a fourth local block code set that is formed by the first sub superposition code blocks obtained after the third ordering processing and the initial code block and includes $2^K$ local block code words, performing fourth ordering processing on the second sub superposition code block according to an arrangement of the $2^K$ local block code words, where if code distances between the local block code words in the fourth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the fourth local block code set are not completely the same, when a code distance between a seventh local block code word arranged in the $i_4^{th}$ position and an eighth local block code word arranged in the $j_4^{th}$ position is not a maximum code distance in the code distances between the local block code words, a sub superposition code word arranged in the $i_4^{th}$ position is different from a sub superposition code word arranged in the $j_4^{th}$ position in the second sub superposition code block, or when a code distance between a seventh local block code word arranged in the $i_4{}^{th}$ position and an eighth local block code word arranged in the $j_4{}^{th}$ position is a maximum code distance in the code distances between the local block code words, a sub superposition code word arranged in the $i_4{}^{th}$ position is the same as a sub superposition code word arranged in the $j_4{}^{th}$ position in the second sub superposition code block; and generating the superposition code block according to the first sub superposition code blocks obtained after the third ordering processing and the second sub superposition code block obtained after the fourth ordering processing.

With reference to the first aspect and the foregoing implementation manners of the first aspect, in a seventh implementation manner of the first aspect, when K=2 and L is an odd number, the generating a superposition code block according to the target code length and an arrangement order of the $2^K$ initial code words in the initial code block includes: generating (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks; performing fifth ordering processing on each first sub superposition code block according to the arrangement order of the $2^K$ initial code words in the initial code block, so as to determine an arrangement order of the sub superposition code words in each first sub superposition code block, where a seventh sub superposition code word arranged in the first position in the $m^{th}$ first sub superposition code block is any code word in the $m^{th}$ first sub superposition code block, and an eighth sub superposition code word in the $m^{th}$ first sub superposition code block is arranged in the $i_5{}^{th}$ position, where the eighth sub superposition code word is a code word having a minimum code distance from the seventh sub superposition code word in the $m^{th}$ first sub superposition code block, and for a fifth local block code set that is formed by m−1 first sub superposition code blocks before the $m^{th}$ sub superposition code block and the initial code block and includes $2^K$ local block code words, a ninth local block code word arranged in the $i_5{}^{th}$ position is a code word having a maximum code distance from a tenth local block code word arranged in the first position in the $2^K$ local block code words; in a sixth local block code set that is formed by the first sub superposition code blocks obtained after the fifth ordering processing and the initial code block and includes $2^K$ local block code words, performing sixth ordering processing on the second sub superposition code block according to an arrangement of the $2^K$ local block code words, where if code distances between the local block code words in the sixth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the sixth local block code set are not completely the same, when a code distance between an eleventh local block code word arranged in the $i_6{}^{th}$ position and a twelfth local block code word arranged in the $j_6{}^{th}$ position is not a maximum code distance in the code distances between the local block code words, a sub superposition code word arranged in the $i_6{}^{th}$ position is different from a sub superposition code word arranged in the $j_6{}^{th}$ position in the second sub superposition code block, or when a code distance between an eleventh local block code word arranged in the $i_6{}^{th}$ position and a twelfth local block code word arranged in the $j_6{}^{th}$ position is a maximum code distance in the code distances between the local block code words, a sub superposition code word arranged in the $i_6{}^{th}$ position is the same as a sub superposition code word arranged in the $j_6{}^{th}$ position in the second sub superposition code block; and generating the superposition code block according to the first sub superposition code blocks obtained after the fifth ordering processing and the second sub superposition code block obtained after the sixth ordering processing.

With reference to the first aspect and the foregoing implementation manners of the first aspect, in an eighth implementation manner of the first aspect, the generating a superposition code block according to the target code length and an arrangement order of the $2^K$ initial code words in the initial code block includes: generating the superposition code block according to the target code length and the arrangement order of the $2^K$ initial code words in the initial code block, where the superposition code block includes t sub superposition code blocks, and each sub superposition code block includes $2^K$ sub superposition code words, where for a target local block code set that is formed by the initial code block and $t_0$ sub superposition code blocks and includes $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, where the $t_0$ sub superposition code blocks include a sub superposition code block arranged in the first position to a sub superposition code block arranged in the $t_0{}^{th}$ position in the t sub superposition code blocks, t≥1, and $t_0 \in [1, t]$.

With reference to the first aspect and the foregoing implementation manners of the first aspect, in a ninth implementation manner of the first aspect, when t≥2, the target block code word includes a target initial code word that is in the initial code block and corresponding to the original code word, and a target sub superposition code word that is in each sub superposition code block and corresponding to the original code word; and the transmitting the target block code word to the receive end includes: transmitting a first sub target block code word at a first time, where the first sub target block code word includes the target initial code word and target sub superposition code words in a sub superposition code block arranged in the first position to a sub superposition code block arranged in the $c_1{}^{th}$ position in the sub superposition code blocks, where $c_1 \geq 1$; and transmitting a second sub target block code word at a second time, where the second sub target block code word includes target sub superposition code words in a sub superposition code block arranged in the $c_2{}^{th}$ position to a sub superposition code block arranged in the $c_3{}^{th}$ position in the sub superposition code blocks, where the second time is later than the first time, $c_2=c_1+1$, and $c_3 \leq t$.

With reference to the first aspect and the foregoing implementation manners of the first aspect, in a tenth implementation manner of the first aspect, before the transmitting a second sub target block code word at a second time, the method further includes: receiving code distance information transmitted by the receive end, where the code distance information is determined by the receive end according to a target average value, a target code distance is an average value of minimum code distances between at least one receive code word received by the receive end and block code words in a first block code set, the at least one receive code word includes a first receive code word corresponding to the first sub target block code word, and a quantity of bits included in each block code word in the first block code set is the same as a quantity of bits included in each receive code word; and determining the target code distance according to target code distance information; and the transmitting a second sub target block code word at a second time includes: determining the second sub target block code word according to the target code distance, so that in a first target local block code set that is formed by the initial code block and $c_3$ sub superposition code blocks and includes $2^K$ first target local block code words, a minimum value of code distances between the first target local block code words is greater than the target code distance; and transmitting the second sub target block code word at the second time.

With reference to the first aspect and the foregoing implementation manners of the first aspect, in an eleventh implementation manner of the first aspect, the code distance information is used to indicate the target code distance, and the target code distance d is determined by the receive end according to the target average value e and a target threshold f, where d>e/f, and 0<f<0.5.

With reference to the first aspect and the foregoing implementation manners of the first aspect, in a twelfth implementation manner of the first aspect, the code distance information is used to indicate the target average value, and the determining the target code distance according to target code distance information includes: determining the target code distance d according to the target average value e and a target threshold f, where d>e/f, and 0<f<0.5.

With reference to the first aspect and the foregoing implementation manners of the first aspect, in a thirteenth implementation manner of the first aspect, the target threshold f is determined according to a status of a channel between the transmit end and the receive end.

With reference to the first aspect and the foregoing implementation manners of the first aspect, in a fourteenth implementation manner of the first aspect, after each block code word in the block code set is generated, the method further includes: interchanging the $a^{th}$ bit with the $b^{th}$ bit of each block code word in the block code set.

According to a second aspect, a data transmission method is provided, where the method includes: determining, by a receive end, a target code length L, where the target code length is a quantity of bits included in each block code word in a block code set to be generated, and L≥3; determining an original code length K, where the original code length is a quantity of bits included in an original code word, and L>K≥2; generating an initial code block according to the original code length K, where the initial code block includes $2^K$ initial code words; generating a superposition code block according to the target code length and an arrangement order of the $2^K$ initial code words in the initial code block, where the superposition code block includes $2^K$ superposition code words, and the $2^K$ initial code words correspond to the $2^K$ superposition code words in a one-to-one manner, and superposing the initial code words and the corresponding superposition code words to generate the block code words in the block code set, so that a difference between feature code distances in the block code set is ±1 or 0, where the feature code distance is a code distance between the block code words; receiving a target block code word transmitted by a transmit end and corresponding to the original code word, where the target block code word is determined from the block code words in the block code set by the transmit end by performing coding processing on the original code word according to the block code set; and performing decoding processing on the target block code word according to the block code set to acquire the original code word.

With reference to the second aspect, in a first implementation manner of the second aspect, when K≤3, the initial code block includes $2^K$ different initial code words, and each initial code word includes K bits; and the generating a superposition code block according to the target code length and an arrangement order of the $2^K$ initial code words in the initial code block includes: determining a maximum code distance w between the superposition code words in the superposition code block according to the target code length L and the original code length K; and generating the superposition code block according to the arrangement order of the $2^K$ initial code words in the initial code block and the maximum code distance between the superposition code words in the superposition code block.

With reference to the second aspect and the foregoing implementation manner of the second aspect, in a second implementation manner of the second aspect, the determining a maximum code distance w between the superposition code words in the superposition code block according to the target code length L and the original code length K includes: when K=2, if L is an integer multiple of 3, w=2L/3; when K=2, if L is not an integer multiple of 3, w=[2L/3]+1, where [2L/3] is a maximum integer that is less than or equal to 2L/3; and when K=3, w=[4L/7], where [4L/7] is a maximum integer that is less than or equal to 4L/7.

With reference to the second aspect and the foregoing implementation manners of the second aspect, in a third implementation manner of the second aspect, when K≥4, the generating an initial code block according to the original code length K, where the initial code block includes $2^K$ initial code words, includes: determining a sub block code set, where the sub block code set includes $2^{K-1}$ sub block code words, a quantity of bits included in each sub block code word is $L_0$, the sub block code set is generated according to a first initial code block and a first superposition code block, the first initial code block includes $2^{K-1}$ different first initial code words, each first initial code word includes K−1 bits, the first superposition code block is determined according to the quantity $L_0$ of bits included in the sub block code word and an arrangement order of the $2^{K-1}$ first initial code words in the first initial code block, the superposition code block includes $2^{K-1}$ superposition code words, each superposition code word includes $L_0$−K+1 bits, and in the sub block code set, code distances between code words are all s, where $L_0$<L; superposing four such sub block code sets to generate an intermediate block code set, where the intermediate block code set includes $2^K$ intermediate block code words, and intermediate block code words arranged in the $z^{th}$ and $(z+2^{K-1})^{th}$ positions in the intermediate block code set are formed by superposition of sub block code words arranged in the $z^{th}$ positions in two such sub block code sets; and interchanging an intermediate block code word arranged in the $v^{th}$ position with an intermediate block code word arranged in the $(2^{K-1}-v+1)^{th}$ position in the intermediate block code set, and interchanging an intermediate block code word arranged in the $(2^{K-1}+v)^{th}$ position with an intermediate block code word arranged in the $(2^K-v+1)^{th}$ position in the intermediate block code set to generate a sub initial code block, where the initial code block includes x such sub initial code blocks, $v \in [1, 2^{K-2}]$, and $x \geq 1$; and the generating a superposition code block according to the target code length and an arrangement order of the $2^K$ initial code words in the initial code block includes: generating a superposition code block including y sub superposition code blocks, so that each sub superposition code block includes $2^K$ superposition code words with a code length $L_1$, where elements on an antidiagonal in a code distance matrix of each sub superposition code block are all q, and remaining non-zero elements are all p, where $q > p > 0$, $y \geq 1$, and the following formulas are satisfied: $x:y=(q-p):s$, and $x*L_0+y*L_1=L$.

With reference to the second aspect and the foregoing implementation manners of the second aspect, in a fourth implementation manner of the second aspect, the $a^{th}$ initial code word in the $2^K$ initial code words corresponds to the $a^{th}$ superposition code word in the $2^K$ superposition code words, where a is a positive integer and $a \leq 2^K$.

With reference to the second aspect and the foregoing implementation manners of the second aspect, in a fifth implementation manner of the second aspect, when K=2 and L is an even number, the initial code block includes $2^K$ different initial code words, and each initial code word includes K bits; and the generating a superposition code block according to the target code length and an arrangement order of the $2^K$ initial code words in the initial code block includes: generating L/2−1 sub superposition code blocks, where each sub superposition code block includes $2^K$ sub superposition code words, and each sub superposition code word includes two bits; and performing first ordering processing on each sub superposition code block according to the arrangement order of the $2^K$ initial code words in the initial code block, so as to determine an arrangement order of the sub superposition code words in each sub superposition code block, and generating the superposition code block according to each sub superposition code block obtained after the first ordering processing, where a first sub superposition code word arranged in the first position in the $m^{th}$ sub superposition code block obtained after the first ordering processing is any code word in the $m^{th}$ sub superposition code block, and a second sub superposition code word in the $m^{th}$ sub superposition code block is arranged in the $i_1^{th}$ position, where the second sub superposition code word is a code word having a maximum code distance from the first sub superposition code word in the $m^{th}$ sub superposition code block, and for a first local block code set that is formed by m−1 sub superposition code blocks before the $m^{th}$ sub superposition code block and the initial code block and includes $2^K$ local block code words, a first local block code word arranged in the $i_1^{th}$ position is a code word having a minimum code distance from a second local block code word arranged in the first position in the $2^K$ local block code words; or performing second ordering processing on each sub superposition code block according to the arrangement order of the $2^K$ initial code words in the initial code block, so as to determine an arrangement order of the sub superposition code words in each sub superposition code block, and generating the superposition code block according to each sub superposition code block obtained after the second ordering processing, where a third sub superposition code word arranged in the first position in the $m^{th}$ sub superposition code block obtained after the second ordering processing is any code word in the $m^{th}$ sub superposition code block, and a fourth sub superposition code word in the $m^{th}$ sub superposition code block is arranged in the $i_2^{th}$ position, where the fourth sub superposition code word is a code word having a minimum code distance from the third sub superposition code word in the $m^{th}$ sub superposition code block, and for a second local block code set that is formed by m−1 sub superposition code blocks before the $m^{th}$ sub superposition code block and the initial code block and includes $2^K$ local block code words, a third local block code word arranged in the $i_2^{th}$ position is a code word having a maximum code distance from a fourth local block code word arranged in the first position in the $2^K$ local block code words.

With reference to the second aspect and the foregoing implementation manners of the second aspect, in a sixth implementation manner of the second aspect, when K=2 and L is an odd number, the initial code block includes $2^K$ different initial code words, and each initial code word includes K bits; and the generating a superposition code block according to the target code length and an arrangement order of the $2^K$ initial code words in the initial code block includes: generating (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks; performing third ordering processing on each first sub superposition code block according to the arrangement order of the $2^K$ initial code words in the initial code block, so as to determine an arrangement order of the sub superposition code words in each first sub superposition code block, where a fifth sub superposition code word arranged in the first position in the $m^{th}$ first sub superposition code block is any code word in the $m^{th}$ first sub superposition code block, and a sixth sub superposition code word in the $m^{th}$ first sub superposition code block is arranged in the $i_3^{th}$ position, where the sixth sub superposition code word is a code word having a maximum code distance from the fifth sub superposition code word in the $m^{th}$ first sub superposition code block, and for a third local block code set that is formed by m−1 first sub superposition code blocks before the $m^{th}$ sub superposition code block and the initial code block and includes $2^K$ local block code words, a fifth local block code word arranged in the $i_3^{th}$ position is a code word having a minimum code distance from a sixth local block code word arranged in the first position in the $2^K$ local block code words; in a fourth local block code set that is formed by the first sub superposition code blocks obtained after the third ordering processing and the initial code block and includes $2^K$ local block code words, performing fourth ordering processing on the second sub superposition code block according to an arrangement of the $2^K$ local block code words, where if code distances between the local block code words in the fourth local block code set are completely the same, a quantity of code words 0 and a quantity of 1 in the second sub superposition code block are equal, and an arrangement order of the sub superposition code words in the second sub superposition code block is determined randomly; or if code distances between the local block code words in the fourth local block code set are not completely the same, when a code distance between a seventh local block code word arranged in the $i_4^{th}$ position and an eighth local block code word arranged in the $j_4^{th}$ position is not a maximum code distance in the code distances between the local block code words, a sub superposition code word arranged in the $i_4^{th}$ position is different from a sub superposition code word arranged in the $j_4^{th}$ position in the second sub superposition code block, or when a code distance between a seventh local block code word arranged in the $i_4^{th}$ position and an eighth local block code word arranged in the $j_4^{th}$ position is a maximum code distance in the code distances between the local block code words, a sub superposition code word arranged in the $i_4^{th}$ position is the same as a sub superposition code word arranged in the $j_4^{th}$ position in the second sub superposition code block; and generating the superposition code block according to the first sub superposition code blocks obtained after the third ordering processing and the second sub superposition code block obtained after the fourth ordering processing.

With reference to the second aspect and the foregoing implementation manners of the second aspect, in a seventh implementation manner of the second aspect, when K=2 and L is an odd number, the generating a superposition code block according to the target code length and an arrangement order of the $2^K$ initial code words in the initial code block includes: generating (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks; performing fifth ordering processing on each first sub superposition code block according to the arrangement order of the $2^K$ initial code words in the initial code block, so as to determine an arrangement order of the sub superposition code words in each first sub superposition code block, where a seventh sub superposition code word arranged in the first position in the $m^{th}$ first sub superposition code block is any code word in the $m^{th}$ first sub superposition code block, and an eighth sub superposition code word in the $m^{th}$ first sub superposition code block is arranged in the $i_5^{th}$ position, where the eighth sub superposition code word is a code word having a minimum code distance from the seventh sub superposition code word in the $m^{th}$ first sub superposition code block, and for a fifth local block code set that is formed by m−1 first sub superposition code blocks before the $m^{th}$ sub superposition code block and the initial code block and includes $2^K$ local block code words, a ninth local block code word arranged in the $i_5^{th}$ position is a code word having a maximum code distance from a tenth local block code word arranged in the first position in the $2^K$ local block code words; in a sixth local block code set that is formed by the first sub superposition code blocks obtained after the fifth ordering processing and the initial code block and includes $2^K$ local block code words, performing sixth ordering processing on the second sub superposition code block according to an arrangement of the $2^K$ local block code words, where if code distances between the local block code words in the sixth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the sixth local block code set are not completely the same, when a code distance between an eleventh local block code word arranged in the $i_6^{th}$ position and a twelfth local block code word arranged in the $j_6^{th}$ position is not a maximum code distance in the code distances between the local block code words, a sub superposition code word arranged in the $i_6^{th}$ position is different from a sub superposition code word arranged in the $j_6^{th}$ position in the second sub superposition code block, or when a code distance between an eleventh local block code word arranged in the $i_6^{th}$ position and a twelfth local block code word arranged in the $j_6^{th}$ position is a maximum code distance in the code distances between the local block code words, a sub superposition code word arranged in the $i_6^{th}$ position is the same as a sub superposition code word arranged in the $j_6^{th}$ position in the second sub superposition code block; and generating the superposition code block according to the first sub superposition code blocks obtained after the fifth ordering processing and the second sub superposition code block obtained after the sixth ordering processing.

With reference to the second aspect and the foregoing implementation manners of the second aspect, in an eighth implementation manner of the second aspect, the generating a superposition code block according to the target code length and an arrangement order of the $2^K$ initial code words in the initial code block includes: generating the superposition code block according to the target code length and the arrangement order of the $2^K$ initial code words in the initial code block, where the superposition code block includes t sub superposition code blocks, and each sub superposition code block includes $2^K$ sub superposition code words, where for a target local block code set that is formed by the initial code block and $t_0$ sub superposition code blocks and includes $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, where the $t_0$ sub superposition code blocks include a sub superposition code block arranged in the first position to a sub superposition code block arranged in the $t_0^{th}$ position in the t sub superposition code blocks, t≥1, and $t_0 \in [1, t]$.

With reference to the second aspect and the foregoing implementation manners of the second aspect, in a ninth implementation manner of the second aspect, when t≥2, the target block code word includes a target initial code word that is in the initial code block and corresponding to the original code word, and a target sub superposition code word that is in each sub superposition code block and corresponding to the original code word; and the receiving a target block code word transmitted by a transmit end and corresponding to the original code word includes: receiving a first sub target block code word at a first time, where the first sub target block code word includes the target initial code word and target sub superposition code words in a sub superposition code block arranged in the first position to a sub superposition code block arranged in the $c_1^{th}$ position in the sub superposition code blocks, where $c_1 \geq 1$; and receiving a second sub target block code word at a second time, where the second sub target block code word includes target sub superposition code words in a sub superposition code block arranged in the $c_2^{th}$ position to a sub superposition code block arranged in the $c_3^{th}$ position in the sub superposition code blocks, where the second time is later than the first time, $c_2 = c_1 + 1$, and $c_3 \leq t$.

With reference to the second aspect and the foregoing implementation manners of the second aspect, in a tenth implementation manner of the second aspect, before the receiving a second sub target block code word at a second time, the method further includes: determining a target average value, where a target code distance is an average value of minimum code distances between at least one receive code word received by the receive end and block code words in a first block code set, the at least one receive code word includes a first receive code word corresponding to the first sub target block code word, and a quantity of bits included in each block code word in the first block code set is the same as a quantity of bits included in each receive code word; determining code distance information according to the target average value; and transmitting the code distance information to the transmit end.

With reference to the second aspect and the foregoing implementation manners of the second aspect, in an eleventh implementation manner of the second aspect, the determining code distance information according to the target average value includes: determining, according to the target average value e and a target threshold f, code distance information that is used to indicate the target code distance d, where d>e/f, and 0<f<0.5.

With reference to the second aspect and the foregoing implementation manners of the second aspect, in a twelfth implementation manner of the second aspect, the target threshold f is determined according to a status of a channel between the transmit end and the receive end.

With reference to the second aspect and the foregoing implementation manners of the second aspect, in a thirteenth implementation manner of the second aspect, the determining code distance information according to the target average value includes: determining the code distance information according to the target average value, where the code distance information is used to indicate the target average value e.

With reference to the second aspect and the foregoing implementation manners of the second aspect, in a fourteenth implementation manner of the second aspect, after each block code word in the block code set is generated, the method further includes: interchanging the $a^{th}$ bit with the $b^{th}$ bit of each block code word in the block code set.

According to a third aspect, a data transmission apparatus is provided, where the apparatus includes: a determining unit, configured to determine a target code length L and an original code length K, where the target code length is a quantity of bits included in each block code word in a block code set to be generated, the original code length is a quantity of bits included in an original code word to be transmitted to a receive end, L≥3, and L>K≥2; a generating unit, configured to generate an initial code block according to the original code length K, where the initial code block includes $2^K$ initial code words, generate a superposition code block according to the target code length and an arrangement order of the $2^K$ initial code words in the initial code block, where the superposition code block includes $2^K$ superposition code words, and the $2^K$ initial code words correspond to the $2^K$ superposition code words in a one-to-one manner, and superpose the initial code words and the corresponding superposition code words to generate the block code words in the block code set, so that a difference between feature code distances in the block code set is ±1 or 0, where the feature code distance is a code distance between the block code words; a coding unit, configured to perform coding processing on the original code word according to the block code set, so as to determine, from the block code words in the block code set, a target block code word corresponding to the original code word; and a transmitting unit, configured to transmit the target block code word to the receive end.

With reference to the third aspect, in a first implementation manner of the third aspect, when K≤3, the initial code block includes $2^K$ different initial code words, and each initial code word includes K bits; and the generating unit is specifically configured to determine a maximum code distance w between the superposition code words in the superposition code block according to the target code length L and the original code length K, and generate the superposition code block according to the arrangement order of the $2^K$ initial code words in the initial code block and the maximum code distance w between the superposition code words in the superposition code block.

With reference to the third aspect and the foregoing implementation manner of the third aspect, in a second implementation manner of the third aspect, the generating unit is specifically configured to: when K=2, if L is an integer multiple of 3, determine that the maximum code distance w between the superposition code words in the superposition code block is equal to 2L/3; when K=2, if L is not an integer multiple of 3, determine that the maximum code distance w between the superposition code words in the superposition code block is equal to [2L/3]+1, where [2L/3] is a maximum integer that is less than or equal to 2L/3; and when K=3, determine that the maximum code distance w between the superposition code words in the superposition code block is equal to [4L/7], where [4L/7] is a maximum integer that is less than or equal to 4L/7.

With reference to the third aspect and the foregoing implementation manners of the third aspect, in a third implementation manner of the third aspect, when K≥4, the generating unit is specifically configured to determine a sub block code set, where the sub block code set includes $2^{K-1}$ sub block code words, a quantity of bits included in each sub block code word is $L_0$, the sub block code set is generated according to a first initial code block and a first superposition code block, the first initial code block includes $2^{K-1}$ different first initial code words, each first initial code word includes K−1 bits, the first superposition code block is determined according to the quantity $L_0$ of bits included in the sub block code word and an arrangement order of the $2^{K-1}$ first initial code words in the first initial code block, the superposition code block includes $2^{K-1}$ superposition code words, each superposition code word includes $L_0-K+1$ bits, and in the sub block code set, code distances between code words are all s, where $L_0<L$; superpose four such sub block code sets to generate an intermediate block code set, where the intermediate block code set includes $2^K$ intermediate block code words, and intermediate block code words arranged in the $z^{th}$ and $(z+2^{K-1})^{th}$ positions in the intermediate block code set are formed by superposition of sub block code words arranged in the $z^{th}$ positions in two such sub block code sets; interchange an intermediate block code word arranged in the $v^{th}$ position with an intermediate block code word arranged in the $(2^{K-1}-v+1)^{th}$ position in the intermediate block code set, and interchange an intermediate block code word arranged in the $(2^{K-1}+v)^{th}$ position with an intermediate block code word arranged in the $(2^K-v+1)^{th}$ position in the intermediate block code set to generate a sub initial code block, where the initial code block includes x such sub initial code blocks, v∈ [1, $2^{K-2}$], and x≥1; and generate a superposition code block including y sub superposition code blocks, so that each sub superposition code block includes $2^K$ superposition code words with a code length $L_1$, where elements on an antidiagonal in a code distance matrix of each sub superposition code block are all q, and remaining non-zero elements are all p, where q>p>0, y≥1, and the following formulas are satisfied: x:y=(q-p):s, and $x*L_0+y*L_1=L$.

With reference to the third aspect and the foregoing implementation manners of the third aspect, in a fourth implementation manner of the third aspect, the $a^{th}$ initial code word in the $2^K$ initial code words corresponds to the $a^{th}$ superposition code word in the $2^K$ superposition code words, where a is a positive integer and $a \leq 2^K$.

With reference to the third aspect and the foregoing implementation manners of the third aspect, in a fifth implementation manner of the third aspect, when K=2 and L is an even number, the initial code block includes $2^K$ different initial code words, and each initial code word includes K bits; and the generating unit is specifically configured to generate L/2-1 sub superposition code blocks, where each sub superposition code block includes $2^K$ sub superposition code words, and each sub superposition code word includes two bits; and perform first ordering processing on each sub superposition code block according to the arrangement order of the $2^K$ initial code words in the initial code block, so as to determine an arrangement order of the sub superposition code words in each sub superposition code block, and generate the superposition code block according to each sub superposition code block obtained after the first ordering processing, where a first sub superposition code word arranged in the first position in the $m^{th}$ sub superposition code block obtained after the first ordering processing is any code word in the $m^{th}$ sub superposition code block, and a second sub superposition code word in the $m^{th}$ sub superposition code block is arranged in the $i_1^{th}$ position, where the second sub superposition code word is a code word having a maximum code distance from the first sub superposition code word in the $m^{th}$ sub superposition code block, and for a first local block code set that is formed by m-1 sub superposition code blocks before the $m^{th}$ sub superposition code block and the initial code block and includes $2^K$ local block code words, a first local block code word arranged in the $i_1^{th}$ position is a code word having a minimum code distance from a second local block code word arranged in the first position in the $2^K$ local block code words; or perform second ordering processing on each sub superposition code block according to the arrangement order of the $2^K$ initial code words in the initial code block, so as to determine an arrangement order of the sub superposition code words in each sub superposition code block, and generate the superposition code block according to each sub superposition code block obtained after the second ordering processing, where a third sub superposition code word arranged in the first position in the $m^{th}$ sub superposition code block obtained after the second ordering processing is any code word in the $m^{th}$ sub superposition code block, and a fourth sub superposition code word in the $m^{th}$ sub superposition code block is arranged in the $i_2^{th}$ position, where the fourth sub superposition code word is a code word having a minimum code distance from the third sub superposition code word in the $m^{th}$ sub superposition code block, and for a second local block code set that is formed by m-1 sub superposition code blocks before the $m^{th}$ sub superposition code block and the initial code block and includes $2^K$ local block code words, a third local block code word arranged in the $i_2^{th}$ position is a code word having a maximum code distance from a fourth local block code word arranged in the first position in the $2^K$ local block code words.

With reference to the third aspect and the foregoing implementation manners of the third aspect, in a sixth implementation manner of the third aspect, when K=2 and L is an odd number, the initial code block includes $2^K$ different initial code words, and each initial code word includes K bits; and the generating unit is specifically configured to generate (L-1)/2 sub superposition code blocks, where a first sub superposition code block includes $2^K$ sub superposition code words, each sub superposition code word includes two bits, and first sub superposition code blocks are the first (L-1)/2-1 sub superposition code blocks in the (L-1)/2 sub superposition code blocks; and a second sub superposition code block includes $2^K$ sub superposition code words, each sub superposition code word includes one bit, and the second sub superposition code block is a last sub superposition code block in the (L-1)/2 sub superposition code blocks; perform third ordering processing on each first sub superposition code block according to the arrangement order of the $2^K$ initial code words in the initial code block, so as to determine an arrangement order of the sub superposition code words in each first sub superposition code block, where a fifth sub superposition code word arranged in the first position in the $m^{th}$ first sub superposition code block is any code word in the $m^{th}$ first sub superposition code block, and a sixth sub superposition code word in the $m^{th}$ first sub superposition code block is arranged in the $i_3^{th}$ position, where the sixth sub superposition code word is a code word having a maximum code distance from the fifth sub superposition code word in the $m^{th}$ first sub superposition code block, and for a third local block code set that is formed by m-1 first sub superposition code blocks before the $m^{th}$ sub superposition code block and the initial code block and includes $2^K$ local block code words, a fifth local block code word arranged in the $i_3^{th}$ position is a code word having a minimum code distance from a sixth local block code word arranged in the first position in the $2^K$ local block code words; in a fourth local block code set that is formed by the first sub superposition code blocks obtained after the third ordering processing and the initial code block and includes $2^K$ local block code words, perform fourth ordering processing on the second sub superposition code block according to an arrangement of the $2^K$ local block code words, where if code distances between the local block code words in the fourth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the fourth local block code set are not completely the same, when a code distance between a seventh local block code word arranged in the $i_4^{th}$ position and an eighth local block code word arranged in the $j_4^{th}$ position is not a maximum code distance in the code distances between the local block code words, a sub superposition code word arranged in the $i_4^{th}$ position is different from a sub superposition code word arranged in the $j_4^{th}$ position in the second sub superposition code block, or when a code distance between a seventh local block code word arranged in the $i_4^{th}$ position and an eighth local block code word arranged in the $j_4^{th}$ position is a maximum code distance in the code distances between the local block code words, a sub superposition code word arranged in the $i_4^{th}$ position is the same as a sub superposition code word arranged in the $j_4^{th}$ position in the second sub superposition code block; and generate the superposition code block according to the first sub superposition code blocks obtained after the third ordering processing and the second sub superposition code block obtained after the fourth ordering processing.

With reference to the third aspect and the foregoing implementation manners of the third aspect, in a seventh implementation manner of the third aspect, when K=2 and L is an odd number, the generating unit is specifically configured to generate (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks; perform fifth ordering processing on each first sub superposition code block according to the arrangement order of the $2^K$ initial code words in the initial code block, so as to determine an arrangement order of the sub superposition code words in each first sub superposition code block, where a seventh sub superposition code word arranged in the first position in the $m^{th}$ first sub superposition code block is any code word in the $m^{th}$ first sub superposition code block, and an eighth sub superposition code word in the $m^{th}$ first sub superposition code block is arranged in the $i_5^{th}$ position, where the eighth sub superposition code word is a code word having a minimum code distance from the seventh sub superposition code word in the $m^{th}$ first sub superposition code block, and for a fifth local block code set that is formed by m−1 first sub superposition code blocks before the $m^{th}$ sub superposition code block and the initial code block and includes $2^K$ local block code words, a ninth local block code word arranged in the $i_5^{th}$ position is a code word having a maximum code distance from a tenth local block code word arranged in the first position in the $2^K$ local block code words; in a sixth local block code set that is formed by the first sub superposition code blocks obtained after the fifth ordering processing and the initial code block and includes $2^K$ local block code words, perform sixth ordering processing on the second sub superposition code block according to an arrangement of the $2^K$ local block code words, where if code distances between the local block code words in the sixth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the sixth local block code set are not completely the same, when a code distance between an eleventh local block code word arranged in the $i_6^{th}$ position and a twelfth local block code word arranged in the $j_6^{th}$ position is not a maximum code distance in the code distances between the local block code words, a sub superposition code word arranged in the $i_6^{th}$ position is different from a sub superposition code word arranged in the $j_6^{th}$ position in the second sub superposition code block, or when a code distance between an eleventh local block code word arranged in the $i_6^{th}$ position and a twelfth local block code word arranged in the $j_6^{th}$ position is a maximum code distance in the code distances between the local block code words, a sub superposition code word arranged in the $i_6^{th}$ position is the same as a sub superposition code word arranged in the $j_6^{th}$ position in the second sub superposition code block; and generate the superposition code block according to the first sub superposition code blocks obtained after the fifth ordering processing and the second sub superposition code block obtained after the sixth ordering processing.

With reference to the third aspect and the foregoing implementation manners of the third aspect, in an eighth implementation manner of the third aspect, the generating unit is specifically configured to generate the superposition code block according to the target code length and the arrangement order of the $2^K$ initial code words in the initial code block, where the superposition code block includes t sub superposition code blocks, and each sub superposition code block includes $2^K$ sub superposition code words, where for a target local block code set that is formed by the initial code block and $t_0$ sub superposition code blocks and includes $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, where the $t_0$ sub superposition code blocks include a sub superposition code block arranged in the first position to a sub superposition code block arranged in the $t_0^{th}$ position in the t sub superposition code blocks, t≥1, and $t_0 \in [1, t]$.

With reference to the third aspect and the foregoing implementation manners of the third aspect, in a ninth implementation manner of the third aspect, when t≥2, the target block code word includes a target initial code word that is in the initial code block and corresponding to the original code word, and a target sub superposition code word that is in each sub superposition code block and corresponding to the original code word; and the transmitting unit is specifically configured to transmit a first sub target block code word at a first time, where the first sub target block code word includes the target initial code word and target sub superposition code words in a sub superposition code block arranged in the first position to a sub superposition code block arranged in the $c_1^{th}$ position in the sub superposition code blocks, where $c_1 \geq 1$; and transmit a second sub target block code word at a second time, where the second sub target block code word includes target sub superposition code words in a sub superposition code block arranged in the $c_2^{th}$ position to a sub superposition code block arranged in the $c_3^{th}$ position in the sub superposition code blocks, where the second time is later than the first time, $c_2 = c_1 + 1$, and $c_3 \leq t$.

With reference to the third aspect and the foregoing implementation manners of the third aspect, in a tenth implementation manner of the third aspect, the apparatus further includes: a receiving unit, configured to receive code distance information transmitted by the receive end, where the code distance information is determined by the receive end according to a target average value, a target code distance is an average value of minimum code distances between at least one receive code word received by the receive end and block code words in a first block code set, the at least one receive code word includes a first receive code word corresponding to the first sub target block code word, and a quantity of bits included in each block code word in the first block code set is the same as a quantity of bits included in each receive code word; where the determining unit is further configured to determine the target code distance according to the target code distance information, and determine the second sub target block code word according to the target code distance, so that in a first target local block code set that is formed by the initial code block and $c_3$ sub superposition code blocks and includes $2^K$ first target local block code words, a minimum value of code distances between the first target local block code words is greater than the target code distance.

With reference to the third aspect and the foregoing implementation manners of the third aspect, in an eleventh implementation manner of the third aspect, the code distance information is used to indicate the target code distance, and the target code distance d is determined by the receive end according to the target average value e and a target threshold f, where d>e/f, and 0<f<0.5.

With reference to the third aspect and the foregoing implementation manners of the third aspect, in a twelfth implementation manner of the third aspect, the code distance information is used to indicate the target average value, and the determining unit is specifically configured to determine the target code distance d according to the target average value e and a target threshold f, where d>e/f, and 0<f<0.5.

With reference to the third aspect and the foregoing implementation manners of the third aspect, in a thirteenth implementation manner of the third aspect, the target threshold f is determined according to a status of a channel between the apparatus and the receive end.

With reference to the third aspect and the foregoing implementation manners of the third aspect, in a fourteenth implementation manner of the third aspect, after each block code word in the block code set is generated, the generating unit is further configured to interchange the $a^{th}$ bit with the $b^{th}$ bit of each block code word in the block code set.

According to a fourth aspect, a data transmission apparatus is provided, where the apparatus includes: a determining unit, configured to determine a target code length L and an original code length K, where the target code length is a quantity of bits included in each block code word in a block code set to be generated, the original code length is a quantity of bits included in an original code word, L≥3, and L>K≥2; a generating unit, configured to generate an initial code block according to the original code length K, where the initial code block includes $2^K$ initial code words, generate a superposition code block according to the target code length and an arrangement order of the $2^K$ initial code words in the initial code block, where the superposition code block includes $2^K$ superposition code words, and the $2^K$ initial code words correspond to the $2^K$ superposition code words in a one-to-one manner, and superpose the initial code words and the corresponding superposition code words to generate the block code words in the block code set, so that a difference between feature code distances in the block code set is ±1 or 0, where the feature code distance is a code distance between the block code words; a receiving unit, configured to receive a target block code word transmitted by a transmit end and corresponding to the original code word, where the target block code word is determined from the block code words in the block code set by the transmit end by performing coding processing on the original code word according to the block code set; and a decoding unit, configured to perform decoding processing on the target block code word according to the block code set to acquire the original code word.

With reference to the fourth aspect, in a first implementation manner of the fourth aspect, when K≤3, the initial code block includes $2^K$ different initial code words, and each initial code word includes K bits; and the generating unit is specifically configured to determine a maximum code distance w between the superposition code words in the superposition code block according to the target code length L and the original code length K; and generate the superposition code block according to the arrangement order of the $2^K$ initial code words in the initial code block and the maximum code distance between the superposition code words in the superposition code block.

With reference to the fourth aspect and the foregoing implementation manner of the fourth aspect, in a second implementation manner of the fourth aspect, the generating unit is specifically configured to: when K=2, if L is an integer multiple of 3, determine that the maximum code distance w between the superposition code words in the superposition code block is equal to 2L/3; when K=2, if L is not an integer multiple of 3, determine that the maximum code distance w between the superposition code words in the superposition code block is equal to [2L/3]+1, where [2L/3] is a maximum integer that is less than or equal to 2L/3; and when K=3, determine that the maximum code distance w between the superposition code words in the superposition code block is equal to [4L/7], where [4L/7] is a maximum integer that is less than or equal to 4L/7.

With reference to the fourth aspect and the foregoing implementation manners of the fourth aspect, in a third implementation manner of the fourth aspect, when K≥4, the generating unit is specifically configured to determine a sub block code set, where the sub block code set includes $2^{K-1}$ sub block code words, a quantity of bits included in each sub block code word is $L_0$, the sub block code set is generated according to a first initial code block and a first superposition code block, the first initial code block includes $2^{K-1}$ different first initial code words, each first initial code word includes K-1 bits, the first superposition code block is determined according to the quantity $L_0$ of bits included in the sub block code word and an arrangement order of the $2^{K-1}$ first initial code words in the first initial code block, the superposition code block includes $2^{K-1}$ superposition code words, each superposition code word includes $L_0-K+1$ bits, and in the sub block code set, code distances between code words are all s, where $L_0<L$; superpose four such sub block code sets to generate an intermediate block code set, where the intermediate block code set includes $2^K$ intermediate block code words, and intermediate block code words arranged in the $z^{th}$ and $(z+2^{K-1})^{th}$ positions in the intermediate block code set are formed by superposition of sub block code words arranged in the $z^{th}$ positions in two such sub block code sets; interchange an intermediate block code word arranged in the $v^{th}$ position with an intermediate block code word arranged in the $(2^{K-1}-v+1)^{th}$ position in the intermediate block code set, and interchange an intermediate block code word arranged in the $(2^{K-1}+v)^{th}$ position with an intermediate block code word arranged in the $(2^K-v+)^{th}$ position in the intermediate block code set to generate a sub initial code block, where the initial code block includes x such sub initial code blocks, v ∈ [1, $2^{K-2}$], and x≥1; and generate a superposition code block including y sub superposition code blocks, so that each sub superposition code block includes $2^K$ superposition code words with a code length $L_1$, where elements on an antidiagonal in a code distance matrix of each sub superposition code block are all q, and remaining non-zero elements are all p, where q>p>0, y≥1, and the following formulas are satisfied: x:y=(q-p):s, and $x*L_0+y*L_1=L$.

With reference to the fourth aspect and the foregoing implementation manners of the fourth aspect, in a fourth implementation manner of the fourth aspect, the $a^{th}$ initial code word in the $2^K$ initial code words corresponds to the $a^{th}$ superposition code word in the $2^K$ superposition code words, where a is a positive integer and $a \leq 2^K$.

With reference to the fourth aspect and the foregoing implementation manners of the fourth aspect, in a fifth implementation manner of the fourth aspect, when K=2 and L is an even number, the initial code block includes $2^K$ different initial code words, and each initial code word includes K bits; and the generating unit is specifically configured to generate L/2−1 sub superposition code blocks, where each sub superposition code block includes $2^K$ sub superposition code words, and each sub superposition code word includes two bits; and perform first ordering processing on each sub superposition code block according to the arrangement order of the $2^K$ initial code words in the initial code block, so as to determine an arrangement order of the sub superposition code words in each sub superposition code block, and generate the superposition code block according to each sub superposition code block obtained after the first ordering processing, where a first sub superposition code word arranged in the first position in the $m^{th}$ sub superposition code block obtained after the first ordering processing is any code word in the $m^{th}$ sub superposition code block, and a second sub superposition code word in the $m^{th}$ sub superposition code block is arranged in the $i_1^{th}$ position, where the second sub superposition code word is a code word having a maximum code distance from the first sub superposition code word in the $m^{th}$ sub superposition code block, and for a first local block code set that is formed by m−1 sub superposition code blocks before the $m^{th}$ sub superposition code block and the initial code block and includes $2^K$ local block code words, a first local block code word arranged in the $i_1^{th}$ position is a code word having a minimum code distance from a second local block code word arranged in the first position in the $2^K$ local block code words; or perform second ordering processing on each sub superposition code block according to the arrangement order of the $2^K$ initial code words in the initial code block, so as to determine an arrangement order of the sub superposition code words in each sub superposition code block, and generate the superposition code block according to each sub superposition code block obtained after the second ordering processing, where a third sub superposition code word arranged in the first position in the $m^{th}$ sub superposition code block obtained after the second ordering processing is any code word in the $m^{th}$ sub superposition code block, and a fourth sub superposition code word in the $m^{th}$ sub superposition code block is arranged in the $i_2^{th}$ position, where the fourth sub superposition code word is a code word having a minimum code distance from the third sub superposition code word in the $m^{th}$ sub superposition code block, and for a second local block code set that is formed by m−1 sub superposition code blocks before the $m^{th}$ sub superposition code block and the initial code block and includes $2^K$ local block code words, a third local block code word arranged in the $i_2^{th}$ position is a code word having a maximum code distance from a fourth local block code word arranged in the first position in the $2^K$ local block code words.

With reference to the fourth aspect and the foregoing implementation manners of the fourth aspect, in a sixth implementation manner of the fourth aspect, when K=2 and L is an odd number, the initial code block includes $2^K$ different initial code words, and each initial code word includes K bits; and the generating unit is specifically configured to generate (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks; perform third ordering processing on each first sub superposition code block according to the arrangement order of the $2^K$ initial code words in the initial code block, so as to determine an arrangement order of the sub superposition code words in each first sub superposition code block, where a fifth sub superposition code word arranged in the first position in the $m^{th}$ first sub superposition code block is any code word in the $m^{th}$ first sub superposition code block, and a sixth sub superposition code word in the $m^{th}$ first sub superposition code block is arranged in the $i_3^{th}$ position, where the sixth sub superposition code word is a code word having a maximum code distance from the fifth sub superposition code word in the $m^{th}$ first sub superposition code block, and for a third local block code set that is formed by m−1 first sub superposition code blocks before the $m^{th}$ sub superposition code block and the initial code block and includes $2^K$ local block code words, a fifth local block code word arranged in the $i_3^{th}$ position is a code word having a minimum code distance from a sixth local block code word arranged in the first position in the $2^K$ local block code words; in a fourth local block code set that is formed by the first sub superposition code blocks obtained after the third ordering processing and the initial code block and includes $2^K$ local block code words, perform fourth ordering processing on the second sub superposition code block according to an arrangement of the $2^K$ local block code words, where if code distances between the local block code words in the fourth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the fourth local block code set are not completely the same, when a code distance between a seventh local block code word arranged in the $i_4^{th}$ position and an eighth local block code word arranged in the $j_4^{th}$ position is not a maximum code distance in the code distances between the local block code words, a sub superposition code word arranged in the $i_4^{th}$ position is different from a sub superposition code word arranged in the $j_4^{th}$ position in the second sub superposition code block, or when a code distance between a seventh local block code word arranged in the $i_4^{th}$ position and an eighth local block code word arranged in the $j_4^{th}$ position is a maximum code distance in the code distances between the local block code words, a sub superposition code word arranged in the $i_4^{th}$ position is the same as a sub superposition code word arranged in the $j_4^{th}$ position in the second sub superposition code block; and generate the superposition code block according to the first sub superposition code blocks obtained after the third ordering processing and the second sub superposition code block obtained after the fourth ordering processing.

With reference to the fourth aspect and the foregoing implementation manners of the fourth aspect, in a seventh implementation manner of the fourth aspect, when K=2 and L is an odd number, the generating unit is specifically configured to generate (L−1)/2 sub superposition code blocks, where a first sub superposition code block includes $2^K$ sub superposition code words, each sub superposition code word includes two bits, and first sub superposition code blocks are the first $(L-1)/2-1$ sub superposition code blocks in the $(L-1)/2$ sub superposition code blocks; and a second sub superposition code block includes $2^K$ sub superposition code words, each sub superposition code word includes one bit, and the second sub superposition code block is a last sub superposition code block in the $(L-1)/2$ sub superposition code blocks; perform fifth ordering processing on each first sub superposition code block according to the arrangement order of the $2^K$ initial code words in the initial code block, so as to determine an arrangement order of the sub superposition code words in each first sub superposition code block, where a seventh sub superposition code word arranged in the first position in the $m^{th}$ first sub superposition code block is any code word in the $m^{th}$ first sub superposition code block, and an eighth sub superposition code word in the $m^{th}$ first sub superposition code block is arranged in the $i_5^{th}$ position, where the eighth sub superposition code word is a code word having a minimum code distance from the seventh sub superposition code word in the $m^{th}$ first sub superposition code block, and for a fifth local block code set that is formed by $m-1$ first sub superposition code blocks before the $m^{th}$ sub superposition code block and the initial code block and includes $2^K$ local block code words, a ninth local block code word arranged in the $i_5^{th}$ position is a code word having a maximum code distance from a tenth local block code word arranged in the first position in the $2^K$ local block code words; in a sixth local block code set that is formed by the first sub superposition code blocks obtained after the fifth ordering processing and the initial code block and includes $2^K$ local block code words, perform sixth ordering processing on the second sub superposition code block according to an arrangement of the $2^K$ local block code words, where if code distances between the local block code words in the sixth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the sixth local block code set are not completely the same, when a code distance between an eleventh local block code word arranged in the $i_6^{th}$ position and a twelfth local block code word arranged in the $j_6^{th}$ position is not a maximum code distance in the code distances between the local block code words, a sub superposition code word arranged in the $i_6^{th}$ position is different from a sub superposition code word arranged in the $j_6^{th}$ position in the second sub superposition code block, or when a code distance between an eleventh local block code word arranged in the $i_6^{th}$ position and a twelfth local block code word arranged in the $j_6^{th}$ position is a maximum code distance in the code distances between the local block code words, a sub superposition code word arranged in the $i_6^{th}$ position is the same as a sub superposition code word arranged in the $j_6^{th}$ position in the second sub superposition code block; and generate the superposition code block according to the first sub superposition code blocks obtained after the fifth ordering processing and the second sub superposition code block obtained after the sixth ordering processing.

With reference to the fourth aspect and the foregoing implementation manners of the fourth aspect, in an eighth implementation manner of the fourth aspect, the generating unit is specifically configured to generate the superposition code block according to the target code length and the arrangement order of the $2^K$ initial code words in the initial code block, where the superposition code block includes t sub superposition code blocks, and each sub superposition code block includes $2^K$ sub superposition code words, where for a target local block code set that is formed by the initial code block and $t_0$ sub superposition code blocks and includes $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, where the $t_0$ sub superposition code blocks include a sub superposition code block arranged in the first position to a sub superposition code block arranged in the $t_0^{th}$ position in the t sub superposition code blocks, $t \geq 1$, and $t_0 \in [1, t]$.

With reference to the fourth aspect and the foregoing implementation manners of the fourth aspect, in a ninth implementation manner of the fourth aspect, when $t \geq 2$, the target block code word includes a target initial code word that is in the initial code block and corresponding to the original code word, and a target sub superposition code word that is in each sub superposition code block and corresponding to the original code word; and the receiving unit is specifically configured to receive a first sub target block code word at a first time, where the first sub target block code word includes the target initial code word and target sub superposition code words in a sub superposition code block arranged in the first position to a sub superposition code block arranged in the $c_1^{th}$ position in the sub superposition code blocks, where $c_1 \geq 1$; and receive a second sub target block code word at a second time, where the second sub target block code word includes target sub superposition code words in a sub superposition code block arranged in the $c_2^{th}$ position to a sub superposition code block arranged in the $c_3^{th}$ position in the sub superposition code blocks, where the second time is later than the first time, $c_2 = c_1 + 1$, and $c_3 \leq t$.

With reference to the fourth aspect and the foregoing implementation manners of the fourth aspect, in a tenth implementation manner of the fourth aspect, the determining unit is further configured to determine a target average value at the second time, where a target code distance is an average value of minimum code distances between at least one receive code word received by the receive end and block code words in a first block code set, the at least one receive code word includes a first receive code word corresponding to the first sub target block code word, and a quantity of bits included in each block code word in the first block code set is the same as a quantity of bits included in each receive code word; and determine code distance information according to the target average value; and the apparatus further includes: a transmitting unit, configured to transmit the code distance information to the transmit end.

With reference to the fourth aspect and the foregoing implementation manners of the fourth aspect, in an eleventh implementation manner of the fourth aspect, the determining unit is specifically configured to determine, according to the target average value e and a target threshold f, code distance information that is used to indicate the target code distance d, where $d > e/f$, and $0 < f < 0.5$.

With reference to the fourth aspect and the foregoing implementation manners of the fourth aspect, in a twelfth implementation manner of the fourth aspect, the target threshold f is determined according to a status of a channel between the transmit end and the apparatus.

With reference to the fourth aspect and the foregoing implementation manners of the fourth aspect, in a thirteenth implementation manner of the fourth aspect, the determining unit is specifically configured to determine the code distance information according to the target average value, where the code distance information is used to indicate the target average value e.

With reference to the fourth aspect and the foregoing implementation manners of the fourth aspect, in a fourteenth implementation manner of the fourth aspect, the generating unit is further configured to interchange the $a^{th}$ bit with the $b^{th}$ bit of each block code word in the block code set.

In the data transmission method and apparatus according to embodiments of the present invention, code distances between block code words in a block code set are the same (that is, a difference between feature code distances is 0) or there is a difference of ±1 (that is, a difference between feature code distances is ±1), a transmit end performs coding according to the block code set, and a receive end performs decoding according to the block code set, which can improve an error correction capability during decoding.

BRIEF DESCRIPTION OF THE DRAWINGS

To describe the technical solutions in the embodiments of the present invention more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION

Figure 1:
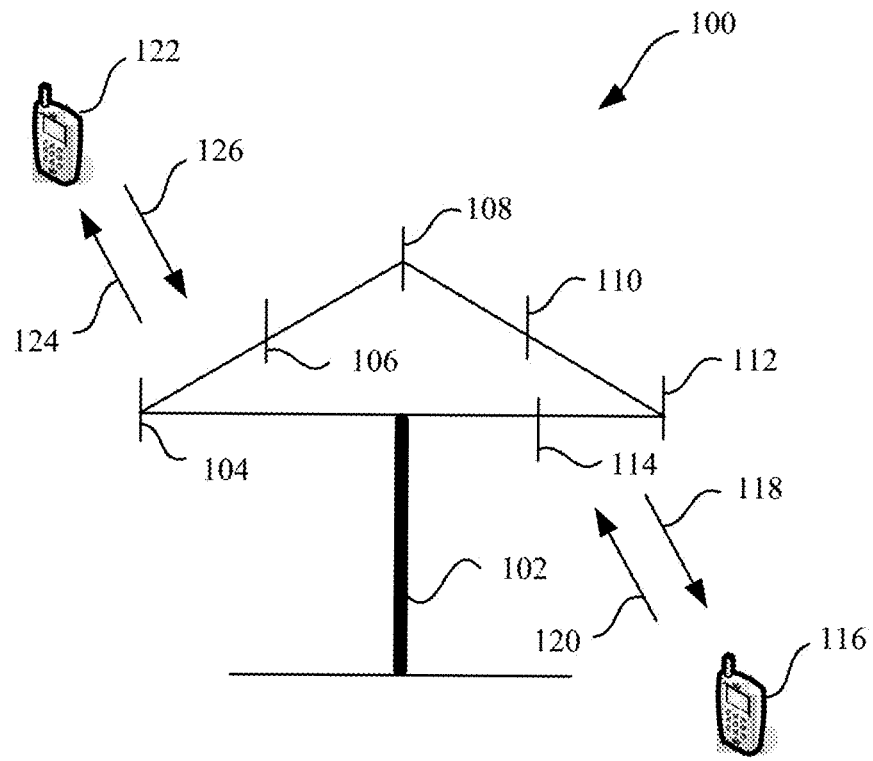
FIG. 1 is a schematic diagram of a wireless communications system according to each embodiment described in this specification.

Multiple embodiments are described with reference to the accompanying drawings, and same components in this specification are indicated by a same reference numeral. In the following description, for ease of explanation, many specific details are provided to facilitate comprehensive understanding of one or more embodiments. However, apparently, the embodiments may also not be implemented by using these specific details. In other examples, a well-known structure and device are shown in a form of block diagrams, to conveniently describe one or more embodiments.

Terminologies such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both a computing device and an application that runs on a computing device may be components. One or more components may reside within a process and/or a thread of execution, and a component may be located on one computer and/or distributed between two or more computers. In addition, these components may be executed from various computer-readable media that store various data structures. For example, the components may communicate by using a local and/or remote process and according to, for example, a signal having one or more data packets (for example, data from a component interacting with another component in a local system, a distributed system, and/or across a network such as the Internet interacting with other systems by using the signal).

In addition, each embodiment is described with reference to an access terminal. An access terminal may also be referred to as a system, a subscriber unit, a subscriber station, a mobile station, a mobile station, a remote station, a remote terminal, a mobile device, a user terminal, a terminal, a wireless communications device, user agent, a user apparatus, or UE (User Equipment, user equipment). The access terminal may be a cellular phone, a cordless phone, a SIP (Session Initiation Protocol, Session Initiation Protocol) phone, a WLL (Wireless Local Loop, wireless local loop) station, a PDA (Personal Digital Assistant, personal digital assistant), a handheld device having a wireless communication function, a computing device, or another processing device connected to a wireless modem. In addition, each embodiment is described with reference to a base station. A base station can be used to communicate with a mobile device; and the base station may be a BTS (Base Transceiver Station, base transceiver station) in GSM (Global System of Mobile communication, Global System of Mobile Communication) or CDMA (Code Division Multiple Access, Code Division Multiple Access); or may be an NB (NodeB, NodeB) in WCDMA (Wideband Code Division Multiple Access, Wideband Code Division Multiple Access); or may further be an eNB or eNodeB (Evolved Node B, evolved NodeB) in LTE (Long Term Evolution, Long Term Evolution), a relay station or an access point, a base station device in a future 5G network, or the like.

In addition, aspects or features of the present invention may be implemented as a method, an apparatus or a product that uses standard programming and/or engineering technologies. The term "product" used in this application covers a computer program that can be accessed from any computer-readable component, carrier or medium. For example, the computer-readable medium may include but is not limited to: a magnetic storage component (for example, a hard disk, a floppy disk or a magnetic tape), an optical disc (for example, a CD (Compact Disk, compact disk), a DVD (Digital Versatile Disk, digital versatile disk), a smart card and a flash memory component (for example, EPROM (Erasable Programmable Read-Only Memory, erasable programmable read-only memory), a card, a stick, or a key drive). In addition, various storage media described in this specification may indicate one or more devices and/or other machine-readable media that is used to store information. The term "machine-readable media" may include but is not limited to a radio channel, and various other media that can store, contain and/or carry an instruction and/or data.

Now, referring to FIG. 1, FIG. 1 shows a wireless communications system 100 according to each embodiment described in this specification. The wireless communications system 100 includes a base station 102, and the base station 102 may include a plurality of antenna groups. Each antenna group may include one or more antennas. For example, an antenna group may include antennas 104 and 106, another antenna group may include antennas 108 and 110, and an additional group may include antennas 112 and 114. FIG. 1 shows two antennas for each antenna group, but more or fewer antennas may be used for each group. The base station 102 may additionally include a transmitter chain and a receiver chain. A person of ordinary skill in the art may understand that both the transmitter chain and the receiver chain may include a plurality of components (for example, processors, modulators, multiplexers, demodulators, demultiplexers, or antennas) related to signal transmission and reception.

The base station 102 may communicate with one or more access terminals (for example, an access terminal 116 and an access terminal 122). However, it may be understood that the base station 102 may communicate with any quantity of access terminals similar to the access terminal 116 or 122. The access terminals 116 and 122 may be, for example, cellular phones, smartphones, portable computers, handheld communications devices, handheld computing devices, satellite radio apparatuses, global positioning systems, personal digital assistants (PDA), and/or any other appropriate devices used for communication in the wireless communications system 100. As shown in the figure, the access terminal 116 communicates with the antennas 112 and 114, where the antennas 112 and 114 transmit information to the access terminal 116 through a forward link 118, and receive information from the access terminal 116 through a reverse link 120. In addition, the access terminal 122 communicates with the antennas 104 and 106, where the antennas 104 and 106 transmit information to the access terminal 122 through a forward link 124, and receive information from the access terminal 122 through a reverse link 126. In an FDD (Frequency Division Duplex, Frequency Division Duplex) system, for example, the forward link 118 may use a frequency band different from that used by the reverse link 120, and the forward link 124 may use a frequency band different from that used by the reverse link 126. In addition, in a TDD (Time Division Duplex, Time Division Duplex) system, the forward link 118 and the reverse link 120 may use a same frequency band, and the forward link 124 and the reverse link 126 may use a same frequency band.

Each antenna group and/or area designed for communication is called a sector of the base station 102. For example, the antenna group may be designed to communicate with an access terminal in a sector of an area covered by the base station 102. In a process in which the base station 102 communicates with the access terminals 116 and 122 through the forward links 118 and 124 respectively, transmit antennas of the base station 102 may use beamforming to improve signal-to-noise ratios of the forward links 118 and 124. In addition, compared with a manner in which a base station uses a single antenna to transmit signals to all access terminals served by the base station, when the base station 102 uses beamforming to transmit signals to the access terminals 116 and 122 that are distributed randomly in a related coverage area, less interference is received by mobile devices in a neighboring cell.

At a given time, the base station 102, the access terminal 116, or the access terminal 122 may be a wireless communications transmitting apparatus and/or a wireless communications receiving apparatus. During data transmission, a wireless communications transmitting apparatus may perform coding on data for transmission. Specifically, the wireless communications transmitting apparatus may acquire (for example, receive from another communications apparatus or store in a memory) a quantity of data bits that need to be transmitted to a wireless communications receiving apparatus through a channel. Such data bits may be included in a transport block (or a plurality of transport blocks) of data, where the transport block may be segmented to generate a plurality of code blocks.

Figure 2:
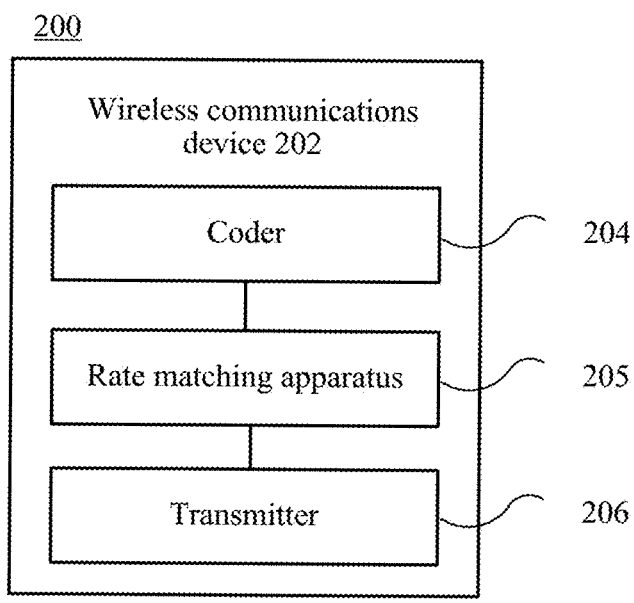
FIG. 2 is a schematic diagram of a device (namely, a transmit end device) that executes a data transmission method in an implementation manner of the present invention in a wireless communications environment.

FIG. 2 shows a schematic block diagram of a system 200 to which a data transmission method in the present invention is applicable in a wireless communications environment. The system 200 includes a wireless communications device 202, where the wireless communications device 202 is displayed as transmitting data through a channel. Although data transmission is shown, the wireless communications device 202 may further receive data through a channel (for example, the wireless communications device 202 may transmit and receive data simultaneously, the wireless communications device 202 may transmit and receive data at different times, or a combination thereof is applicable). The wireless communications device 202 may be, for example, a base station (for example, the base station 102 in FIG. 1), or an access terminal (for example, the access terminal 116 in FIG. 1, or the access terminal 122 in FIG. 1).

The wireless communications device 202 may include a coder 204, a rate matching apparatus 205, and a transmitter 206. Optionally, when the wireless communications device 202 receives data through a channel, the wireless communications device 202 may further include a receiver, where the receiver may exist independently, or may be integrated with the transmitter 206 to form a transceiver.

The coder 204 is configured to perform coding (specifically, block coding, where the process is described in detail later) on data to be transmitted by the wireless communications device 202 to obtain a target block code word.

The rate matching apparatus 205 is configured to perform interleaving, rate matching, and the like on the target block code word to generate interleaved output bits.

In addition, the transmitter 206 may subsequently transmit, on a channel, rate-matched output bits that are processed by the rate matching apparatus 205. For example, the transmitter 206 may transmit related data to another different wireless communications apparatus (not shown).

Figure 3:
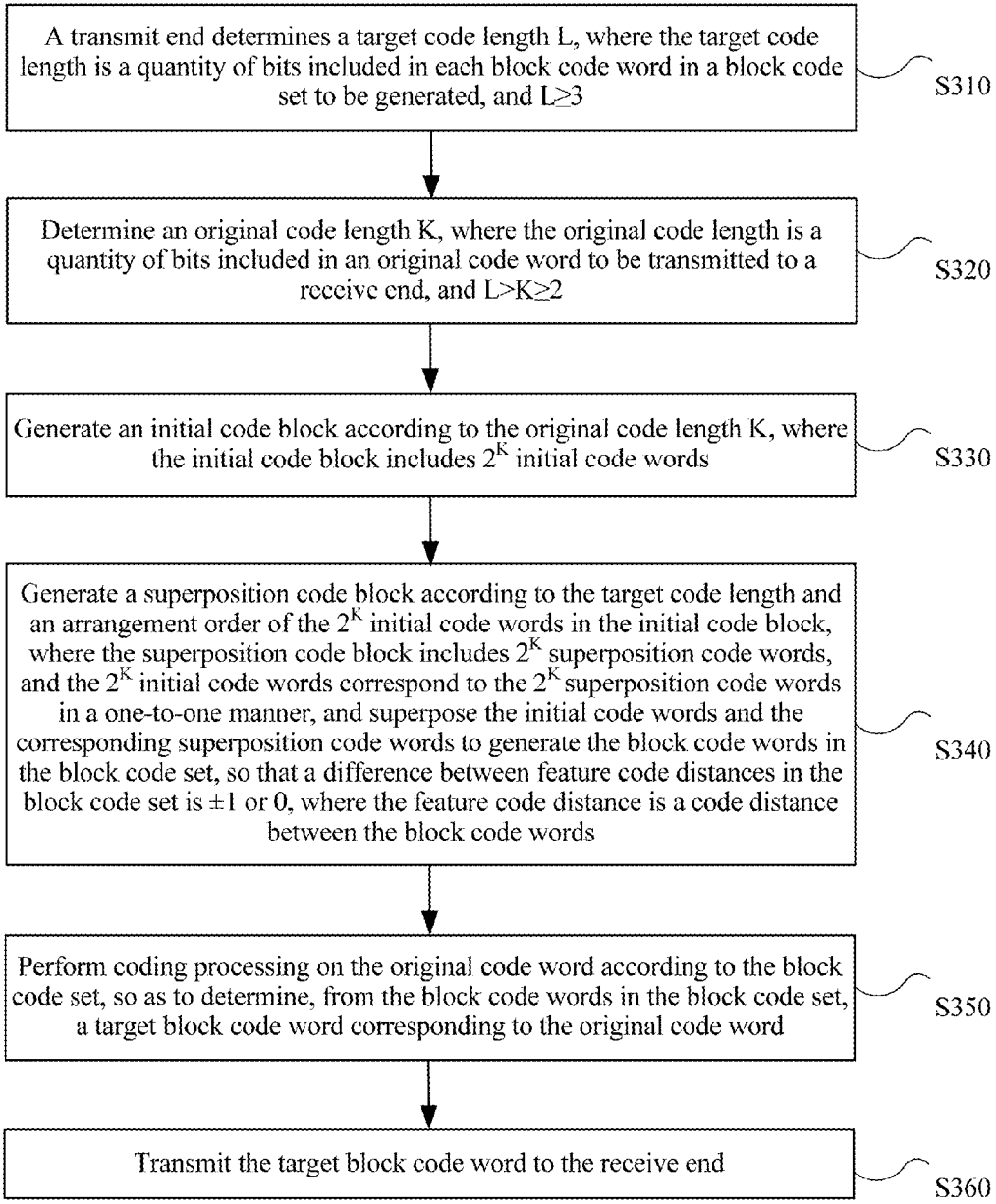
FIG. 3 is a flowchart of a data transmission method according to an embodiment of the present invention.

FIG. 3 is a schematic flowchart of a data transmission method 300 according to an embodiment of the present invention. The method 300 shown in FIG. 3 may be executed by a wireless communications device (namely, a transmit end), where the transmit end may be a base station or user equipment, and likewise, a receive end may also be a base station or user equipment, which is not particularly limited in the present invention.

The method 300 includes:

S310. A transmit end determines a target code length L, where the target code length is a quantity of bits included in each block code word in a block code set to be generated, and L≥3.

S320. Determine an original code length K, where the original code length is a quantity of bits included in an original code word to be transmitted to a receive end, and L>K≥2.

S330. Generate an initial code block according to the original code length K, where the initial code block includes $2^K$ initial code words.

S340. Generate a superposition code block according to the target code length and an arrangement order of the $2^K$ initial code words in the initial code block, where the superposition code block includes $2^K$ superposition code words, and the $2^K$ initial code words correspond to the $2^K$ superposition code words in a one-to-one manner, and superpose the initial code words and the corresponding superposition code words to generate the block code words in the block code set, so that a difference between feature code distances in the block code set is ±1 or 0, where the feature code distance is a code distance between the block code words.

S350. Perform coding processing on the original code word according to the block code set, so as to determine, from the block code words in the block code set, a target block code word corresponding to the original code word.

S360. Transmit the target block code word to the receive end.

S310 to S350 may be executed by the coder 204 in the foregoing wireless communications device 202, and S360 may be executed by the rate matching apparatus 205 and the transmitter 206 in the wireless communications device 202.

The following first describes in detail actions executed by the coder 204.

Specifically, in S310, the transmit end may determine the code length L of a coded block code word according to a user requirement, a network requirement, or the like, where the code length L is greater than the code length of the original code word (namely, original data to be coded).

In S320, the transmit end may acquire the code length K of the original code word (namely, the quantity of bits included in the code word). In this embodiment of the present invention, the code length K of the original code word is greater than or equal to 2.

In S330, the transmit end may generate the initial code block according to the original code length K, where the initial code block includes $2^K$ initial code words. For example, if the original code length K is equal to 2, the initial code block may include $2^2=4$ code words, which are respectively 00, 01, 10, and 11 (regardless of an arrangement order);

if the original code length K is equal to 3, the initial code block may include $2^3=8$ code words, which are respectively 000, 001, 010, 011, 100, 101, 110, and 111 (regardless of an arrangement order).

It should be noted that, when K≥4, the initial code block needs to be generated according to a block code set generated in a case of K−1. For example, when K=4, an initial code block is generated according to a block code set generated when K=3; when K=5, an initial code block is generated according to a block code set generated when K=4, and so on. The process is described in detail later.

In addition, an arrangement order of each code word in the foregoing illustrated initial code blocks generated when K=2 and K=3 is only for exemplary description, and is not limited in the present invention, and an order of each code word may be determined randomly.

After an order of each initial code word is determined, in S340, an arrangement order of the initial code words in the initial code block may be recorded, and an arrangement order of the superposition code words in the superposition code block is determined according to the arrangement order of the initial code words in the initial code block.

The following first describes in detail a process of determining an order of the superposition code words in the superposition code block when K=2. In this embodiment of the present invention, when K=2, two manners of generating a superposition code block are provided.

Manner 1

Optionally, when K≤3, the initial code block includes $2^K$ different initial code words, and each initial code word includes K bits; and the generating a superposition code block according to the target code length and an arrangement order of the $2^K$ initial code words in the initial code block includes:

determining a maximum code distance w between the superposition code words in the superposition code block according to the target code length L and the original code length K; and generating the superposition code block according to the arrangement order of the $2^K$ initial code words in the initial code block and the maximum code distance between the superposition code words in the superposition code block.

Specifically, in this embodiment of the present invention, an initial code word arranged in the $i^{th}$ position may correspond to a superposition code word arranged in the $i^{th}$ position, or an initial code word arranged in the $i^{th}$ position in the initial code block and a superposition code word arranged in the $i^{th}$ position in the superposition code block may form a block code word arranged in the $i^{th}$ position in the block code set. As described above, because the arrangement order of the initial code words in the initial code block is determined, an arrangement order of the superposition code words needs to be determined according to the arrangement order of the initial code words.

First, a superposition code word arranged in any position in the superposition code block may be determined, that is, after a position of the $i^{th}$ superposition code word is determined, if a position of an initial code word having a maximum code distance from the $i^{th}$ initial code word is j, and the $j^{th}$ superposition code word is not determined, a constraint is added: a code distance between the $j^{th}$ superposition code word and the $i^{th}$ superposition code word is not greater than a code distance between the $j^{th}$ superposition code word and another possible superposition code word. If a superposition code word in another position is selected, another constraint needs to be added. Assuming that the $h^{th}$ superposition code word in another position is determined, a code distance between the $j^{th}$ initial code word and the $h^{th}$ initial code word is r, and then a constraint is that a code distance between the $j^{th}$ superposition code word and the $h^{th}$ superposition code word is s, so that r+s=w or w−1. Herein, w is a maximum code distance that may be finally obtained between generated code words, and generally, w is equal to a maximum code distance between initial code words plus 1 or plus 2.

If a plurality of code words satisfies all constraints, any one may be selected; otherwise, only one determined code word is used as a superposition code word. If all superposition code words corresponding to positions of initial code words having a maximum code distance from the $i^{th}$ initial code word are determined, a superposition code word in a next position may continue to be determined randomly. For example, the $u^{th}$ superposition code word is determined, and likewise, a code word needs to be selected after both constraints are satisfied, where the constraints are that a code distance between the $u^{th}$ initial code word and the determined $h^{th}$ initial code word is r, and that a code distance between the $u^{th}$ superposition code word and the $h^{th}$ superposition code word is s, so that r+s=w or w−1. In this way, a final code block may be formed after superposition code words in all positions are selected.

As a method for determining w, in this embodiment of the present invention, the following may be illustrated:

when K=2, if L is an integer multiple of 3, w=2L/3; and when K=2, if L is not an integer multiple of 3, w=[2L/3]+1, where [2L/3] is a maximum integer that is less than or equal to 2L/3.

For ease of understanding, the following describes a process of determining a superposition code block when K=2, assuming that a superposition code word arranged in the first position in the superposition code block is first determined.

Optionally, when K=2 and L is an even number, the initial code block includes $2^K$ different initial code words, and each initial code word includes K bits; and the generating a superposition code block according to the target code length and an arrangement order of the $2^K$ initial code words in the initial code block includes:

generating L/2−1 sub superposition code blocks, where each sub superposition code block includes $2^K$ sub superposition code words, and each sub superposition code word includes two bits; and performing second ordering processing on each sub superposition code block according to the arrangement order of the $2^K$ initial code words in the initial code block, so as to determine an arrangement order of the sub superposition code words in each sub superposition code block, and generating the superposition code block according to each sub superposition code block obtained after the second ordering processing, where a third sub superposition code word arranged in the first position in the $m^{th}$ sub superposition code block obtained after the second ordering processing is any code word in the $m^{th}$ sub superposition code block, and a fourth sub superposition code word in the $m^{th}$ sub superposition code block is arranged in the $i_2^{th}$ position, where the fourth sub superposition code word is a code word having a minimum code distance from the third sub superposition code word in the $m^{th}$ sub superposition code block, and for a second local block code set that is formed by m−1 sub superposition code blocks before the $m^{th}$ sub superposition code block and the initial code block and includes $2^K$ local block code words, a third local block code word arranged in the $i_2^{th}$ position is a code word having a maximum code distance from a fourth local block code word arranged in the first position in the $2^K$ local block code words.

For example, when K=2 and L=4, the superposition code block includes $2^K$=4 superposition code words, where a code length of each superposition code word is L−K=2.

Assuming that the initial code block is expressed as A={$A_1$, $A_2$, $A_3$, $A_4$}, where $A_1$=00, $A_2$=01, $A_3$=10, and $A_4$=11, for a superposition code block B={$B_1$, $B_2$, $B_3$, $B_4$}, first, the superposition code word $B_1$ arranged in the first position in the superposition code block B may be determined randomly; for example, assume $B_1$=01.

In the initial code block, among the initial code words, a code distance between the initial code word $A_4$ arranged in the fourth position and $A_1$ is maximal (the code distance is 2). Therefore, a next step is to determine the superposition code word $B_4$ corresponding to $A_4$. In this embodiment of the present invention, among the superposition code words, a code distance between code words 00 and 01 and a code distance between code words 11 and 01 are both minimal (the code distance is 1). Therefore, assume $B_4$=00 or $B_4$=11. For ease of understanding and description without loss of generality, assume $B_4$=11.

Afterward, any one of remaining code words in the superposition code block B may be determined. Without loss of generality, for example, herein the superposition code word $B_2$ arranged in the second position in the superposition code block B is first determined, and $B_2$ may be determined randomly from the remaining code words. For example, assume $B_2$=00.

Because there are only four code words in the superposition code block B, the superposition code word $B_3$ arranged in the third position in the superposition code block B is a last remaining code word, that is, $B_3$=10.

Therefore, the superposition code block B={$B_1$, $B_2$, $B_3$, $B_4$} may be generated, where $B_1$=01, $B_2$=00, $B_3$=10, and $B_4$=11.

Afterward, "superposition" may be performed on each initial code word and a corresponding (herein referring to a same sequence number) superposition code word. Herein superposition means that the foregoing superposition code word including two bits is arranged after a corresponding initial code word including two bits to form a code word including four bits. That is, a generated block code set may be expressed as {$A_1B_1$, $A_2B_2$, $A_3B_3$, $A_4B_4$}, where $A_1B_1$=0001, $A_2B_2$=0100, $A_3B_3$=1010, and $A_4B_4$=1111.

For the generated block code set as described above, its code distance matrix may be expressed as:

$$\begin{matrix} 0 & 2 & 3 & 3 \\ 2 & 0 & 3 & 3 \\ 3 & 3 & 0 & 2 \\ 3 & 3 & 2 & 0 \end{matrix}.$$

Therefore, it can be seen that a code distance between code words in the block code set is 2 or 3, and that a difference is ±1 or 0. It should be noted that the difference may be determined according to selections of the foregoing code distances. For example, a difference between the code distance 2 and the code distance 3 may be expressed as 2−3=−1, or may be expressed as 3−2=1; a difference between the code distance 2 and the code distance 2 may be expressed as 2−2=0; a difference between the code distance 3 and the code distance 3 may be expressed as 3−3=0. For avoiding repetition, the following omits detailed descriptions of same or similar cases.

In the data transmission method according to this embodiment of the present invention, through generation of a block code set as described above, performance better than that of duplicate coding can be obtained during a decoding decision. Visually, in duplicate coding, if any bit of four bits in each block is erroneous, error correction cannot be implemented. For example, 0000 may be changed to 0001 if one bit is erroneous, but whether the bit error is a bit error in 0000 or a bit error in 0101 cannot be determined. However, the coding scheme in the present invention can ensure error correction if a bit in some positions is erroneous. For example, 0001 may be changed to 0011 if one bit is erroneous, and it can be determined that the bit error is a bit error in 0001, because a code distance between 0011 and 0001 is 1, while a code distance between 0011 and 0100 is 3, a code distance between 0011 and 1010 is 2, and a code distance between 0011 and 1111 is 2, which are all greater than 1.

It should be understood that, the foregoing illustrated arrangement of the initial code block is only for exemplary description, and is not limited in the present invention. For another example, when K=2 and L=4, the superposition code block includes $2^K=4$ superposition code words, where a code length of each superposition code word is L−K=2.

Assuming that the initial code block is expressed as $A=\{A_1, A_2, A_3, A_4\}$, where $A_1=11$, $A_2=10$, $A_3=00$, and $A_4=01$, for a superposition code block $B=\{B_1, B_2, B_3, B_4\}$, first, the superposition code word $B_1$ arranged in the first position in the superposition code block B may be determined randomly; for example, assume $B_1=01$.

In the initial code block, among the initial code words, a code distance between the initial code word $A_3$ arranged in the third position and $A_1$ is maximal (the code distance is 2). Therefore, a next step is to determine the superposition code word $B_3$ corresponding to $A_3$. In this embodiment of the present invention, among the superposition code words, a code distance between code words 00 and 01 and a code distance between code words 11 and 01 are both minimal (the code distance is 1). Therefore, assume $B_3=00$ or $B_3=11$. For ease of understanding and description without loss of generality, assume $B_3=00$.

Afterward, any one of remaining code words in the superposition code block B may be determined. Without loss of generality, for example, herein the superposition code word $B_2$ arranged in the second position in the superposition code block B is first determined, and $B_2$ may be determined randomly from the remaining code words. For example, assume $B_2=10$.

Because there are only four code words in the superposition code block B, the superposition code word $B_4$ arranged in the fourth position in the superposition code block B is a last remaining code word, that is, $B_4=11$.

Therefore, the superposition code block $B=\{B_1, B_2, B_3, B_4\}$ may be generated, where $B_1=01$, $B_2=10$, $B_3=00$, and $B_4=11$.

Afterward, "superposition" may be performed on each initial code word and a corresponding (herein referring to a same sequence number) superposition code word. Herein superposition means that the foregoing superposition code word including two bits is arranged after a corresponding initial code word including two bits to form a code word including four bits. That is, a generated block code set may be expressed as $\{A_1B_1, A_2B_2, A_3B_3, A_4B_4\}$, where $A_1B_1=1101$, $A_2B_2=1010$, $A_3B_3=0000$, and $A_4B_4=0111$.

For the generated block code set as described above, its code distance matrix may be expressed as:

$$\begin{matrix} 0 & 3 & 3 & 2 \\ 3 & 0 & 2 & 3 \\ 3 & 2 & 0 & 3 \\ 2 & 3 & 3 & 0 \end{matrix}.$$

Therefore, it can be seen that a code distance between code words in the block code set is 2 or 3, and that a difference is ±1 or 0.

In addition, in this embodiment of the present invention, a plurality of block code sets with a same original code length but different target code lengths may be generated, where a block code set with an original code length K and a target code length L+2 may be based on a block code set with an original code length K and a target code length L.

For example, after a block code set $\{A_1B_1, A_2B_2, A_3B_3, A_4B_4\}$ with K=2 and L=4 is generated, a block code set $\{A_1B_1C_1, A_2B_2C_2, A_3B_3C_3, A_4B_4C_4\}$ with K=2 and L=6 may be generated. In this case, a superposition code block may be expressed as $\{B_1C_1, B_2C_2, B_3C_3, B_4C_4\}$, where $B=\{B_1, B_2, B_3, B_4\}$ and $C=\{C_1, C_2, C_3, C_4\}$ are sub superposition code blocks. The block code set $\{A_1B_1, A_2B_2, A_3B_3, A_4B_4\}$ is a local block code set for the block code set $\{A_1B_1C_1, A_2B_2C_2, A_3B_3C_3, A_4B_4C_4\}$.

Specifically, in the sub superposition code block C, the first code word $C_1$ may be selected randomly. For example, assume $C_1=00$. $A_3B_3$ has a maximum code distance from $A_1B_1$. Therefore, 01 or 10 having a minimum code distance from 00 should be allocated to $C_3$. For example, assume $C_3=10$. Remaining $C_2$ and $C_4$ may be determined randomly. For example, assume $C_2=01$, and $C_4=11$.

Afterward, "superposition" may be performed on each initial code word and a corresponding (herein referring to a same sequence number) superposition code word. Herein superposition means that the foregoing superposition code word including four bits (including two sub superposition code words) is arranged after a corresponding initial code word including two bits to form a code word including six bits. That is, a generated block code set may be expressed as $\{A_1B_1C_1, A_2B_2C_2, A_3B_3C_3, A_4B_4C_4\}$, where $A_1B_1C_1=110100$, $A_2B_2C_2=101001$, $A_3B_3C_3=000010$, and $A_4B_4C_4=011111$.

For the generated block code set as described above, its code distance matrix may be expressed as:

$$\begin{matrix} 0 & 4 & 4 & 4 \\ 4 & 0 & 4 & 4 \\ 4 & 4 & 0 & 4 \\ 4 & 4 & 4 & 0 \end{matrix}.$$

Therefore, it can be seen that a code distance between code words in the block code set is 4, and that a difference is 0.

For another example, after a block code set $\{A_1B_1C_1, A_2B_2C_2, A_3B_3C_3, A_4B_4C_4\}$ with K=2 and L=6 is generated, a block code set $\{A_1B_1C_1D_1, A_2B_2C_2D_2, A_3B_3C_3D_3, A_4B_4C_4D_4\}$ with K=2 and L=8 may be generated. In this case, a superposition code block may be expressed as $\{B_1C_1D_1, B_2C_2D_2, B_3C_3D_3, B_4C_4D_4\}$, where $B=\{B_1, B_2, B_3, B_4\}$, $C=\{C_1, C_2, C_3, C_4\}$, and $D=\{D_1, D_2, D_3, D_4\}$ are sub superposition code blocks. The block code set $\{A_1B_1C_1, A_2B_2C_2, A_3B_3C_3, A_4B_4C_4\}$ is a local block code set for the block code set $\{A_1B_1C_1D_1, A_2B_2C_2D_2, A_3B_3C_3D_3, A_4B_4C_4D_4\}$.

Specifically, in the sub superposition code block D, the first code word $D_1$ may be selected randomly. For example, assume $D_1=00$. Because all code distances between code words in the local block code set $\{A_1B_1C_1, A_2B_2C_2, A_3B_3C_3, A_4B_4C_4\}$ are the same, 01 or 10 having a minimum code distance from 00 may be allocated to any code word. For example, assume $C_3=10$. Remaining $C_2$ and $C_4$ may be determined randomly. For example, assume $C_2=01$ and $C_4=11$.

Afterward, "superposition" may be performed on each initial code word and a corresponding (herein referring to a same sequence number) superposition code word. Herein superposition means that the foregoing superposition code word including six bits (including three sub superposition code words) is arranged after a corresponding initial code word including two bits to form a code word including eight bits. That is, a generated block code set may be expressed as $\{A_1B_1C_1D_1, A_2B_2C_2D_2, A_3B_3C_3D_3, A_4B_4C_4D_4\}$, where $A_1B_1C_1D_1$=11010000, $A_2B_2C_2D_2$=10100101, $A_3B_3C_3D_3$=00001010, and $A_4B_4C_4D_4$=01111111.

For the generated block code set as described above, its code distance matrix may be expressed as:

$$\begin{matrix} 0 & 5 & 5 & 6 \\ 5 & 0 & 6 & 5 \\ 5 & 6 & 0 & 5 \\ 6 & 5 & 5 & 0 \end{matrix}.$$

Therefore, it can be seen that a code distance between code words in the block code set is 5 or 6, and that a difference is ±1 or 0.

Likewise, according to the foregoing illustrated manner 1, a block code set in which K=2 and L is any even number (L≥4) may be generated.

The following describes a manner of generating a block code set when L is an odd number (L≥3) in the manner 1.

Optionally, when K=2 and L is an odd number, the generating a superposition code block according to the target code length and an arrangement order of the $2^K$ initial code words in the initial code block includes:

generating (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks;

performing fifth ordering processing on each first sub superposition code block according to the arrangement order of the $2^K$ initial code words in the initial code block, so as to determine an arrangement order of the sub superposition code words in each first sub superposition code block, where a seventh sub superposition code word arranged in the first position in the $m^{th}$ first sub superposition code block is any code word in the $m^{th}$ first sub superposition code block, and an eighth sub superposition code word in the $m^{th}$ first sub superposition code block is arranged in the $i_5^{th}$ position, where the eighth sub superposition code word is a code word having a minimum code distance from the seventh sub superposition code word in the $m^{th}$ first sub superposition code block, and for a fifth local block code set that is formed by m−1 first sub superposition code blocks before the $m^{th}$ sub superposition code block and the initial code block and includes $2^K$ local block code words, a ninth local block code word arranged in the $i_5^{th}$ position is a code word having a maximum code distance from a tenth local block code word arranged in the first position in the $2^K$ local block code words;

in a sixth local block code set that is formed by the first sub superposition code blocks obtained after the fifth ordering processing and the initial code block and includes $2^K$ local block code words, performing sixth ordering processing on the second sub superposition code block according to an arrangement of the $2^K$ local block code words, where if code distances between the local block code words in the sixth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the sixth local block code set are not completely the same, when a code distance between an eleventh local block code word arranged in the $i_6^{th}$ position and a twelfth local block code word arranged in the $j_6^{th}$ position is not a maximum code distance in the code distances between the local block code words, a sub superposition code word arranged in the $i_6^{th}$ position is different from a sub superposition code word arranged in the $j_6^{th}$ position in the second sub superposition code block, or when a code distance between an eleventh local block code word arranged in the $i_6^{th}$ position and a twelfth local block code word arranged in the $j_6^{th}$ position is a maximum code distance in the code distances between the local block code words, a sub superposition code word arranged in the $i_6^{th}$ position is the same as a sub superposition code word arranged in the $j_6^{th}$ position in the second sub superposition code block; and generating the superposition code block according to the first sub superposition code blocks obtained after the fifth ordering processing and the second sub superposition code block obtained after the sixth ordering processing.

Specifically, when L is an odd number, L−1 is an even number, and a manner of generating a block code set with a target code length L−1 in this case has been described in the foregoing description. A block code set with a target code length L is generated by superposing a bit on each code word in the block code set (or initial code block) with the target code length L−1, and a superposition code block is formed by a bit superposed after each code word.

For the block code set with the target code length L−1, if code distances between any two code words are the same, when a constraint that a quantity of bits 0 and a quantity of bits 1 are equal is satisfied, an order in the superposition code block may be determined randomly. If not all code distances between any two code words are the same, all constraints must be satisfied, so that if a code distance between the $i^{th}$ code word and the $j^{th}$ code word is not greater than a code distance between any other two different code words in the block code set with the target code length L−1, the superposed $i^{th}$ bit must be different from the $j^{th}$ bit. If a plurality of code words satisfies the constraints, any one may be selected.

For example, when K=2 and L=3, assume that an initial code block is expressed as $A'=\{A_1', A_2', A_3', A_4'\}$, where $A_1'$=00, $A_2'$=01, $A_3'$=10, and $A_4'$=11.

Because a code distance between $A_1'$ and $A_2'$ is 1, and a code distance between $A_1'$ and $A_3'$ is 1, which are both less than a code distance (2) between $A_1'$ and $A_4'$, for a superposition code block $B'=\{B_1', B_2', B_3', B_4'\}$, $B_1'$ must be different from $B_2'$ and $B_3'$. For example, if $B_1'$ is 1, $B_2'$ and $B_3'$ must be 0, and likewise, $B_4'$ must be 1.

Therefore, the superposition code block $B'=\{B_1', B_2', B_3', B_4'\}$ may be generated, where $B_1'$=1, $B_2'$=0, $B_3'$=0, and $B_4'$=1.

Afterward, "superposition" may be performed on each initial code word and a corresponding (herein referring to a same sequence number) superposition code word. Herein superposition means that the foregoing superposition code word including one bit is arranged after a corresponding initial code word including two bits to form a code word including three bits. That is, a generated block code set may be expressed as $\{A_1'B_1', A_2'B_2', A_3'B_3', A_4'B_4'\}$, where $A_1'B_1'=001$, $A_2'B_2'=010$, $A_3'B_3'=100$, and $A_4'B_4'=111$.

For the generated block code set as described above, its code distance matrix may be expressed as:

$$\begin{matrix} 0 & 2 & 2 & 2 \\ 2 & 0 & 2 & 2 \\ 2 & 2 & 0 & 2 \\ 2 & 2 & 2 & 0 \end{matrix}$$

Therefore, it can be seen that a code distance between code words in the block code set is 2, and that a difference is 0.

For another example, when K=2 and L=5, as described above, a block code set with K=2 and L=4 that can be obtained above is referred to as a local block code set of a block code set with K=2 and L=5. One bit is superposed on each code word in the local block code set to generate the block code set with K=2 and L=5.

For example, as described above, the local block code set is expressed as $\{A_1'B_1', A_2'B_2', A_3'B_3', A_4'B_4'\}$, where $A_1'B_1'=0001$, $A_2'B_2'=0100$, $A_3'B_3'=1010$, and $A_4'B_4'=1111$.

Because a code distance between $A_1'B_1'$ and $A_4'B_4'$ is 3, and a code distance between $A_2'B_2'$ and $A_3'B_3'$ is 3, which are both less than a code distance (4) between $A_1'B_1'$ and $A_2'B_2'$, for a superposition code block $C'=\{C_1', C_2', C_3', C_4'\}$, $C_1'$ must be different from $C_4'$, and $C_2'$ must be different from $C_3'$.

For example, the superposition code block $C'=\{C_1', C_2', C_3', C_4'\}$ may be generated, where $C_1'=0$, $C_2'=1$, $C_3'=0$, and $C_4'=1$.

Afterward, "superposition" may be performed on each code word in the local block code set and a corresponding (herein referring to a same sequence number) superposition code word. Herein superposition means that the foregoing superposition code word including one bit is arranged after a corresponding local block code word including four bits to form a code word including five bits. That is, a generated block code set may be expressed as $\{A_1'B_1'C_1', A_2'B_2'C_2', A_3'B_3'C_3', A_4'B_4'C_4'\}$, where $A_1'B_1'C_1'=11010$, $A_2'B_2'C_2'=10101$, $A_3'B_3'C_3'=00000$, and $A_4'B_4'C_4'=01111$.

For the generated block code set as described above, its code distance matrix may be expressed as:

$$\begin{matrix} 0 & 4 & 3 & 3 \\ 4 & 0 & 3 & 3 \\ 3 & 3 & 0 & 4 \\ 3 & 3 & 4 & 0 \end{matrix}$$

Therefore, it can be seen that a code distance between code words in the block code set is 3 or 4, and that a difference is ±1 or 0.

For another example, when K=2 and L=7, as described above, a block code set with K=2 and L=6 that can be obtained above is referred to as a local block code set of a block code set with K=2 and L=7. One bit is superposed on each code word in the local block code set to generate the block code set with K=2 and L=7.

For example, as described above, the local block code set is expressed as $\{A_1'B'C', A_2'B_2'C'_2, A_3'B_3'C'_3, A_4'B_4'C'_4\}$, where $A_1'B_1'C'_1=110100$, $A_2'B_2'C'=101001$, $A_3'B_3'C'_3=000010$, and $A_4'B_4'C'_4=011111$.

Because code distances between code words in the local block code set are the same, for a superposition code block $D'=\{D_1', D_2', D_3', D_4'\}$, each code word may be determined randomly.

For example, the superposition code block $D'=\{D_1', D_2', D_3', D_4'\}$ may be generated, where $D_1'=0$, $D_2'=0$, $D_3'=1$, and $D_4'=1$.

Afterward, "superposition" may be performed on each code word in the local block code set and a corresponding (herein referring to a same sequence number) superposition code word. Herein superposition means that the foregoing superposition code word including one bit is arranged after a corresponding local block code word including four bits to form a code word including five bits. That is, a generated block code set may be expressed as $\{A'B'C'_1D_1', A_2'B_2'C'_2D_2', A_3'B_3'C'_3D_3', A_4'B_4'C'_4D_4'\}$, where $A_1'B'C'_1D'=1101000$, $A_2'B_2'C'_2D_2'=1010010$, $A_3'B_3'C'_3D_3'=0000101$, and $A_4'B_4'C'_4D_4'=0111111$.

For the generated block code set as described above, its code distance matrix may be expressed as:

$$\begin{matrix} 0 & 4 & 5 & 5 \\ 4 & 0 & 5 & 5 \\ 5 & 5 & 0 & 4 \\ 5 & 5 & 4 & 0 \end{matrix}$$

Therefore, it can be seen that a code distance between code words in the block code set is 4 or 5, and that a difference is ±1 or 0.

For another example, when K=2 and L=9, as described above, a block code set with K=2 and L=8 that can be obtained above is referred to as a local block code set of a block code set with K=2 and L=9. One bit is superposed on each code word in the local block code set to generate the block code set with K=2 and L=9.

For example, as described above, the local block code set is expressed as $\{A_1'B_1'C_1D', A_2'B_2'C'_2D_2', A_3'B_3'C'_3D_3', A_4'B_4'C'_4D_4'\}$, where $A_1'B_1'C'_1D_1'=11010000$, $A_2'B_2'C'_2D_2'=10100101$, $A_3'B_3'C'_3D_3'=00001010$, and $A_4'B_4'C'_4D_4'=01111111$.

Because a code distance between $A_1'B_1'C_1'D_1'$ and $A_2'B_2'C'_2D_2'$ is 5, and a code distance between $A_3'B_3'C'_3D_3'$ and $A_4'B_4'C'_4D_4'$ is 5, which are both less than a code distance (6) between $A_1'B_1'C'_1D_1'$ and $A_4'B_4'C'_4D_4'$, for a superposition code block $E'=\{E_1', E_2', E_3', E_4'\}$, $E_1'$ must be different from $E_2'$, and $E_3'$ must be different from $E_4'$.

For example, the superposition code block $E'=\{E_1', E_2', E_3', E_4'\}$ may be generated, where $E_1'=1$, $E_2'=0$, $E_3'=0$, and $E_4'=1$.

Afterward, "superposition" may be performed on each code word in the local block code set and a corresponding (herein referring to a same sequence number) superposition code word. Herein superposition means that the foregoing superposition code word including one bit is arranged after a corresponding local block code word including eight bits to form a code word including nine bits. That is, a generated block code set may be expressed as $\{A'B'C'_1D_1'E_1', A_2'B_2'C'_2D_2'E_2', A_3'B_3'C'_3D_3'E_3', A_4'B_4'C'_4D_4'E_4'\}$, where $A_1'B'C'_1D_1'E_1'=110100001$, $A_2'B_2'C'_2D_2'E_2'=101001010$, $A_3'B_3'C'_3D_3'E_3'=000010100$, and $A_4'B_4'C'_4D_4'E_4'=011111111$.

For the generated block code set as described above, its code distance matrix may be expressed as:

$$\begin{matrix} 0 & 6 & 6 & 6 \\ 6 & 0 & 6 & 6 \\ 6 & 6 & 0 & 6 \\ 6 & 6 & 6 & 0 \end{matrix}.$$

Therefore, it can be seen that a code distance between code words in the block code set is 6, and that a difference is 0.

Likewise, according to the foregoing illustrated manner 1, a block code set in which K=2 and L is any odd number (L≥3) may be generated.

Manner 2

Optionally, when K=2 and L is an even number, the initial code block includes $2^K$ different initial code words, and each initial code word includes K bits; and the generating a superposition code block according to the target code length and an arrangement order of the $2^K$ initial code words in the initial code block includes:

generating L/2−1 sub superposition code blocks, where each sub superposition code block includes $2^K$ sub superposition code words, and each sub superposition code word includes two bits; and performing first ordering processing on each sub superposition code block according to the arrangement order of the $2^K$ initial code words in the initial code block, so as to determine an arrangement order of the sub superposition code words in each sub superposition code block, and generating the superposition code block according to each sub superposition code block obtained after the first ordering processing, where a first sub superposition code word arranged in the first position in the $m^{th}$ sub superposition code block obtained after the first ordering processing is any code word in the $m^{th}$ sub superposition code block, and a second sub superposition code word in the $m^{th}$ sub superposition code block is arranged in the $i_1^{th}$ position, where the second sub superposition code word is a code word having a maximum code distance from the first sub superposition code word in the $m^{th}$ sub superposition code block, and for a first local block code set that is formed by m−1 sub superposition code blocks before the $m^{th}$ sub superposition code block and the initial code block and includes $2^K$ local block code words, a first local block code word arranged in the $i_1^{th}$ position is a code word having a minimum code distance from a second local block code word arranged in the first position in the $2^K$ local block code words.

Specifically, when L is an even number, L−2 is an even number. In this case, the block code set with the target code length L is formed by superposing two bits on each code word in a block code set (or an initial code block) with a target code length L−2, and a superposition code block is formed by two bits superposed on each code word.

The first code word (including two bits) in the superposition code block may be selected randomly. A code word having a maximum value of a code distance (because each code word in the superposition code block includes two bits, the maximum value is 2) from the first code word should be arranged in the $i^{th}$ position, where a code distance between the $i^{th}$ code word and the first code word in the block code set with the target code length L−2 is not greater than a code distance between any other code word and the first code word, and remaining code words may be selected randomly.

For example, when K=2 and L=4, the superposition code block includes $2^K$=4 superposition code words, where a code length of each superposition code word is L−K=2.

Assuming that the initial code block is expressed as A={$A_1$, $A_2$, $A_3$, $A_4$}, where $A_1$=00, $A_2$=01, $A_3$=10, and $A_4$=11, for a superposition code block B={$B_1$, $B_2$, $B_3$, $B_4$}, first, the superposition code word $B_1$ arranged in the first position in the superposition code block B may be determined randomly; for example, assume $B_1$=01.

In the superposition code block B, a code distance between 10 and $B_1$ is maximal (the code distance is 2). Therefore, a next step is to determine a position of 10 in the superposition code block B.

In the initial code block, among the initial code words, a code distance between the initial code word $A_4$ arranged in the fourth position and $A_1$ is maximal (the code distance is 2), or in the initial code block, neither a code distance between $A_2$ and $A_1$ nor a code distance between $A_3$ and $A_1$ is greater than a code distance between $A_4$ and $A_1$. Therefore, the code word 10 may be allocated to the superposition code word $B_2$ corresponding to $A_2$, or the code word 10 may be allocated to the superposition code word $B_3$ corresponding to $A_3$. In the embodiment of the present invention, for ease of understanding and description without loss of generality, assume $B_3$=10.

Afterward, any one of remaining code words in the superposition code block B may be determined. Without loss of generality, for example, herein the superposition code word $B_2$ arranged in the second position in the superposition code block B is first determined, and $B_2$ may be determined randomly from the remaining code words. For example, assume $B_2$=00.

Because there are only four code words in the superposition code block B, the superposition code word $B_4$ arranged in the fourth position in the superposition code block B is a last remaining code word, that is, $B_4$=11.

Therefore, the superposition code block B={$B_1$, $B_2$, $B_3$, $B_4$} may be generated, where $B_1$=01, $B_2$=00, $B_3$=10, and $B_4$=11.

Afterward, "superposition" may be performed on each initial code word and a corresponding (herein referring to a same sequence number) superposition code word. Herein superposition means that the foregoing superposition code word including two bits is arranged after a corresponding initial code word including two bits to form a code word including four bits. That is, a generated block code set may be expressed as {$A_1B_1$, $A_2B_2$, $A_3B_3$, $A_4B_4$}, where $A_1B_1$=0001, $A_2B_2$=0100, $A_3B_3$=1010, and $A_4B_4$=1111.

For the generated block code set as described above, its code distance matrix may be expressed as:

$$\begin{matrix} 0 & 2 & 3 & 3 \\ 2 & 0 & 3 & 3 \\ 3 & 3 & 0 & 2 \\ 3 & 3 & 2 & 0 \end{matrix}.$$

Therefore, it can be seen that a code distance between code words in the block code set is 2 or 3, and that a difference is ±1 or 0.

In the data transmission method according to this embodiment of the present invention, through generation of a block code set as described above, performance better than that of duplicate coding can be obtained during a decoding decision. Visually, in duplicate coding, if any bit of four bits in each block is erroneous, error correction cannot be implemented. For example, 0000 may be changed to 0001 if one bit is erroneous, but whether the bit error is a bit error in 0000 or a bit error in 0101 cannot be determined. However, the coding scheme in the present invention can ensure error correction if a bit in some positions is erroneous. For example, 0001 may be changed to 0011 if one bit is erroneous, and it can be determined that the bit error is a bit error in 0001, because a code distance between 0011 and 0001 is 1, while a code distance between 0011 and 0100 is 3, a code distance between 0011 and 1010 is 2, and a code distance between 0011 and 1111 is 2, which are all greater than 1.

It should be understood that, the foregoing illustrated arrangement of the initial code block is only for exemplary description, and is not limited in the present invention. For another example, when K=2 and L=4, the superposition code block includes $2^K=4$ superposition code words, where a code length of each superposition code word is L−K=2.

Assuming that the initial code block is expressed as $A=\{A_1, A_2, A_3, A_4\}$, where $A_1=11$, $A_2=10$, $A_3=00$, and $A_4=01$, for a superposition code block $B=\{B_1, B_2, B_3, B_4\}$, first, the superposition code word $B_1$ arranged in the first position in the superposition code block B may be determined randomly; for example, assume $B_1=01$.

In the superposition code block B, a code distance between 10 and $B_1$ is maximal (the code distance is 2). Therefore, a next step is to determine a position of 10 in the superposition code block B.

In the initial code block, among each initial code words, a code distance between the initial code word $A_3$ arranged in the third position and $A_1$ is maximal (the code distance is 2), or in the initial code block, neither a code distance between $A_2$ and $A_1$ nor a code distance between $A_4$ and $A_1$ is greater than a code distance between $A_3$ and $A_1$. Therefore, the code word 10 may be allocated to the superposition code word $B_2$ corresponding to $A_2$, or the code word 10 may be allocated to the superposition code word $B_4$ corresponding to $A_4$. In this embodiment of the present invention, for ease of understanding and description without loss of generality, assume $B_2=10$.

Afterward, any one of remaining code words in the superposition code block B may be determined. Without loss of generality, for example, herein the superposition code word $B_3$ arranged in the third position in the superposition code block B is first determined, and $B_3$ may be determined randomly from the remaining code words. For example, assume $B_3=00$.

Because there are only four code words in the superposition code block B, the superposition code word $B_4$ arranged in the fourth position in the superposition code block B is a last remaining code word, that is, $B_4=11$.

Therefore, the superposition code block $B=\{B_1, B_2, B_3, B_4\}$ may be generated, where $B_1=01$, $B_2=10$, $B_3=00$, and $B_4=11$.

Afterward, "superposition" may be performed on each initial code word and a corresponding (herein referring to a same sequence number) superposition code word. Herein superposition means that the foregoing superposition code word including two bits is arranged after a corresponding initial code word including two bits to form a code word including four bits. That is, a generated block code set may be expressed as $\{A_1B_1, A_2B_2, A_3B_3, A_4B_4\}$, where $A_1B_1=1101$, $A_2B_2=1010$, $A_3B_3=0000$, and $A_4B_4=0111$.

For the generated block code set as described above, its code distance matrix may be expressed as:

$$\begin{matrix} 0 & 3 & 3 & 2 \\ 3 & 0 & 2 & 3 \\ 3 & 2 & 0 & 3 \\ 2 & 3 & 3 & 0 \end{matrix}.$$

Therefore, it can be seen that a code distance between code words in the block code set is 2 or 3, and that a difference is ±1 or 0.

In addition, in this embodiment of the present invention, a plurality of block code sets with a same original code length but different target code lengths may be generated, where a block code set with an original code length K and a target code length L+2 may be based on a block code set with an original code length K and a target code length L.

For example, after a block code set $\{A_1B_1, A_2B_2, A_3B_3, A_4B_4\}$ with K=2 and L=4 is generated, a block code set $\{A_1B_1C_1, A_2B_2C_2, A_3B_3C_3, A_4B_4C_4\}$ with K=2 and L=6 may be generated. In this case, a superposition code block may be expressed as $\{B_1C_1, B_2C_2, B_3C_3, B_4C_4\}$, where $B=\{B_1, B_2, B_3, B_4\}$ and $C=\{C_1, C_2, C_3, C_4\}$ are sub superposition code blocks. The block code set $\{A_1B_1, A_2B_2, A_3B_3, A_4B_4\}$ is a local block code set for the block code set $\{A_1B_1C_1, A_2B_2C_2, A_3B_3C_3, A_4B_4C_4\}$.

Specifically, in the sub superposition code block C, the first code word $C_1$ may be selected randomly. For example, assume $C_1=00$. $A_3B_3$ has a maximum code distance from $A_1B_1$. Therefore, 11 having a minimum code distance from 00 should be allocated to $C_2$ or $C_4$. For example, assume $C_4=11$. Remaining $C_2$ and $C_3$ may be determined randomly. For example, assume $C_2=01$, and $C_3=10$.

Afterward, "superposition" may be performed on each initial code word and a corresponding (herein referring to a same sequence number) superposition code word. Herein superposition means that the foregoing superposition code word including four bits (including two sub superposition code words) is arranged after a corresponding initial code word including two bits to form a code word including six bits. That is, a generated block code set may be expressed as $\{A_1B_1C_1, A_2B_2C_2, A_3B_3C_3, A_4B_4C_4\}$, where $A_1B_1C_1=110100$, $A_2B_2C_2=101001$, $A_3B_3C_3=000010$, and $A_4B_4C_4=011111$.

For the generated block code set as described above, its code distance matrix may be expressed as:

$$\begin{matrix} 0 & 4 & 4 & 4 \\ 4 & 0 & 4 & 4 \\ 4 & 4 & 0 & 4 \\ 4 & 4 & 4 & 0 \end{matrix}.$$

Therefore, it can be seen that a code distance between code words in the block code set is 4, and that a difference is 0.

For another example, after a block code set $\{A_1B_1C_1, A_2B_2C_2, A_3B_3C_3, A_4B_4C_4\}$ with K=2 and L=6 is generated, a block code set $\{A_1B_1C_1D_1, A_2B_2C_2D_2, A_3B_3C_3D_3, A_4B_4C_4D_4\}$ with K=2 and L=8 may be generated. In this case, a superposition code block may be expressed as $\{B_1C_1D_1, B_2C_2D_2, B_3C_3D_3, B_4C_4D_4\}$, where $B=\{B_1, B_2, B_3, B_4\}$, $C=\{C_1, C_2, C_3, C_4\}$, and $D=\{D_1, D_2, D_3, D_4\}$ are sub superposition code blocks. The block code set $\{A_1B_1C_1, A_2B_2C_2, A_3B_3C_3, A_4B_4C_4\}$ is a local block code set for the block code set $\{A_1B_1C_1D_1, A_2B_2C_2D_2, A_3B_3C_3D_3, A_4B_4C_4D_4\}$.

Specifically, in the sub superposition code block D, the first code word $D_1$ may be selected randomly. For example, assume $D_1$=00. Because all code distances between code words in the local block code set $\{A_1B_1C_1, A_2B_2C_2, A_3B_3C_3, A_4B_4C_4\}$ are the same, 01 or 10 having a minimum code distance from 00 may be allocated to any code word. For example, assume $C_3$=10. Remaining $C_2$ and $C_4$ may be determined randomly. For example, assume $C_2$=01, and $C_4$=11.

Afterward, "superposition" may be performed on each initial code word and a corresponding (herein referring to a same sequence number) superposition code word. Herein superposition means that the foregoing superposition code word including six bits (including three sub superposition code words) is arranged after a corresponding initial code word including two bits to form a code word including eight bits. That is, a generated block code set may be expressed as $\{A_1B_1C_1D_1, A_2B_2C_2D_2, A_3B_3C_3D_3, A_4B_4C_4D_4\}$, where $A_1B_1C_1D_1$=11010000, $A_2B_2C_2D_2$=10100101, $A_3B_3C_3D_3$=00001010, and $A_4B_4C_4D_4$=01111111.

For the generated block code set as described above, its code distance matrix may be expressed as:

$$\begin{matrix} 0 & 5 & 5 & 6 \\ 5 & 0 & 6 & 5 \\ 5 & 6 & 0 & 5 \\ 6 & 5 & 5 & 0 \end{matrix}.$$

Therefore, it can be seen that a code distance between code words in the block code set is 5 or 6, and that a difference is ±1 or 0.

Likewise, according to the foregoing illustrated manner 2, a block code set in which K=2 and L is any even number (L≥4) may be generated.

In addition, a manner of generating a block code set when L is an odd number (L≥3) in the manner 2 is similar to the manner of generating a block code set when L is an odd number (L≥3) in the manner 1. Herein, for avoiding repetition, a repeated description is omitted.

That is, optionally, when K=2 and L is an odd number, the initial code block includes $2^K$ different initial code words, and each initial code word includes K bits; and the generating a superposition code block according to the target code length and an arrangement order of the $2^K$ initial code words in the initial code block includes:

generating (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks;

performing third ordering processing on each first sub superposition code block according to the arrangement order of the $2^K$ initial code words in the initial code block, so as to determine an arrangement order of the sub superposition code words in each first sub superposition code block, where a fifth sub superposition code word arranged in the first position in the $m^{th}$ first sub superposition code block is any code word in the $m^{th}$ first sub superposition code block, and a sixth sub superposition code word in the $m^{th}$ first sub superposition code block is arranged in the $i_3^{th}$ position, where the sixth sub superposition code word is a code word having a maximum code distance from the fifth sub superposition code word in the $m^{th}$ first sub superposition code block, and for a third local block code set that is formed by m−1 first sub superposition code blocks before the $m^{th}$ sub superposition code block and the initial code block and includes $2^K$ local block code words, a fifth local block code word arranged in the $i_3^{th}$ position is a code word having a minimum code distance from a sixth local block code word arranged in the first position in the $2^K$ local block code words;

in a fourth local block code set that is formed by the first sub superposition code blocks obtained after the third ordering processing and the initial code block and includes $2^K$ local block code words, performing fourth ordering processing on the second sub superposition code block according to an arrangement of the $2^K$ local block code words, where if code distances between the local block code words in the fourth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the fourth local block code set are not completely the same, when a code distance between a seventh local block code word arranged in the $i_4^{th}$ position and an eighth local block code word arranged in the $j_4^{th}$ position is not a maximum code distance in the code distances between the local block code words, a sub superposition code word arranged in the $i_4^{th}$ position is different from a sub superposition code word arranged in the $j_4^{th}$ position in the second sub superposition code block, or when a code distance between a seventh local block code word arranged in the $i_4^{th}$ position and an eighth local block code word arranged in the $j_4^{th}$ position is a maximum code distance in the code distances between the local block code words, a sub superposition code word arranged in the $i_4^{th}$ position is the same as a sub superposition code word arranged in the $j_4^{th}$ position in the second sub superposition code block; and generating the superposition code block according to the first sub superposition code blocks obtained after the third ordering processing and the second sub superposition code block obtained after the fourth ordering processing.

The following describes in detail a process of determining an order of the superposition code words in the superposition code block when K=3.

Optionally, when K≤3, the initial code block includes $2^K$ different initial code words, and each initial code word includes K bits; and the generating a superposition code block according to the target code length and an arrangement order of the $2^K$ initial code words in the initial code block includes:

determining a maximum code distance w between the superposition code words in the superposition code block according to the target code length L and the original code length K; and generating the superposition code block according to the arrangement order of the $2^K$ initial code words in the initial code block and the maximum code distance between the superposition code words in the superposition code block.

Specifically, in this embodiment of the present invention, an initial code word arranged in the $i^{th}$ position may correspond to a superposition code word arranged in the $i^{th}$ position, or an initial code word arranged in the $i^{th}$ position in the initial code block and a superposition code word arranged in the $i^{th}$ position in the superposition code block may form a block code word arranged in the $i^{th}$ position in the block code set. As described above, because the arrangement order of the initial code words in the initial code block is determined, an arrangement order of the superposition code words needs to be determined according to the arrangement order of the initial code words.

First, a superposition code word arranged in any position in the superposition code block may be determined, that is, after a position of the $i^{th}$ superposition code word is determined, if a position of an initial code word having a maximum code distance from the $i^{th}$ initial code word is j, and the $j^{th}$ superposition code word is not determined, a constraint is added: a code distance between the $j^{th}$ superposition code word and the $i^{th}$ superposition code word is not greater than a code distance between the $j^{th}$ superposition code word and another possible superposition code word. If a superposition code word in another position is selected, another constraint needs to be added. Assuming that the $h^{th}$ superposition code word in another position is determined, a code distance between the $j^{th}$ initial code word and the $h^{th}$ initial code word is r, and then a constraint is that a code distance between the $j^{th}$ superposition code word and the $h^{th}$ superposition code word is s, so that r+s=w or w−1. Herein, w is a maximum code distance that may be finally obtained between generated code words, and generally, w is equal to a maximum code distance between initial code words plus 1 or plus 2.

If a plurality of code words satisfies all constraints, any one may be selected; otherwise, only one determined code word is used as a superposition code word. If all superposition code words corresponding to positions of initial code words having a maximum code distance from the $i^{th}$ initial code word are determined, a superposition code word in a next position may continue to be determined randomly. For example, the $u^{th}$ superposition code word is determined, and likewise, a code word needs to be selected after both constraints are satisfied, where the constraints are that a code distance between the $u^{th}$ initial code word and the determined $h^{th}$ initial code word is r, and that a code distance between the $u^{th}$ superposition code word and the $h^{th}$ superposition code word is s, so that r+s=w or w−1. In this way, a final code block may be formed after superposition code words in all positions are selected.

As a method for determining w, in this embodiment of the present invention, the following may be illustrated:

when K=3, w=[4L/7], where [4L/7] is a maximum integer that is less than or equal to 4L/7.

For ease of understanding, the following describes a process of determining a superposition code block when K=3, assuming that a superposition code word arranged in the first position in the superposition code block is first determined.

It should be noted that, when K=3 and L is less than 6, a block code set cannot be obtained. Therefore, in this embodiment of the present invention, when K=3, L>6 needs to be satisfied.

First, a process of determining a block code set when K=3 and L=6 is described.

Assuming that an initial code block is expressed as $A=\{A_1, A_2, A_3, A_4, A_5, A_6, A_7, A_8\}$, where $A_1=000$, $A_2=001$, $A_3=010$, $A_4=011$, $A_5=100$, $A_6=101$, $A_7=110$, and $A_8=111$, for a superposition code block $B=\{B_1, B_2, B_3, B_4, B_5, B_6, B_7, B_8\}$, first, the superposition code word $B_1$ arranged in the first position in the superposition code block B may be determined randomly; for example, assume $B_1=111$. That is, $A_1B_1=000111$.

An initial code word corresponding to $B_1$ is $A_1$, and in the initial code block, among the initial code words, a code distance between the initial code word $A_8$ (namely, 111) arranged in the eighth position and $A_1$ (namely, 000) is maximal (that is, the code distance is 3). Therefore, a next step is to determine the superposition code word $B_8$ corresponding to $A_8$. In this embodiment of the present invention, among the superposition code words, a code distance between a code word 101 and $B_1$ (namely, 111), a code distance between a code word 011 and $B_1$ (namely, 111), and a code distance between a code word 110 and $B_1$ (namely, 111) are all minimal (the code distances are 1). Therefore, assume $B_8=101$ or $B_8=011$ or $B_8=110$. For ease of understanding and description without loss of generality, assume $B_8=101$. That is, $A_8B_8=111101$, and a code distance between $A_1B_1$ and $A_8B_8$ is 4.

Because the code distance between $A_1=000$ and $A_8=111$ is maximal, and the superposition code word $B_1$ corresponding to $A_1$ and the superposition code word $B_8$ corresponding to $A_8$ are determined, a superposition code word in any position may be determined. Without loss of generality, for example, $B_2$ is determined.

An initial code word corresponding to $B_2$ is $A_2=001$, a code distance between $A_2$ and $A_1$ is 1, and a code distance between $A_2$ and $A_8$ is 2. If a code distance between $B_2$ and $B_1$ (111) is 1, a code distance between $A_2B_2$ and $A_1B_1$ is 2. Because a code distance between $A_1B_1$ and $A_8B_8$ is 4, a case in which the code distance (4) between $A_1B_1$ and $A_8B_8$ minus the code distance (2) between $A_2B_2$ and $A_1B_1$ is equal to 2 occurs. That is, a difference between the code distances is greater than 1, which does not satisfy a constraint. Therefore, the code distance between $B_2$ and $B_1$ (111) must be 2 or 3.

Likewise, if a code distance between $B_2$ and $B_8$ (101) is 3, a code distance between $A_2B_2$ and $A_8B_8$ is 5. In the initial code block, there is a plurality of code words whose code distances from a code word are a minimum code distance (1), but there is only one code word whose code distance from a code word is a maximum code distance (3). Likewise, in the superposition code block, there is a plurality of code words whose code distances from a code word are a minimum code distance (1), but there is only one code word whose code distance from a code word is a maximum code distance (3). Consequently, in a finally generated block code set, some code distances are less than 4 (for example, may be 3 or 2), that is, a difference between code distances is greater than 1, which does not satisfy a constraint. Therefore, the code distance between $B_2$ and $B_8$ (101) must be 1 or 2.

There is a plurality of code words satisfying the two constraints. In this case, any one may be selected. Without loss of generality, for example, $B_2=001$ is determined, that is, $A_2B_2=001001$, a code distance between $A_1B_1$ and $A_2B_2$ is 3, and a code distance between $A_8B_8$ and $A_2B_2$ is 3.

An initial code word corresponding to $B_7$ is $A_7$, and in the initial code block, among the initial code words, a code distance between the initial code word $A_7$ (namely, 110) arranged in the seventh position and $A_2$ (namely, 001) is maximal (that is, the code distance is 3). Therefore, a next step is to determine the superposition code word $B_7$ corresponding to $A_7$.

Because the code distance between $A_7$ and $A_2$ is a maximum code distance, a code distance between $B_7$ and $B_2$ needs to be a minimum code distance (that is, the code distance is 1). In addition, code distances between $B_7$ and other selected superposition code words (namely, $B_1$ and $B_8$) also need to satisfy constraints.

A code distance (denoted as $x_1$) between $A_7$ (namely, 110) and $A_1$ (namely, 000) is 2, a code distance (denoted as $x_2$) between $A_7$ (namely, 110) and $A_8$ (namely, 111) is 1, and as described above, a code distance between code words in the determined block code set is 3 or 4 (or a maximum code distance between code words in the block code set is 4).

Therefore, a code distance (denoted as $y_1$) between $B_7$ and $B_1$ (namely, 111) needs to satisfy:

$$x_1+y_1=4 \text{ or } 4-1,$$

that is, the code distance between $B_7$ and $B_1$ (namely, 111) can only be 1 or 2.

In addition, a code distance (denoted as $y_2$) between $B_7$ and $B_8$ (namely, 101) needs to satisfy:

$$x_2+y_2=4 \text{ or } 4-1,$$

that is, the code distance between $B_7$ and $B_8$ (namely, 101) can only be 2 or 3.

A superposition code word that satisfies all the foregoing constraints is 011, that is, $B_7$=011, and $A_7B_7$=110011.

Then a superposition code word in a next position is determined randomly. Without loss of generality, for example, $B_3$ is determined. Likewise, first, constraints on a code distance from a selected superposition code word are determined.

Similar to a principle of determining $B_2$, because a code distance between $A_3$ (namely, 010) and $A_1$ is 1, a code distance between $B_3$ and $B_1$ must be 2 or 3;

because a code distance between $A_3$ (namely, 010) and $A_2$ is 2, a code distance between $B_3$ and $B_2$ must be 1 or 2;

because a code distance between $A_3$ (namely, 010) and $A_7$ is 1, a code distance between $B_3$ and $B_7$ must be 2 or 3; and because a code distance between $A_3$ (namely, 010) and $A_8$ is 2, a code distance between $B_3$ and $B_8$ must be 1 or 2.

Code words satisfying the constraints are 000 and 100, and either one may be selected. Without loss of generality, for example, assume $B_3$=000, that is, $A_3B_3$=010000.

An initial code word corresponding to $B_3$ is $A_3$, and in the initial code block, among the initial code words, a code distance between the initial code word $A_6$ (namely, 101) arranged in the sixth position and $A_3$ (namely, 010) is maximal (that is, the code distance is 3). Therefore, a next step is to determine the superposition code word $B_6$ corresponding to $A_6$.

Because a code distance between $A_6$ and $A_3$ is a maximum code distance, a code distance between $B_6$ and $B_3$ needs to be a minimum code distance (that is, the code distance is 1). In addition, code distances between $B_6$ and other selected superposition code words (namely, $B_1$, $B_8$, $B_2$, and $B_7$) also need to satisfy constraints.

A code distance (denoted as $x_3$) between $A_6$ (namely, 101) and $A_1$ (namely, 000) is 2, a code distance (denoted as $x_4$) between $A_6$ and $A_2$ (namely, 001) is 1, a code distance (denoted as $x_5$) between $A_6$ and $A_7$ (namely, 110) is 2, a code distance (denoted as $x_6$) between $A_6$ and $A_8$ (namely, 111) is 1, and as described above, a code distance between code words in the determined block code set is 3 or 4 (or a maximum code distance between code words in the block code set is 4).

Therefore, a code distance (denoted as $y_3$) between $B_6$ and $B_1$ (namely, 111) needs to satisfy:

$$x_3+y_3=4 \text{ or } 4-1,$$

that is, the code distance between $B_6$ and $B_1$ (namely, 111) can only be 1 or 2.

In addition, a code distance (denoted as $y_4$) between $B_6$ and $B_2$ (namely, 001) needs to satisfy:

$$x_4+y_4=4 \text{ or } 4-1,$$

that is, the code distance between $B_6$ and $B_2$ (namely, 001) can only be 2 or 3.

In addition, a code distance (denoted as $y_5$) between $B_6$ and $B_7$ (namely, 011) needs to satisfy:

$$x_5+y_5=4 \text{ or } 4-1,$$

that is, the code distance between $B_6$ and $B_7$ (namely, 011) can only be 1 or 2.

In addition, a code distance (denoted as $y_6$) between $B_6$ and $B_8$ (namely, 101) needs to satisfy:

$$x_6+y_6=4 \text{ or } 4-1,$$

that is, the code distance between $B_6$ and $B_8$ (namely, 101) can only be 2 or 3.

A superposition code word that satisfies all the foregoing constraints is 010, that is, $B_6$=010, and $A_6B_6$=101010.

Similarly, $B_4$=110, $A_4B_4$=011110, $B_5$=100, and $A_5B_5$=100100 can be determined.

Therefore, a block code set can be obtained. The block code set is expressed as AB={$A_1B_1$, $A_2B_2$, $A_3B_3$, $A_4B_4$, $A_5B_5$, $A_6B_6$, $A_7B_7$, $A_8B_8$}, where $A_1B_1$=000111, $A_2B_2$=001001, $A_3B_3$=010000, $A_4B_4$=011110, $A_5B_5$=100100, $A_6B_6$=101010, $A_7B_7$=110011, and $A_8B$=111101.

For the generated block code set as described above, its code distance matrix may be expressed as:

$$\begin{matrix} 0 & 3 & 4 & 3 & 3 & 4 & 3 & 4 \\ 3 & 0 & 3 & 4 & 4 & 3 & 4 & 3 \\ 4 & 3 & 0 & 3 & 3 & 4 & 3 & 4 \\ 3 & 4 & 3 & 0 & 4 & 3 & 4 & 3 \\ 3 & 4 & 3 & 4 & 0 & 3 & 4 & 3 \\ 4 & 3 & 4 & 3 & 3 & 0 & 3 & 4 \\ 3 & 4 & 3 & 4 & 4 & 3 & 0 & 3 \\ 4 & 3 & 4 & 3 & 3 & 4 & 3 & 0 \end{matrix}.$$

In addition, after the block code set with K=3 and L=6 is obtained as described above, one bit may be superposed after each code word to form a block code set with K=3 and L=7. A specific superposition method is similar to the foregoing method for superposing one bit when K=2. Herein, for avoiding repetition, a detailed description of the superposition method is omitted. For example, a one-bit superposition code block may be {0, 1, 0, 1, 1, 0, 1, and 0} in sequence. Then the generated block code set with K=3 and L=7 is {0001110, 0010011, 0100000, 0111101, 1001001, 1010100, 1100111, 1111010}, and a code distance matrix of the block code set is as follows:

$$\begin{matrix} 0 & 4 & 4 & 4 & 4 & 4 & 4 & 4 \\ 4 & 0 & 4 & 4 & 4 & 4 & 4 & 4 \\ 4 & 4 & 0 & 4 & 4 & 4 & 4 & 4 \\ 4 & 4 & 4 & 0 & 4 & 4 & 4 & 4 \\ 4 & 4 & 4 & 4 & 0 & 4 & 4 & 4 \\ 4 & 4 & 4 & 4 & 4 & 0 & 4 & 4 \\ 4 & 4 & 4 & 4 & 4 & 4 & 0 & 4 \\ 4 & 4 & 4 & 4 & 4 & 4 & 4 & 0 \end{matrix}.$$

In addition, after the block code set with K=3 and L=6 is obtained as described above, two bits may be superposed after each code word to form a block code set with K=3 and L=8. A specific superposition method is similar to the foregoing method for superposing a three-bit superposition code word after an initial code word when K=3 and L=6. Herein, for avoiding repetition, a detailed description of the superposition method is omitted. For example, a one-bit superposition code block may be {00, 01, 10, 11, 00, 01, 10, and 11} in sequence. A method for superposing another code block on the initial code block to generate a perfect code block with a new length is the same as that described above. For example, for the foregoing obtained perfect code block {000111, 001001, 010000, 011110, 100100, 101010, 110011, and 111101} in which n=6, a one-bit superposition code block may be {0, 1, 0, 1, 1, 0, 1, and 0}. Then the generated block code set with K=3 and L=8 is {00011100, 00100111, 01000001, 01111010, 10010010, 10101001, 11001111, 11110100}, and a code distance matrix of the block code set is as follows:

$$\begin{matrix} 0 & 5 & 5 & 4 & 4 & 5 & 5 & 4 \\ 5 & 0 & 4 & 5 & 5 & 4 & 4 & 5 \\ 5 & 4 & 0 & 5 & 5 & 4 & 4 & 5 \\ 4 & 5 & 5 & 0 & 4 & 5 & 5 & 4 \\ 4 & 5 & 5 & 4 & 0 & 5 & 5 & 4 \\ 5 & 4 & 4 & 5 & 5 & 0 & 4 & 5 \\ 5 & 4 & 4 & 5 & 5 & 4 & 0 & 5 \\ 4 & 5 & 5 & 4 & 4 & 5 & 5 & 0 \end{matrix}$$

Block code sets in which K=3 and L=6, 7, and 8 are obtained according to the foregoing analysis. Because code distances between code words in the block code set in which L=7 are all equal, all block code sets with lengths L=7p−1, 7p, and 7p+1 may be obtained, where p is an integer that is greater than or equal to 1.

Specifically, when p>1, the initial code block is formed by p−1 block code sets in which L=7 (code distances between code words are equal), and the superposition code block is formed by block code sets in which L=6, 7, and 8 (code distances between code words are equal or there is a difference of 1).

For a new code block formed by superposition of O code blocks (that is, a code word arranged in the $N^{th}$ position in the second code block is added after a code word arranged in the $N^{th}$ position in the first code block, and afterward, a code word in a corresponding position in each code block is added after a code word in a corresponding position in a formed code block in sequence until a last code block), a code distance matrix corresponding to the new code block is equal to a sum of code distance matrices corresponding to the O code blocks. This is because each code distance element in the code distance matrix of the new code block is equal to a sum of all corresponding code distance elements in original O code distance matrices.

Therefore, for a code block formed by (p−1) block code sets in which L=7, a difference between non-zero elements of a code distance matrix of the code block is ±1 or 0.

The following describes a process of generating a block code set when K≥4.

Optionally, when K≥4, the generating an initial code block according to the original code length K, where the initial code block includes $2^K$ initial code words, includes:

determining a sub block code set, where the sub block code set includes $2^{K-1}$ sub block code words, a quantity of bits included in each sub block code word is $L_0$, the sub block code set is generated according to a first initial code block and a first superposition code block, the first initial code block includes $2^{K-1}$ different first initial code words, each first initial code word includes K−1 bits, the first superposition code block is determined according to the quantity $L_0$ of bits included in the sub block code word and an arrangement order of the $2^{K-1}$ first initial code words in the first initial code block, the superposition code block includes $2^{K-1}$ superposition code words, each superposition code word includes $L_0$−K+1 bits, and in the sub block code set, code distances between code words are all s, where $L_0$<L;

superposing four such sub block code sets to generate an intermediate block code set, where the intermediate block code set includes $2^K$ intermediate block code words, and intermediate block code words arranged in the $z^{th}$ and $(z+2^{K-1})^{th}$ positions in the intermediate block code set are formed by superposition of sub block code words arranged in the $z^{th}$ positions in two such sub block code sets; and interchanging an intermediate block code word arranged in the $v^{th}$ position with an intermediate block code word arranged in the $(2^{K-1}-v+1)^{th}$ position in the intermediate block code set, and interchanging an intermediate block code word arranged in the $(2^{K-1}+v)^{th}$ position with an intermediate block code word arranged in the $(2^K-v+1)^{th}$ position in the intermediate block code set to generate a sub initial code block, where the initial code block includes x such sub initial code blocks, v ∈ [1, $2^{K-2}$], and x≥1; and the generating a superposition code block according to the target code length and an arrangement order of the $2^K$ initial code words in the initial code block includes:

generating a superposition code block including y sub superposition code blocks, so that each sub superposition code block includes $2^K$ superposition code words with a code length $L_1$, where elements on an antidiagonal in a code distance matrix of each sub superposition code block are all q, and remaining non-zero elements are all p, where q>p>0, y≥1, and the following formulas are satisfied:

$x:y=(q-p):s$, and $x*L_0+y*L_1=L$.

Specifically, in a code block (equivalent to a block code set in this embodiment of the present invention, and hereinafter referred to as a code block for ease of understanding and description), if the $i^{th}$ code word and the $j^{th}$ code word are interchanged, compared with a code distance matrix of an original code block, in a code distance matrix of a newly generated code block, only the $i^{th}$ and $j^{th}$ rows and the $i^{th}$ and $j^{th}$ columns change, and remaining rows and columns do not change; in addition, numeric value arrangements except elements 0 in the $i^{th}$ row, $j^{th}$ row, $i^{th}$ column, and $j^{th}$ column in the new code distance matrix are respectively equal to numeric value arrangements except elements 0 in the $j^{th}$ row, $i^{th}$ row, $j^{th}$ column, and $i^{th}$ column in the original code distance matrix.

In addition, if an element of the new code distance matrix is indicated by b and a subscript, and an element of the original matrix is indicated by a and a subscript, assuming i<j, the following relational expressions are satisfied:

$b_{i1}=a_{j1}, \ldots, b_{i(i-1)}=a_{j(i-1)}, b_{ii}=0, b_{i(i+1)}=a_{ji}, \ldots, b_{ij}=a_{j(j-1)}, b_{i(j+1)}=a_{j(j+1)}, \ldots, b_{iN}=a_{jN};$ $b_{j1}=a_{i1}, \ldots, b_{j(i-1)}=a_{i(i-1)}, b_{ji}=a_{i(i+1)}, \ldots, b_{j(j-1)}=a_{ij}, b_{jj}=0, b_{j(j+1)}=a_{i(j+1)}, \ldots, b_{jN}=a_{iN}.$ This is because only the $i^{th}$ and $j^{th}$ code words are interchanged and remaining code words do not change. Therefore, remaining rows and columns of the code distance matrix do not change. In addition, a code distance between the $i^{th}$ code word and another code word in the new code block is equal to a code distance between the $j^{th}$ code word and another code word in the original code block, and a code distance between the $j^{th}$ code word and another code word in the new code block is equal to a code distance between the $i^{th}$ code word and another code word in the original code block. Therefore, numeric value arrangements except elements 0 in the $i^{th}$ row, $j^{th}$ row, $i^{th}$ column, and $j^{th}$ column in the new code word matrix are respectively equal to numeric value arrangements except elements 0 in the $j^{th}$ row, $i^{th}$ row, $j^{th}$ column, and $i^{th}$ column in the original code word matrix.

Therefore, when K≥4, based on the foregoing description, a code block (namely, the foregoing block code set) in which code distances between code words are the same or have a difference of ±1 may be generated. For ease of description, code blocks in which code distances between all different code words are all the same are referred to as "strictly perfect codes".

It is assumed that a strictly perfect code with a target code length $L_0$ and an original code length (K−1) is constructed. Assume that the strictly perfect code is a, and that a code distance matrix of the strictly perfect code is A.

A code block b may be constructed. The constructed code block b is formed by four code blocks a, that is, the code block b includes $2^K$ code words, where a code word arranged in the $N^{th}$ position in the first $2^{K-1}$ code words in the code block b is formed by superposing a code word arranged in the $N^{th}$ position in a code block a after a code word arranged in the $N^{th}$ position in another code block a, and the last $2^{K-1}$ code words in the code block b are replicated from the first $2^{K-1}$ code words in sequence.

A code distance matrix of the generated code block b as described above may be expressed as:

$$\begin{matrix} A & A \\ A & A \end{matrix}.$$

A matrix A has $2^{k-1}$ rows and $2^{k-1}$ columns. Elements on a main diagonal in the matrix A are all 0, and remaining elements are all equal and denoted as s.

Code words in the code block b are interchanged, so that elements 0 not on the main diagonal in the code distance matrix A are all interchanged to an antidiagonal. That is, the $i^{th}$ code word and the $(2^{k-1}i+1)^{th}$ code word in the code block b are interchanged, and the $(2^{k-1}+i)^{th}$ code word and the $(2^k-i+1)^{th}$ code word in the code block b are interchanged, where i=1, 2, . . . and $2^{k-2}$.

Therefore, elements on the main diagonal and antidiagonal in the code distance matrix obtained after the foregoing transformation are 0, and remaining non-zero elements are all equal and equal to non-zero elements in the matrix A. A code block obtained after the foregoing transformation is denoted as a code block d, where a code distance matrix of the code block d is D.

It is assumed that a superposition code block is formed by y code blocks f, where a code block f includes $2^k$ code words, and a code length of each code word is $L_1$. In addition, elements on an antidiagonal in a code distance matrix F corresponding to the code block f are all q, and remaining non-zero elements (namely, elements not on a main diagonal) are all p, where q>p>0.

Assume that an initial code block is formed by x code blocks d, and that the superposition code block is formed by y code blocks f. Then, when x, s, y, p, q, $L_0$, $L_1$, and L satisfy the following relational expressions, a block code set can be obtained:

$x:y=(q-p):s$, and $x*L_0+y*L_1=L$.

In addition, on a basis of the foregoing strictly perfect code, a one-bit code block may be further superposed by using the strictly perfect code as an initial code block, where quantities of 0s and 1s are equal. In this way, a perfect code with a new code length may be formed.

It should be noted that, as regards existence of a strictly perfect code with an original code length K−1, it is known that a series of strictly perfect codes exist when K=2 and K=3 in the foregoing embodiment. Therefore, when K is greater, a strictly perfect code can also be found. For example, a strictly perfect code with K=4 may be obtained based on a strictly perfect code with K=3, a strictly perfect code with K=5 may be obtained based on a strictly perfect code with K=4, and so on.

In addition, for the foregoing superposition code block f, each code word of the superposition code block f needs to satisfy the following constraint:

The $c^{th}$ bit of the $i^{th}$ code word must be different from the $c^{th}$ bit of the $(2_k-i+)^{th}$ code word, that is, if one is 1, the other must be 0, or vice versa. There are $2^{\wedge}2^{k-1}$ ("^" represents a power) bit combinations that satisfy the constraint. In a code distance matrix of a code block formed by a combination of all bit arrangements (bit column vectors) that satisfy the constraint in any sequence, all elements on an antidiagonal are necessarily $2^{\wedge}2^{k-1}$, and remaining non-zero elements are $2^{\wedge}(2^{k-1}-1)$, that is, $p=2^{\wedge}(2^{k-1}-1)$, and $q=2^{\wedge}2^{k-1}$. A strictly perfect code with k information bits may be constructed according to the foregoing method.

In this embodiment of the present invention, the superposition code block f may also be another code block that satisfies a condition in the prior art. An example is to extend a Hamming code, that is, an odd parity bit or an even parity bit is added to each Hamming code word. A code length of the Hamming code (corresponding to a target code length in the present invention) is $(2^m-1)$, and there are $(2^m-1-m)$ information bits (corresponding to an original code length in the present invention), where m≥3 and m is an integer. In this way, in a code distance matrix of the extended Hamming code, except that non-zero elements on an antidiagonal are $2^m$, all non-zero elements are 4, that is, p=4, and q=$2^m$.

Therefore, a block code set with a target code length L (L≥3) and an original code length K (L>K≥2) may be determined according to the foregoing method.

Optionally, after each block code word in the block code set is generated, the method further includes:

interchanging the $a^{th}$ bit with the $b^{th}$ bit of each block code word in the block code set.

Specifically, for example, a block code set obtained when K=2 and L=4 is {0001, 0100, 1010, 1111}.

If the second bit and the third bit of each code word are interchanged, an obtained block code set is {0001, 0010, 1100, 1111}, and code distances between code words are still the same or have a difference of ±1.

Optionally, after each block code word in the block code set is generated, the method further includes:

interchanging the $c^{th}$ code word with the $d^{th}$ code word in the block code set.

Specifically, for example, a block code set obtained when K=2 and L=4 is {0001, 0100, 1010, 1111}.

If the first code word and the second code word in the block code set are interchanged, an obtained block code set is {0100, 0001, 1010, 1111}, and code distances between code words are still the same or have a difference of ±1.

In addition, code words and bits may be interchanged simultaneously. For example, the block code set obtained when K=2 and L=4 is {0001, 0100, 1010, 1111}.

If the second bit and the third bit of each code word are interchanged, and the first code word and the second code word in the block code set are interchanged, an obtained block code set is {0001, 0100, 1010, 1111}, and code distances between code words are still the same or have a difference of ±1.

Therefore, if different bits in a block code set are carried (or transmitted in different timeslots) by different frequency components or subcarriers, in a channel with high frequency selectivity (or high time selectivity), performance of block code sets with different bit orders may vary. If differences between code words in adjacent frequency components or between some bits carried by subcarriers are distributed as evenly as possible, relatively good performance can be achieved. For example, for the foregoing obtained two block code sets {0001, 0100, 1010, 1111} and {0001, 0010, 1100, 1111}, it is assumed that each block is carried by four subcarriers. Differences between the first two bits of the first code word and the remaining code words in a first code block are 1, 1, and 2 respectively, while differences between the first two bits of the first code word and the remaining code words in a second code block are 0, 2, and 2 respectively, and differences between remaining code words are also similar. Therefore, it can be seen that differences between the first two bits of the code words in the first code block are distributed more evenly, which can achieve a good diversity effect.

As described above, after the block code set is obtained, in step S350, the transmit end may perform coding processing on the original code word according to the block code set, so as to determine, from the block code words in the block code set, the target block code word corresponding to the original code word. In this embodiment of the present invention, two coding methods may be provided:

Method a

A mapping method is used. That is, a mapping entry may be created between the transmit end and the receive end, where the mapping entry records a mapping relationship between a possible original code word and each block code word in the block code set.

Herein, the possible original code word is determined according to a length of the original code word. For example, if a length of an original code word is K, there are $2^K$ possible original code words in total, same as block code words in the block code set in quantity.

For example, when K=2 and L=4, a mapping entry shown in the following Table 1 may be created.

TABLE 1

| Original code word | Block code word |
|---|---|
| 00 | 0001 |
| 01 | 0100 |
| 10 | 1010 |
| 11 | 1111 |

Therefore, a coder of the transmit end may search a stored mapping entry for a corresponding block code word according to an input original code word (or an information bit sequence).

Similarly, the receive end acquires, through demodulation, a block code word from data received from the transmit end, and searches a stored mapping entry for the corresponding original code word, thereby completing decoding.

It should be noted that, in this embodiment of the present invention, affected by quality of a communication channel, a block code word (hereinafter denoted as a block code word A for ease of distinguishing) acquired by the receive end from the data coming from the transmit end may be different from a block code word (hereinafter denoted as a block code word B for ease of distinguishing) actually transmitted by the transmit end. In this case, the receive end may determine a code distance between the block code word A and each block code word in the block code set generated according to the manner in S310 to S340. If a code distance between the block code word A and a unique block code word (hereinafter denoted as a block code word C for ease of distinguishing) in the block code set is a minimum code distance, the receive end may consider that the block code word C is the block code word B actually transmitted by the transmit end.

For example, when K=2 and L=4, the block code word B (0001) may become the block code word A (0011) if one bit is erroneous. A code distance between 0011 and 0001 (the block code word C) is 1, while a code distance between 0011 and 0100 is 3, a code distance between 0011 and 1010 is 2, and a code distance between 0011 and 1111 is 2, which are all greater than 1. Therefore, error correction performance can be improved.

In addition, to ensure correctness of data transmission, mapping entries stored by the receive end and the transmit end need to be consistent.

Method b

An algebraic method may be used to perform coding. For example, when K=2 and L=4, it is assumed that bits included in the original code word are x1 and x2, and that coded element bits are c1, c2, c3, and c4. Therefore, there are the following constraint relationships (where "+" indicates modulo-2 addition, that is, 1+1=0, and 0+1=1):

$c1=x1$, $c2=x2$, $c3=x1$, and $c4=x1+x2+1$.

Therefore, a target block code output by the coder may be expressed as c1 c2 c3 c4.

The foregoing block code words are non-linear. Therefore, the coder is non-linear (a constraint on an element with a non-information bit that is a fixed constant "1" herein). However, a linear block code word may also be constructed in the manner in S310 to S340. For example, still in the case in which K=2 and L=4, the initial code block is still 00, 01, 10, 11. Because a linear block code implicitly includes an inference that a code block includes all-zero code words, the first superposition code block must be 00, 11 having a code distance 2 from 00 can only be placed in the second or third position, and remaining positions are determined randomly. For example, a superposition code block is {00, 11, 01, 10}, and then a block code set of generated linear block codes is {0000, 0111, 1001, 1110}. Constraint relationships of the block codes are as follows:

$c1 = x1$, $c2 = x2$, $c3 = x2$, and $c4 = x1 + x2$.

Therefore, a target block code output by the coder may be expressed as c1 c2 c3 c4.

Another algebraic method of a coding theory may also be used to perform coding on the foregoing linear block code word. For example, a generator matrix may be constructed. A generator matrix G (two elements of each column in the generator matrix are respectively coefficients of x1 and x2 in several constraint equations) in this example is the following matrix:

$$\begin{pmatrix} 1 & 0 & 0 & 1 \\ 0 & 1 & 1 & 1 \end{pmatrix}.$$

During coding, a 2-bit original code word forms a row vector x=(x1, x2), and in this case, an output after coding may be expressed as c=x*G.

In addition, similar algebraic methods may also be used for coding of a non-linear block code word, but the coder is more complex. For example, still in the case in which K=2 and L=4, a block code set is {0001, 0100, 1010, 1111}; during coding, not only a generator matrix G is required, but also a superposition generator vector g is required. A 2-bit original code word forms a row vector x=(x1, x2), and therefore, an output after coding may be expressed as c=x*G+g. Herein, g=0001, and G is the following matrix:

$$\begin{pmatrix} 1 & 0 & 1 & 1 \\ 0 & 1 & 0 & 1 \end{pmatrix}.$$

At the receive end, for decoding of the block code word, the following methods may be illustrated:

If hard decision decoding is used, an algebraic decoding method may be used. If the block code word belongs to a linear block code, for example, the foregoing linear block codes 0000, 0111, 1001, and 1110, a parity-check matrix may be used to perform decoding. The parity-check matrix may be obtained from the generator matrix. Specifically, the generator matrix G is formed by combining a unit matrix and another matrix, that is, G=I|Q. The unit matrix is a matrix in which elements on a main diagonal are all 1 and remaining elements are all 0, where:

$$I = \begin{pmatrix} 1 & 0 \\ 0 & 1 \end{pmatrix}, \text{ and } Q = \begin{pmatrix} 0 & 1 \\ 1 & 1 \end{pmatrix}.$$

A generator matrix of a linear block code with a target code length L and an original code length K has K rows and L columns, a unit matrix I forming the generator matrix has K rows and K columns, and a Q matrix has K rows and (L−K) columns. The parity-check matrix is H=P|I, where $p = Q^T$, that is, the P matrix is a transposed matrix of the Q matrix, and the H matrix is formed by the P matrix and the unit matrix. Therefore, herein $$P = \begin{pmatrix} 0 & 1 \\ 1 & 1 \end{pmatrix},$$

and therefore, $$H = \begin{pmatrix} 0 & 1 & 1 & 0 \\ 1 & 1 & 0 & 1 \end{pmatrix}.$$

During decoding, a bit vector R after a hard decision is multiplied by a parity-check matrix to obtain an error vector E, namely, E=H*R. If the error vector is a zero vector, it is determined that no bit error exists. Otherwise, it is determined that a bit error exists, and a position of the bit error may be obtained according to a specific status of the error vector, and thereby error correction may be implemented. For example, herein if a transmit code word is 0111, and a receive code word after a hard decision is also 0111, R=0111, and E=R*$H^T$=00, where $H^T$ is a transposed matrix of the H matrix. Therefore, it is determined that no bit error exists. If a transmit code word is 0111, and a receive code word after a hard decision is 0101, E=10, and it may be determined that a bit error is in the third position. If a receive code word after a hard decision is 0011, E=11, and it may be determined that a bit error is in the second position. If a receive code word after a hard decision is 1111 or 0110, E=01. In this case, a bit error position cannot be determined, and it is only known that a bit error exists. Therefore, an error correction table may be shown in the following Table 2.

TABLE 2

| Error vector | Bit error position | Error correction operation |
| --- | --- | --- |
| 00 | No bit error | No processing |
| 01 | Not determined, the first position or the fourth position | No processing (or triggering error reporting) |
| 10 | Third position | Negation in the third position |
| 11 | Second position | Negation in the second position |

For a non-linear block code, a similar method may also be used. For example, for the non-linear block perfect codes 0001, 0100, 1010, and 1111 described above, their parity-check matrix may be generated by using a same method as linear coding, but same error correction can be performed only after a monitor vector is superposed on a result obtained by multiplying the parity-check matrix and a decision bit vector. The monitor vector is the last (L−K) bits of the generator vector, and herein the superposed monitor vector is 01. Certainly, the superposition operation may be reflected in adjustment of the error correction table, that is, the monitor vector may not be superposed, but a correspondence between the error vector and a bit error position is adjusted. For example, herein the error correction table may be shown in the following Table 3, and no monitor vector needs to be superposed additionally.

TABLE 3

| Error vector | Bit error position | Error correction operation |
| --- | --- | --- |
| 01 | No bit error | No processing |
| 00 | Not determined, the second position or the fourth position | No processing (or triggering error reporting) |

TABLE 3-continued

| Error vector | Bit error position | Error correction operation |
|---|---|---|
| 10 | First position | Negation in the first position |
| 11 | Third position | Negation in the third position |

Except the algebraic decoding method, regardless of a hard decision or a soft decision, generally, a method achieving best performance is a decoding method using a minimum mean square error criterion. That is, if an element vector after a decision is c={c1, c2, . . . , cn}, if the decision is a hard decision, each vector element is ±1 or 0, or otherwise is a number indicated by multiple bits. The minimum mean square error criterion is to obtain a transmit code word vector with a minimum mean square error (corresponding to a square root of a square sum of differences between the vector elements) between all possible transmit code word vectors and the decided element vectors, and decide that the obtained transmit code word vector is a real receive code word.

However, generally, the minimum mean square error criterion involves a large amount of computation and is not practicable. A practicable method is an equivalent correlation decoding method. Compared with the minimum mean square error method for obtaining a mean square error, this method is to obtain a correlation (namely, a sum of products of elements in corresponding positions), and select a code word with a maximum correlation value as an output of decoding. During a soft decision, because the transmit code word may be indicated by a bit sequence and does not involve an amplitude, the correlation operations may be simplified to become addition and subtraction operations without a multiplication operation. Therefore, complexity is reduced greatly, but performance remains unchanged.

However, correlation decoding still requires a large quantity of addition and subtraction operations. In the case of a great code length n and a large quantity of code words, complexity is still high, but further simplification may be performed. Using the block code set {0000, 0111, 1001, 1110} described above as an example, during a correlation operation, in the transmit code word, 0 is mapped to −1, and 1 is mapped to 1. Assuming that a column vector formed by decided receive elements is y={y1, y2, y3, y4}$^T$, and that a matrix formed by using each code word in the code block as a row is C, the correlation decoding method is to obtain a position of a maximum element in a column vector z=C*y, and thereby select a corresponding code word. It is easily known that, if the position of the maximum element is i, a position of a maximum element in C/m*y is also i, where m is a positive constant, and a position of a maximum element in (C+A)*y is also i. Herein A is a matrix, and each row of the matrix is formed by same vectors. The code word matrix C is transformed according to the two properties to obtain a transformation matrix D=(C+A)/m, where all rows of A are the same and each element of each row is a maximum value of an absolute value of each element of a corresponding column in C. In this way, all elements in (C+A) are greater than or equal to 0, and m is a common divisor of all the elements in (C+A). During binary coding, elements in the matrix D are changed to 0 or 1. Because operations corresponding to elements 0 in correlation operations may be omitted, an amount of computation may be reduced greatly. In addition, if 1 exists in two or more positions of two rows in the matrix D, the addition operation on the matrix D may be counted only once and recorded for use in computation of another row. For the example of the foregoing perfect code, a mapped code word matrix is:

$$C = \begin{matrix} -1 & -1 & -1 & -1 \\ -1 & 1 & 1 & 1 \\ 1 & -1 & -1 & 1 \\ 1 & 1 & 1 & -1 \end{matrix}.$$

Therefore, $$A = \begin{matrix} 1 & 1 & 1 & 1 \\ 1 & 1 & 1 & 1 \\ 1 & 1 & 1 & 1 \\ 1 & 1 & 1 & 1 \end{matrix}$$

and m=2 may be determined.
Further, $$(C+A)/m = \begin{matrix} 0 & 0 & 0 & 0 \\ 0 & 1 & 1 & 1 \\ 1 & 0 & 0 & 1 \\ 1 & 1 & 1 & 0 \end{matrix}$$

may be determined.

The addition operation needs to be performed (for five times) on only a position that includes a non-zero element. Compared with original 12 times, operations are reduced greatly. Further, because the second column and the third column of the second row and the fourth row are all 1, the addition operation may be performed only once (four times in total).

For further simplification, because a plurality of pairwise comparisons generally needs to be performed during a final comparison, determining, and decoding, but only two row vectors of D are actually required for computation in each comparison, every two row vectors of D form a new matrix represented by $D_{ij}$, where i<j, representing a matrix formed by row vectors of the $i^{th}$ row and the $j^{th}$ row. Assume $F_{ij}=D_{ij}+B$, where B is also a matrix formed by two same rows. According to the foregoing properties, a maximum value decision result is not changed. Herein there are as few non-zero elements in $F_{ij}$ as possible. That is, if elements of one column of two rows of $D_{ij}$ are the same, elements of the column in B may be negated values of the same elements, so that elements of the column corresponding to $F_{ij}$ become zero. In the foregoing example, $$D_{34} = \begin{matrix} 1 & 0 & 0 & 1 \\ 1 & 1 & 1 & 0 \end{matrix}$$

should become $$F_{34} = \begin{matrix} 0 & 0 & 0 & 1 \\ 0 & 1 & 1 & 0 \end{matrix}$$

according to the foregoing analysis.

After such transformation, the number of addition operation times is reduced by one again (only three times in total). In this case, a decoding operation becomes very simple.

A code distance is an important parameter for measuring a code word error correction capability. A code distance between two code words is a sum of differences between elements of the two code words, in corresponding positions. The code distance is also referred to as a "Hamming distance". A minimum code distance of a code block is a minimum value of code distances between any two code words. The minimum code distance needs to be maximized, so that the code block achieves better error correction performance.

After the target block code word corresponding to the original code word is determined as described above, in S360, the transmit end may transmit the target block code word to the receive end.

It should be noted that, "transmitting the target code word" in this embodiment of the present invention may include processing the target code word, such as rate matching processing, digital-to-analog conversion, modulation, up conversion, filtering, and power amplification, and transmitting, by using a radio resource, an analog signal generated through the foregoing processing. In addition, the processing illustrated above is for exemplary description only, and is not particularly limited in the present invention. In addition, the foregoing processing may be similar to the prior art. Herein, for avoiding repetition, a detailed description of the processing is omitted.

Signal modulation may be performed based on a feature of the foregoing block code set.

Specifically, during modulation (or joint modulation), to achieve optimal performance, a symbol distance (referred to as a Euclidean distance) after modulation needs to be maximized. For example, it may be assumed that, during modulation, an amplitude of an in-phase component (a component in an I-direction in FIG. 4) is different from an amplitude of a quadrature component (a component in a Q-direction in FIG. 4) (otherwise, the amplitudes are generally the same), and that a ratio thereof is a:b. It should be noted that, as shown in FIG. 4, in an actual application, distances between constellation points are indicated by $a^2$ and/or $b^2$.

Without loss of generality, modulation of a block code set (hereinafter referred to as a perfect code block for ease of understanding) generated when K=2 and L=4 is used for description. The perfect code block is {0001, 0100, 1010, 1111}.

Figure 4:
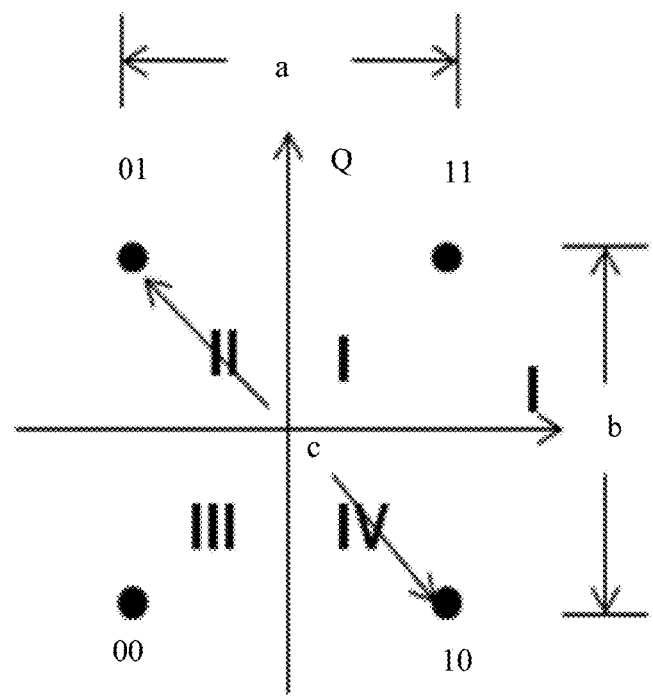
FIG. 4 is a schematic diagram of QPSK modulation used in an embodiment of the present invention.

FIG. 4 shows a schematic diagram of QPSK modulation. For example, if a target block code word obtained by coding the original code word according to the foregoing perfect code block is 0001, the modulated target block code word is formed by a point located in a third quadrant and a point located in a second quadrant in a constellation diagram shown in FIG. 4, where the two points are transmitted respectively at different times. For example, the point located in the third quadrant is first transmitted, and then the point located in the second quadrant is transmitted. Therefore, the receive end can demodulate, according to a transmission time of each point, the code word transmitted by the transmit end.

In addition, as shown in FIG. 4, if after coding, every two bits are mapped to a modulation symbol, and a quadrature phase shift keying (QPSK, Quadrature Phase Shift Keying) modulation mode is used, if Euclidean distances between constellation points shown in FIG. 4 are used to indicate code distances between code words in the foregoing perfect code block, the following matrix may be obtained:

$$\begin{matrix} 0 & 2b^2 & 2a^2+b^2 & 2a^2+b^2 \\ 2b^2 & 0 & 2a^2+b^2 & 2a^2+b^2 \\ 2a^2+b^2 & 2a^2+b^2 & 0 & 2b^2 \\ 2a^2+b^2 & 2a^2+b^2 & 2b^2 & 0 \end{matrix}.$$

When differences between all non-zero elements (that is, code distances between code words in the foregoing perfect code block) in the foregoing matrix are minimal (for example, the difference is 0), performance may be optimal. That is, in this embodiment of the present invention, when $2b^2=2a^2+b^2$, performance may be optimal. An obtained ratio of an I-channel modulation amplitude to a Q-channel modulation amplitude in this case is $a:b=1:\sqrt{2}$.

In addition, for a binary modulation mode such as binary phase shift keying (BPSK, Binary Phase Shift Keying), two quadrature components do not exist. For example, only in-phase components exist but no quadrature component exists. In this case, assume that modulation amplitudes of different bits are different. For example, for the block code set (hereinafter referred to as a perfect code block for ease of understanding) generated when K=2 and L=8, the perfect code block is {11010000, 10100101, 00001010, 01111111}. It is assumed that a sequence number starts from 1, and that a ratio of a modulation amplitude of a bit with an odd sequence number to a modulation amplitude of a bit with an even sequence number is a:b. In an actual application, distances between constellation points are indicated by $a^2$ and/or $b^2$. In this way, a code distance matrix indicated by Euclidean distances is as follows:

$$\begin{matrix} 0 & a^2+4b^2 & 3a^2+2b^2 & 4a^2+2b^2 \\ a^2+4b^2 & 0 & 4a^2+2b^2 & 3a^2+2b^2 \\ 3a^2+2b^2 & 4a^2+2b^2 & 0 & a^2+4b^2 \\ 4a^2+2b^2 & 3a^2+2b^2 & a^2+4b^2 & 0 \end{matrix}.$$

To keep a transmit power unchanged, the following must be satisfied: $a^2+b^2=K^2$ is a constant. To minimize element differences in the code distance matrix, a minimum mean square difference criterion may be used herein to minimize a square sum of differences between different elements. Three elements $a^2+4b^2=4K^2-3a^2$, $3a^2+2b^2=2K^2+a^2$, and $4a^2+2b^2=2K^2+2a^2$ are found. Assume $x=(a/K)^2$, which is equivalent to obtaining a minimum difference x between 4−3x, 2+x, and 2+2x. That is, according to the minimum mean square difference criterion, x that minimizes the following polynomial is obtained, where 0≤x≤1:

$$[(4-3x)-(2+x)]^2+[(4-3x)-(2+2x)]^2+[(2+x)-(2+2x)]^2.$$

As described above, x=3/7 is obtained. Therefore, $a^2=9/49K^2$ is obtained, and therefore, $b^2=40/49K^2$. Therefore, the obtained ratio of a modulation amplitude of a bit with an odd sequence number to a modulation amplitude of a bit with an even sequence number is $a:b=3:2\sqrt{10}$.

Another example is higher-order modulation with more information bits. Using modulation of a block code set (hereinafter referred to as a perfect code block for ease of understanding) generated when K=3 and L=6 as an example, the perfect code block is {000111, 001001, 010000, 011110, 100100, 101010, 110011, 111101}.

Figure 5:
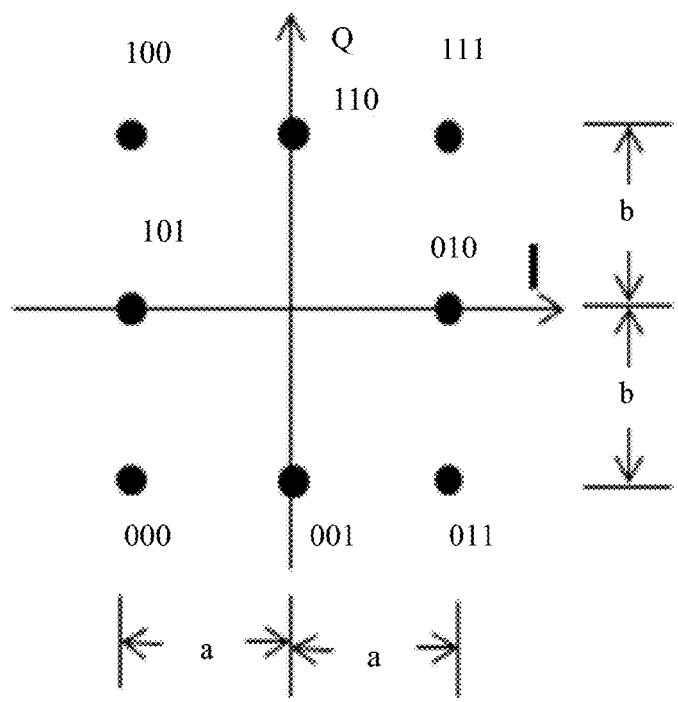
FIG. 5 is a schematic diagram of 8QAM modulation used in an embodiment of the present invention.

FIG. 5 shows a schematic diagram of 8 quadrature amplitude modulation (8QAM, 8 Quadrature Amplitude Modulation). As shown in FIG. 5, the 8 quadrature amplitude modulation is performed on coded bits. Likewise, assume that a ratio of an I-channel modulation amplitude to a Q-channel modulation amplitude is a:b. In an actual application, distances between constellation points are indicated by $a^2$ and/or $b^2$. Therefore, a code distance matrix indicated by Euclidean distances is as follows:

$$\begin{matrix} 0 & 2a^2+4b^2 & 8a^2+4b^2 & 5a^2 & 4a^2+4b^2 & 4a^2+b^2 & a^2+8b^2 & 8a^2+5b^2 \\ 2a^2+4b^2 & 0 & 2a^2+b^2 & a^2+4b^2 & 2a^2+8b^2 & 2a^2+2b^2 & a^2+4b^2 & 2a^2+5b^2 \\ 8a^2+4b^2 & 2a^2+b^2 & 0 & a^2+5b^2 & 4a^2+5b^2 & 8a^2+b^2 & 5a^2+b^2 & 2b^2 \\ 5a^2 & a^2+4b^2 & a^2+5b^2 & 0 & 4a^2+5b^2 & 5a^2+2b^2 & 2a^2+8b^2 & a^2+5b^2 \\ 4a^2+4b^2 & 2a^2+8b^2 & 4a^2+5b^2 & 4a^2+5b^2 & 0 & 4a^2+2b^2 & 5a^2+4b^2 & 4a^2+b^2 \\ 4a^2+b^2 & 2a^2+2b^2 & 8a^2+b^2 & 5a^2+2b^2 & 4a^2+2b^2 & 0 & a^2+2b^2 & 8a^2+b^2 \\ a^2+8b^2 & a^2+4b^2 & 5a^2+b^2 & 2a^2+8b^2 & 5a^2+4b^2 & a^2+2b^2 & 0 & 5a^2+b^2 \\ 8a^2+5b^2 & 2a^2+5b^2 & 2b^2 & a^2+5b^2 & 4a^2+b^2 & 8a^2+b^2 & 5a^2+b^2 & 0 \end{matrix}$$

To keep a transmit power unchanged, the following must be satisfied: $2a^2+b^2=K^2$ is a constant (an average power of all symbols in a modulation constellation diagram is a constant). To minimize element differences in a Euclidean distance matrix, a minimum mean square difference criterion may be used herein to minimize a square sum of differences between different elements. There are 28 elements in total (each appears twice). Assuming $x=(a/K)^2$, this is equivalent to obtaining x that minimizes differences between {4−6x, 4, 5x, 4−4x, 1+2x, 8−15x, 5−2x}; {1, 4−7x, 8−14x, 2−2x, 4−7x, 5−8x, 5−9$x$}; {5−6x, 1+6x, 1+3x, 2−4x, 5−6x, 2+x, 8−14$x$}; {5−9x, 2, 4+3x, 1+2x, 2−3x, 1+6x, 1+3x}. According to the minimum mean square difference criterion, x that minimizes a square sum of differences between every two of these numbers is obtained, where $0 \leq x \leq 1/2$. In this way, x=0.378 is obtained, and therefore, $a^2=0.378K^2$ is obtained, and $b^2=0.244K^2$. Therefore, the obtained ratio of a modulation amplitude of a bit with an odd sequence number to a modulation amplitude of a bit with an even sequence number is a:b=1.24.

As described above, a ratio of modulation amplitudes that minimizes a Euclidean distance difference obtained after different code words are modulated is determined. This ratio is a ratio of an amplitude of an in-phase component to an amplitude of a quadrature component, or a ratio of modulation amplitudes in different positions, for example, a ratio of an amplitude of a modulation symbol with an odd sequence number to an amplitude of a modulation symbol with an even sequence number; or there are r amplitudes, and amplitudes of the $(n*r+i)^{th}$ modulation symbols are all Ai, where n is an integer that is greater than or equal to 0, and i is an integer from 1 to r, and a ratio A1:A2: . . . :Ar is obtained. A "Euclidean distance" is a distance between modulation symbols, and may be reflected from the constellation diagram. A minimum difference means that all Euclidean distances are equal if the Euclidean distances may be made equal. Otherwise, a minimum difference criterion, for example, a minimum mean square difference criterion (namely, a square sum of differences between all Euclidean distances), may be used. For another example, a sum of absolute values of differences between all Euclidean distances is assumed to be minimal.

In a channel with high frequency selectivity, joint modulation may be destructed by frequency selectivity, and performance may deteriorate. In this case, amplitude compensation may be performed at the transmit end according to a frequency fading status.

For example, the transmit end may estimate the channel frequency selectivity according to channel reciprocity by using data previously received from the peer end. This is applicable to a case in which an interval from an estimation value generation time to a transmission time is far shorter than a channel coherence time. Therefore, the receive end may transmit a sounding reference signal (for example, an empty data packet that does not carry a data payload) to the transmit end, for estimating the frequency selectivity.

For another example, the frequency selectivity is estimated at the receive end, and then data is transmitted to the transmit end, for compensating for subcarrier fading.

Many conventional methods are available for estimating the channel frequency selectivity. Generally, a channel estimation method is used to estimate a fading ratio of different frequency components or subcarriers, and then, before signal transmission, compensation is made for amplitudes of different frequency components or subcarriers according to the fading ratio. For example, there are n frequency components or subcarriers, and a fading ratio thereof is A1:A2: . . . :An. Therefore, an amplitude compensation ratio thereof is assumed to be 1/A1:1/A2: . . . :1/An, and the power remains unchanged. The joint modulation operation described above is performed after compensation, or the compensation operation is performed after joint modulation. That is, in this case, the amplitude of each modulation symbol is jointly determined by the amplitude compensation ratio worked out according to the estimation of the channel frequency selectivity and the amplitude ratio determined by joint modulation.

To ensure performance of error correction coding in different channel scenarios, generally, an interleaving and mapping method also needs to be considered. That is, coded bits are not transmitted sequentially, but are transmitted according to a new order after particular interleaving or mapping. This considers continuous-time bit errors caused by channel fading or burst interference. If the coded bits are not scattered, continuous errors easily exceed the error correction capability, and decoding cannot be performed correctly. For the foregoing coding scheme, several interleaving and mapping methods are provided herein.

For example, in method 1, maximum diversity interleaving and mapping may be considered. A fixed interval N needs to be between coded bits in a same block and bits before and after the coded bits. In this way, for a block code set in which an original code length is K and a target code length is L, an order of the $j^{th}$ bit in the $(m*N+i)^{th}$ block after interleaving and mapping is the $\{m \cdot N \cdot L+(j-1) \cdot N+i\}^{th}$ bit (the sequence number starts from 1). Herein, m is an integer that is greater than or equal to 0, i ∈ [1, N], and j ∈ [1, L].

Without loss of generality, interleaving and mapping of a block code set (hereinafter referred to as a perfect code block for ease of understanding) generated when K=2 and L=4 is used as an example. The perfect code block is {0001, 0100, 1010, 1111}. Assuming that before interleaving and mapping, an output after coding is 0001, 1010, 1111, and 0100, and that a fixed interleaving interval is 4, an output after interleaving and mapping in this method is 0110, 0011, 0110, and 1010.

For another example, in method 2, interleaving and mapping for mapping bits to a same symbol are considered. The method is similar to method 1, but every M contiguous bits in a same block need to be mapped to a same modulation symbol, and there is a fixed interval N between coded bits in the same block and bits of modulation symbols before and after the coded bits. This manner is advantageous for improving performance of high-order modulation in a non-fading channel. For a block code set in which a block code length is L and an original code length is N, where L % M=0 and N % M=0, that is, L and N can both be divided exactly by M, an order of the $(M \cdot j+q)^{th}$ bit in the $(m \cdot N/M+i)^{th}$ block after interleaving and mapping is the $\{m \cdot N \cdot L/M+j \cdot N+(i-1) \cdot M+q\}^{th}$ bit (the sequence starts from 1). Herein, m is an integer that is greater than or equal to 0, i ∈ [1, N/M], j ∈ [0, L/M−1], and q ∈ [1, M].

Without loss of generality, interleaving and mapping of a block code set (hereinafter referred to as a perfect code block for ease of understanding) generated when K=2 and L=4 is used as an example. The perfect code block is {0001, 0100, 1010, 1111}. The fixed interleaving interval is 8, and after coding, every two contiguous bits must be mapped together. An output after interleaving and mapping in this method is 0001, 1011, 0100, and 1011.

Because joint modulation is not considered in method 1, all bits in a same block code word may be in a same modulation component. Therefore, based on the method 1, for another example, in a method 3, bits may be further interchanged, so that all bits belonging to a same block can be evenly distributed in all modulation components. That is, the bits interleaved and mapped according to method 1 are interleaved and mapped once again. Assuming that there are T modulation components, there are T mapping modes, where the $h^{th}$ mode is to respectively map bits $b_1, b_2, \ldots,$ and $b_T$ to positions of bits $w_{h1}, w_{h2}, \ldots,$ and $w_{hT}$, and the following needs to be satisfied: when u≠v, $w_{ut} \neq w_{vt}$ is true for all of t=1, 2, . . . , and T, that is, in each mapping mode, a bit is mapped to a different position. Many methods satisfy this mapping mode. A simplest one is cyclic shifting. That is, a first mapping mode maps bits $b_1, b_2, \ldots,$ and $b_T$ respectively to positions 1, 2, . . . , and T, a second mapping mode maps the bits respectively to positions 2, 3, . . . , T, and 1, a third mapping mode maps the bits respectively to positions 3, 4, . . . , T, 1, and 2, . . . , and the $T^{th}$ mapping mode maps the bits respectively to positions T, 1, 2, . . . , and T−1. Therefore, still based on the foregoing block code set {0001, 1010, 1111, 0100}, if T=2, after mapping by using a mapping method, the result is changed to {0110, 0011, 0110, 0101}.

In addition to the foregoing three methods, other methods may also achieve same performance. These methods may be considered as performing interleaving and mapping according to one of the foregoing methods after bits in a same error correction block code are interchanged according to a particular rule.

For the specific methods, there may be specific implementation manners. For example, method 1 is block interleaving. A conventional method of writing per row and reading per column may be used, where a storage area with N rows and L columns is used, every N block bits are one chunk, each block is sequentially written into each row, a perfect code of each block just fills up the L columns in each row, and after the storage area is filled up, bits are read from each column sequentially, so as to complete the operations of interleaving and mapping. Method 2 is extended block interleaving, where a size of a storage area is N/M rows and L columns, every N/M block bits are one chunk, the operation of writing in the storage area is the same as that of method 1, and during reading, bits in M columns are read sequentially, that is, bits in every M columns are read sequentially according to rows. Method 3 is equivalent to adding a mapping unit to a modular structure in method 1.

De-interleaving at the receive end is an operation reverse to that at the transmit end.

For example, in method 1, if the transmit end writes each chunk per row and reads each chunk per column, the receive end may write each chunk per column and read each chunk per row, where quantities of rows and columns in each chunk are the same as those at the transmit end, that is, LN receive bits are one chunk, and the $[(j−1) \cdot N+i]^{th}$ bit is mapped to the $j^{th}$ bit in the $i^{th}$ block, where i is an integer from 1 to N, and j is an integer from 1 to n.

In method 2, the receive end writes each chunk according to a plurality of columns, namely, every M columns, then writes each chunk according to rows sequentially, and reads each chunk according to rows, where quantities of rows and columns in each chunk are the same as those at the transmit end, that is, nN/M receive bits are one chunk, and the $[j \cdot N+(i−1) \cdot M+q]^{th}$ bit (the sequence starts from 1) is mapped to the $(M \cdot j+q)^{th}$ bit in the $i^{th}$ block, where i is an integer from 1 to N/M, j is an integer from 0 to n/M−1, and q is an integer from 1 to M.

In method 3, the receive end first performs reverse mapping according to the T mapping mode, and then uses a method same as method 1 to perform reverse mapping.

In addition, different interleaving and mapping methods are applicable to different channel environments, and in particular, are related to a frequency selectivity feature of a channel. Therefore, different bit mapping modes may be used according to frequency selectivity of a channel. The transmit end adds indication information to a frame header at a physical layer to indicate an interleaving and mapping method, and the receive end may use a correct method according to the indication to perform de-interleaving.

The following describes a manner of link adaptation in the data transmission method according to this embodiment of the present invention. A process of link adaptation may be executed by the transmitter 206 in the wireless communications device 202.

Optionally, the generating a superposition code block according to the target code length and an arrangement order of the $2^K$ initial code words in the initial code block includes:

generating the superposition code block according to the target code length and the arrangement order of the $2^K$ initial code words in the initial code block, where the superposition code block includes t sub superposition code blocks, and each sub superposition code block includes $2^K$ sub superposition code words, where for a target local block code set that is formed by the initial code block and $t_0$ sub superposition code blocks and includes $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, where the $t_0$ sub superposition code blocks include a sub superposition code block arranged in the first position to a sub superposition code block arranged in the $t_0^{th}$ position in the t sub superposition code blocks, $t \geq 1$, and $t_0 \in [1, t]$.

Specifically, as described above, in this embodiment of the present invention, the superposition code block may include a plurality of sub superposition code blocks. For example, when K=2 and L=9, the superposition code block may include four sub superposition code blocks, where each superposition code word in the first three sub superposition code blocks includes two bits, and each superposition code word in a last sub superposition code block includes one bit. The following Table 4 shows composition of the block code set when K=2 and L=9.

TABLE 4

| Initial code block | Superposition code block | | | |
|---|---|---|---|---|
| | Sub superposition code block A | Sub superposition code block B | Sub superposition code block C | Sub superposition code block D |
| 11 | 01 | 00 | 00 | 1 |
| 10 | 10 | 01 | 01 | 0 |
| 00 | 00 | 10 | 10 | 0 |
| 01 | 11 | 11 | 11 | 1 |

In addition, in this embodiment of the present invention, the foregoing initial code block and different sub superposition code blocks may form various block code sets with different target code lengths, and in each block code set, code distances between code words are equal or have a difference of ±1.

For example, the initial code block and the sub superposition code block A in Table 4 may form a block code set with K=2 and L=4, where a code distance between code words is 2 or 3.

For another example, the initial code block, the sub superposition code block A, and the sub superposition code block B in Table 4 may form a block code set with K=2 and L=6, where a code distance between code words is 4.

For another example, the initial code block, the sub superposition code block A, the sub superposition code block B, and the sub superposition code block C in Table 4 may form a block code set with K=2 and L=8, where a code distance between code words is 5 or 6.

As described above, in the block code sets formed according to the method in this embodiment of the present invention, a longer block code set may be generated based on superposition of shorter block code sets. Therefore, this feature can be used to perform the foregoing link adaptation, and specifically, hybrid automatic repeat request (HARQ, Hybrid Automatic Repeat Request) processing.

Optionally, when $t \geq 2$, the target block code word includes a target initial code word that is in the initial code block and corresponding to the original code word, and a target sub superposition code word that is in each sub superposition code block and corresponding to the original code word; and the transmitting the target block code word to the receive end includes:

transmitting a first sub target block code word at a first time, where the first sub target block code word includes the target initial code word and target sub superposition code words in a sub superposition code block arranged in the first position to a sub superposition code block arranged in the $c_1^{th}$ position in the sub superposition code blocks, where $c_1 \geq 1$; and transmitting a second sub target block code word at a second time, where the second sub target block code word includes target sub superposition code words in a sub superposition code block arranged in the $c_2^{th}$ position to a sub superposition code block arranged in the $c_3^{th}$ position in the sub superposition code blocks, where the second time is later than the first time, $c_2=c_1+1$, and $c_3 \leq t$.

Specifically, HARQ is a fast link adaptation method. First, data is transmitted at a high rate. If the transmission fails, that is, if no correct acknowledgement ACK is received, or if a negative acknowledgement NACK is received, the data is retransmitted. However, different from an ordinary automatic repeat request, combination processing is performed on the retransmitted data and the already received data at the receive end. This undoubtedly increases a signal-to-noise ratio greatly. However, the data rate during retransmission is actually reduced. Therefore, under relatively good channel conditions, data transmission is implemented at a relatively high rate (in this case, a correct acknowledgement can be received), and under relatively bad channel conditions, data transmission is implemented at a relatively low rate (retransmission and combination are required). Ordinary retransmission and combination only increase energy of a receive signal, which is merely equivalent to increasing a signal-to-noise ratio of information bits. In retransmission and combination combined with error correction coding, different coding modes may be used in each transmission. For example, parity bits in different positions may be carried, or code words in different puncture positions are transmitted. In this way, additional error correction coding gains can also be obtained.

The foregoing block code set may be used in the HARQ process combined with error correction coding. For example, a block code word (hereinafter denoted as a block code word M for ease of understanding and distinguishing) of a code length corresponding to an original code word is transmitted at the first time, and a block code word (hereinafter denoted as a block code word N for ease of understanding and distinguishing) of a code length corresponding to an original code word is transmitted at the $i^{th}$ time, where the code length of the block code word N (namely, a target code length) is greater than the code length of the block code word M, and the block code word N may be generated by superposing one or more sub superposition code blocks on the block code word M. In this way, during transmission at the $i^{th}$ time, only the superposed code blocks need to be transmitted.

The receive end combines the code words received at each time, and performs decoding. For example, in the case of information bits with k=2, the following Table 5 shows a transmission policy determined on a basis of the structure of each block code set shown in Table 4.

TABLE 5

| Transmitted at the first time | | Transmitted at the second time | Transmitted at the third time | Transmitted at the fourth time |
|---|---|---|---|---|
| Initial code block | Sub superposition code block A | Sub superposition code block B | Sub superposition code block C | Sub superposition code block D |
| 11 | 01 | 00 | 00 | 1 |
| 10 | 10 | 01 | 01 | 0 |
| 00 | 00 | 10 | 10 | 0 |
| 01 | 11 | 11 | 11 | 1 |

Herein, it should be noted that the code word transmitted at each time can be decoded independently, or possibly cannot be decoded independently. As shown in the foregoing example, for the superposition code words transmitted at the second time and the third time, transmit bits can be obtained independently, but independent reception processing cannot be performed on the superposition code word transmitted at the fourth time. According to the foregoing analysis, for any k≥2, there are a series of such block code sets. In such block code sets, code distances between code words are the same, and block codes with infinite lengths may be included in the block code sets. For example, when k=2, the target code length L may be any integer that is equal to 3 or greater than 3; when k=3, the target code length L may be a value of 7p-1, 7p, or 7p+1, where p is an integer that is greater than or equal to 1.

It should be understood that the foregoing illustrated transmission policy is for exemplary description only, and that the present invention is not limited thereto. For example, the quantity and length of code words transmitted at each time may also be determined according to a decoding decision made by the receive end for the received code words, that is, optionally, before the transmitting a second sub target block code word at a second time, the method further includes:

receiving code distance information transmitted by the receive end, where the code distance information is determined by the receive end according to a target average value, a target code distance is an average value of minimum code distances between at least one receive code word received by the receive end and block code words in a first block code set, the at least one receive code word includes a first receive code word corresponding to the first sub target block code word, and a quantity of bits included in each block code word in the first block code set is the same as a quantity of bits included in each receive code word; and determining the target code distance according to target code distance information; and the transmitting a second sub target block code word at a second time includes:

determining the second sub target block code word according to the target code distance, so that in a first target local block code set that is formed by the initial code block and $c_3$ sub superposition code blocks and includes $2^K$ first target local block code words, a minimum value of code distances between the first target local block code words is greater than the target code distance; and transmitting the second sub target block code word at the second time.

Specifically, an error correction block code may also be checked for errors, that is, error severity may be determined according to values of code distances. When the receive end cannot perform decoding correctly, an average value e of minimum code distances between at least one received code word and all code words in the block code set may be calculated, and error severity may be determined. In addition, this information is added to a negative acknowledgement NACK packet and returned to the transmit end. For example, in a case in which a data packet includes Z code words (each code word is a code word coded according to the block code set determined above), first, a minimum code distance $e_1$ between the first code word and each block code word in the block code set is determined, then a minimum code distance $e_2$ between the second code word and each block code word in the block code set is determined, and so on, until a minimum code distance $e_z$ between a last code word and each block code word in the block code set is determined. Afterward, an average value of the minimum code distances is determined, that is, $e=(e_1+e_2+ \ldots e_z)/Z$.

It should be noted that, in this embodiment of the present invention, the data packet may include a plurality of code words, or may include only one code word. For example, only the target block code word determined above is included. In this case, the average value e of the minimum code distances is a minimum code distance between the target block code word and each block code word in the block code set.

The transmit end determines, according to the error severity, a block length of a code word to be transmitted at a next time. For example, if a minimum code distance between previously transmitted code words of accumulated code blocks is D, during transmission at a next time, a minimum code distance between new code words of accumulated code blocks needs to be changed to d, and d needs to be greater than e/f, where f is a preset target threshold.

Optionally, the target threshold f is determined according to a status of a channel between the transmit end and the receive end.

Specifically, for example, without limitation, a value range of the target threshold f is (0, 0.5). A larger value indicates a smaller granularity of link adaptation. In the case of relatively bad link conditions, more retransmissions may occur. However, in the case of relatively good link conditions, a higher average throughput is achieved. In the foregoing example, after the code blocks or superposition code blocks are transmitted at the first, second, third, and fourth times, the minimum code distances of accumulated code blocks are respectively 2, 4, 5, and 6. If f=0.4, the minimum code distance of code blocks transmitted at the first time is 2. If decoding cannot be performed correctly, and an average code distance of 1.5 is calculated, the minimum code distance of accumulated code blocks at the next time needs to be greater than e/f=3.75. Therefore, only a code word superposed at the second time may be transmitted, so that the minimum code distance of accumulated code blocks is 4. However, if the calculated average code distance is 1.8, the minimum code distance of accumulated code blocks at the next time needs to be greater than e/f=4.5. In this case, a superposition code word with a length of four bits needs to be transmitted, so that the minimum code distance of accumulated code blocks is 5.

In addition, in this embodiment of the present invention, if the transmit end and the receive end can estimate communication channel quality, the foregoing target threshold f may be negotiated in advance. Therefore, in the foregoing HARQ process, the receive end needs to transmit only the foregoing average code distance e to the transmit end, that is, optionally, the code distance information is used to indicate the target average value; and the determining the target code distance according to target code distance information includes:

determining the target code distance d according to the target average value e and the target threshold f, where $d > e/f$, and $0 < f < 0.5$.

Alternatively, in this embodiment of the present invention, the receive end may also determine the foregoing target threshold f by itself, calculate, according to the target threshold f and the foregoing average code distance e, a minimum code distance d between new code words of accumulated code blocks, and transmit the minimum code distance to the transmit end, that is, optionally, the code distance information is used to indicate the target code distance, where the target code distance d is determined by the receive end according to the target average value e and the target threshold f, where $d > e/f$, and $0 < f < 0.5$.

Therefore, according to the HARQ process provided in this embodiment of the present invention, operations with high performance and low complexity can be implemented. Because block codes with an infinite number of lengths may be constructed, it can be always ensured that additional coding gains can be obtained during each superposition operation, and that an amount of information retransmitted at each time can be controlled flexibly.

In the data transmission method according to this embodiment of the present invention, code distances between block code words in a block code set are the same or have a difference of ±1, a transmit end performs coding according to the block code set, and a receive end performs decoding according to the block code set, which can improve an error correction capability during decoding.

Figure 6:
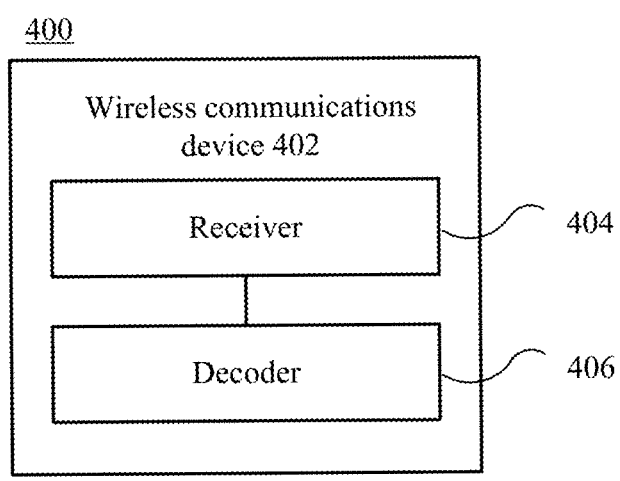
FIG. 6 is a schematic diagram of a device (namely, a receive end device) that executes a data transmission method in another implementation manner of the present invention in a wireless communications environment.

FIG. 6 shows a schematic block diagram of a system 400 to which a data transmission method in the present invention is applicable in a wireless communications environment. The system 400 includes a wireless communications device 402, where the wireless communications device 402 is displayed as receiving data through a channel. Although data reception is shown, the wireless communications device 402 may further transmit data through a channel (for example, the wireless communications device 402 may transmit and receive data simultaneously, the wireless communications device 402 may transmit and receive data at different times, or a combination thereof is applicable). The wireless communications device 402 may be, for example, a base station (for example, the base station 102 in FIG. 1), or an access terminal (for example, the access terminal 116 in FIG. 1, or the access terminal 122 in FIG. 1).

The wireless communications device 402 may include a receiver 404 and a decoder 406. Optionally, when the wireless communications device 402 transmits data through a channel, the wireless communications device 402 may further include a transmitter, where the transmitter may exist independently, or may be integrated with the receiver 404 to form a transceiver.

The receiver 404 may receive, on a channel, a data packet transmitted by (one or more) wireless communications apparatuses (namely, a transmit end, which is not shown in the figure), where the data packet carries (one or more) coded target block code words transmitted by the wireless communications apparatuses.

The decoder 406 is configured to decode (specifically, perform block decoding, where the process is described in detail later) the data received by the receiver 404 to obtain an original code word.

Figure 7:
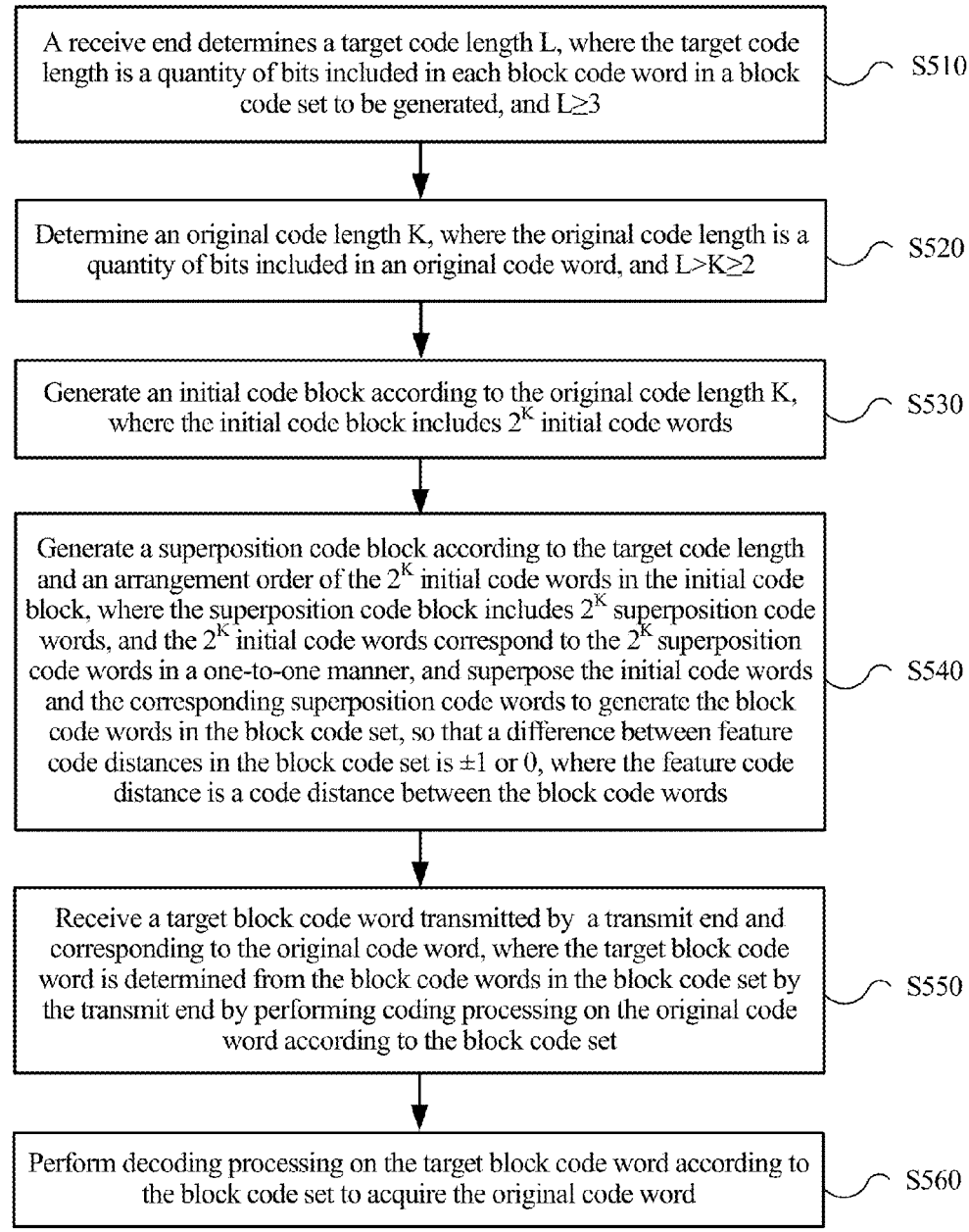
FIG. 7 is a flowchart of a data transmission method according to another embodiment of the present invention.

FIG. 7 is a schematic flowchart of a data transmission method 500 according to an embodiment of the present invention. The method 500 shown in FIG. 7 may be executed by a wireless communications device (namely, a receive end), where the receive end may be a base station or user equipment, and likewise, a transmit end may also be a base station or user equipment, which is not particularly limited in the present invention.

The method 500 includes:

S510. A receive end determines a target code length L, where the target code length is a quantity of bits included in each block code word in a block code set to be generated, and $L \geq 3$.

S520. Determine an original code length K, where the original code length is a quantity of bits included in an original code word, and $L > K \geq 2$.

S530. Generate an initial code block according to the original code length K, where the initial code block includes $2^K$ initial code words.

S540. Generate a superposition code block according to the target code length and an arrangement order of the $2^K$ initial code words in the initial code block, where the superposition code block includes $2^K$ superposition code words, and the $2^K$ initial code words correspond to the $2^K$ superposition code words in a one-to-one manner, and superpose the initial code words and the corresponding superposition code words to generate the block code words in the block code set, so that a difference between feature code distances in the block code set is ±1 or 0, where the feature code distance is a code distance between the block code words.

S550. Receive a target block code word transmitted by a transmit end and corresponding to the original code word, where the target block code word is determined from the block code words in the block code set by the transmit end by performing coding processing on the original code word according to the block code set.

S560. Perform decoding processing on the target block code word according to the block code set to acquire the original code word.

Specifically, in S510, the receive end may determine, according to a user requirement, a network requirement or the like, the code length L of a block code word transmitted by the transmit end, where the code length L is greater than the code length of the original code word (namely, original data coded by the transmit end).

In S520, the receive end may acquire the code length K of the original code word (namely, the quantity of bits included in the code word). In this embodiment of the present invention, the code length K of the original code word is greater than or equal to 2.

It should be noted that, in this embodiment of the present invention, to implement reliable data transmission, the code length L of the block code word and the code length K of the original code word that are determined by the receive end and the transmit end are consistent. For example, the code length L of the block code word and the code length K of the original code word may be determined by the transmit end and the receive end through negotiation, or may be delivered together by a network administrator to the transmit end and the receive end, or may be specified in advance by a communications protocol, which is not particularly limited in the present invention.

Optionally, when $K \leq 3$, the initial code block includes $2^K$ different initial code words, and each initial code word includes K bits; and the generating a superposition code block according to the target code length and an arrangement order of the $2^K$ initial code words in the initial code block includes:

determining a maximum code distance w between the superposition code words in the superposition code block according to the target code length L and the original code length K; and generating the superposition code block according to the arrangement order of the $2^K$ initial code words in the initial code block and the maximum code distance between the superposition code words in the superposition code block.

Optionally, the determining a maximum code distance w between the superposition code words in the superposition code block according to the target code length L and the original code length K includes:

when K=2, if L is an integer multiple of 3, w=2L/3;

when K=2, if L is not an integer multiple of 3, w=[2L/3]+1, where [2L/3] is a maximum integer that is less than or equal to 2L/3; and when K=3, w=[4L/7], where [4L/7] is a maximum integer that is less than or equal to 4L/7.

Optionally, when K≥4, the generating an initial code block according to the original code length K, where the initial code block includes $2^K$ initial code words, includes:

determining a sub block code set, where the sub block code set includes $2^{K-1}$ sub block code words, a quantity of bits included in each sub block code word is $L_0$, the sub block code set is generated according to a first initial code block and a first superposition code block, the first initial code block includes $2^{K-1}$ different first initial code words, each first initial code word includes K−1 bits, the first superposition code block is determined according to the quantity $L_0$ of bits included in the sub block code word and an arrangement order of the $2^{K-1}$ first initial code words in the first initial code block, the superposition code block includes $2^{K-1}$ superposition code words, each superposition code word includes $L_0$−K+1 bits, and in the sub block code set, code distances between code words are all s, where $L_0$<L;

superposing four such sub block code sets to generate an intermediate block code set, where the intermediate block code set includes $2^K$ intermediate block code words, and intermediate block code words arranged in the $z^{th}$ and $(z+2^{K-1})^{th}$ positions in the intermediate block code set are formed by superposition of sub block code words arranged in the $z^{th}$ positions in two such sub block code sets; and interchanging an intermediate block code word arranged in the $v^{th}$ position with an intermediate block code word arranged in the $(2^{K-1}-v+1)^{th}$ position in the intermediate block code set, and interchanging an intermediate block code word arranged in the $(2^{K-1}+v)^{th}$ position with an intermediate block code word arranged in the $(2^K-v+1)^{th}$ position in the intermediate block code set to generate a sub initial code block, where the initial code block includes x such sub initial code blocks, v ∈ [1, $2^{K-2}$], and x≥1; and the generating a superposition code block according to the target code length and an arrangement order of the $2^K$ initial code words in the initial code block includes:

generating a superposition code block including y sub superposition code blocks, so that each sub superposition code block includes $2^K$ superposition code words with a code length $L_1$, where elements on an antidiagonal in a code distance matrix of each sub superposition code block are all q, and remaining non-zero elements are all p, where q>p>0, y≥1, and the following formulas are satisfied:

$x:y=(q-p):s$, and $x*L_0+y*L_1=L$.

Optionally, the $a^{th}$ initial code word in the $2^K$ initial code words corresponds to the $a^{th}$ superposition code word in the $2^K$ superposition code words, where a is a positive integer and a≤$2^K$.

Optionally, when K=2 and L is an even number, the initial code block includes $2^K$ different initial code words, and each initial code word includes K bits; and the generating a superposition code block according to the target code length and an arrangement order of the $2^K$ initial code words in the initial code block includes:

generating L/2−1 sub superposition code blocks, where each sub superposition code block includes $2^K$ sub superposition code words, and each sub superposition code word includes two bits; and performing first ordering processing on each sub superposition code block according to the arrangement order of the $2^K$ initial code words in the initial code block, so as to determine an arrangement order of the sub superposition code words in each sub superposition code block, and generating the superposition code block according to each sub superposition code block obtained after the first ordering processing, where a first sub superposition code word arranged in the first position in the $m^{th}$ sub superposition code block obtained after the first ordering processing is any code word in the $m^{th}$ sub superposition code block, a second sub superposition code word in the $m^{th}$ sub superposition code block is arranged in the $i_1^{th}$ position, where the second sub superposition code word is a code word having a minimum code distance from the first sub superposition code word in the $m^{th}$ sub superposition code block, and for a first local block code set that is formed by m−1 sub superposition code blocks before the $m^{th}$ sub superposition code block and the initial code block and includes $2^K$ local block code words, a first local block code word arranged in the $i_1^{th}$ position is a code word having a minimum code distance from a second local block code word arranged in the first position in the $2^K$ local block code words; or performing second ordering processing on each sub superposition code block according to the arrangement order of the $2^K$ initial code words in the initial code block, so as to determine an arrangement order of the sub superposition code words in each sub superposition code block, and generating the superposition code block according to each sub superposition code block obtained after the second ordering processing, where a third sub superposition code word arranged in the first position in the $m^{th}$ sub superposition code block obtained after the second ordering processing is any code word in the $m^{th}$ sub superposition code block, and a fourth sub superposition code word in the $m^{th}$ sub superposition code block is arranged in the $i_2^{th}$ position, where the fourth sub superposition code word is a code word having a minimum code distance from the third sub superposition code word in the $m^{th}$ sub superposition code block, and for a second local block code set that is formed by m−1 sub superposition code blocks before the $m^{th}$ sub superposition code block and the initial code block and includes $2^K$ local block code words, a third local block code word arranged in the $i_2^{th}$ position is a code word having a maximum code distance from a fourth local block code word arranged in the first position in the $2^K$ local block code words.

Optionally, when K=2 and L is an odd number, the initial code block includes $2^K$ different initial code words, and each initial code word includes K bits; and the generating a superposition code block according to the target code length and an arrangement order of the $2^K$ initial code words in the initial code block includes:

generating $(L-1)/2$ sub superposition code blocks, where a first sub superposition code block includes $2^K$ sub superposition code words, each sub superposition code word includes two bits, and first sub superposition code blocks are the first $(L-1)/2-1$ sub superposition code blocks in the $(L-1)/2$ sub superposition code blocks; and a second sub superposition code block includes $2^K$ sub superposition code words, each sub superposition code word includes one bit, and the second sub superposition code block is a last sub superposition code block in the $(L-1)/2$ sub superposition code blocks;

performing third ordering processing on each first sub superposition code block according to the arrangement order of the $2^K$ initial code words in the initial code block, so as to determine an arrangement order of the sub superposition code words in each first sub superposition code block, where a fifth sub superposition code word arranged in the first position in the $m^{th}$ first sub superposition code block is any code word in the $m^{th}$ first sub superposition code block, and a sixth sub superposition code word in the $m^{th}$ first sub superposition code block is arranged in the $i_3^{th}$ position, where the sixth sub superposition code word is a code word having a maximum code distance from the fifth sub superposition code word in the $m^{th}$ first sub superposition code block, and for a third local block code set that is formed by $m-1$ first sub superposition code blocks before the $m^{th}$ sub superposition code block and the initial code block and includes $2^K$ local block code words, a fifth local block code word arranged in the $i_3^{th}$ position is a code word having a minimum code distance from a sixth local block code word arranged in the first position in the $2^K$ local block code words;

in a fourth local block code set that is formed by the first sub superposition code blocks obtained after the third ordering processing and the initial code block and includes $2^K$ local block code words, performing fourth ordering processing on the second sub superposition code block according to an arrangement of the $2^K$ local block code words, where if code distances between the local block code words in the fourth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the fourth local block code set are not completely the same, when a code distance between a seventh local block code word arranged in the $i_4^{th}$ position and an eighth local block code word arranged in the $j_4^{th}$ position is not a maximum code distance in the code distances between the local block code words, a sub superposition code word arranged in the $i_4^{th}$ position is different from a sub superposition code word arranged in the $j_4^{th}$ position in the second sub superposition code block, or when a code distance between a seventh local block code word arranged in the $i_4^{th}$ position and an eighth local block code word arranged in the $j_4^{th}$ position is a maximum code distance in the code distances between the local block code words, a sub superposition code word arranged in the $i_4^{th}$ position is the same as a sub superposition code word arranged in the $j_4^{th}$ position in the second sub superposition code block; and generating the superposition code block according to the first sub superposition code blocks obtained after the third ordering processing and the second sub superposition code block obtained after the fourth ordering processing.

Optionally, when K=2 and L is an odd number, the generating a superposition code block according to the target code length and an arrangement order of the $2^K$ initial code words in the initial code block includes:

generating $(L-1)/2$ sub superposition code blocks, where a first sub superposition code block includes $2^K$ sub superposition code words, each sub superposition code word includes two bits, and first sub superposition code blocks are the first $(L-1)/2-1$ sub superposition code blocks in the $(L-1)/2$ sub superposition code blocks; and a second sub superposition code block includes $2^K$ sub superposition code words, each sub superposition code word includes one bit, and the second sub superposition code block is a last sub superposition code block in the $(L-1)/2$ sub superposition code blocks;

performing fifth ordering processing on each first sub superposition code block according to the arrangement order of the $2^K$ initial code words in the initial code block, so as to determine an arrangement order of the sub superposition code words in each first sub superposition code block, where a seventh sub superposition code word arranged in the first position in the $m^{th}$ first sub superposition code block is any code word in the $m^{th}$ first sub superposition code block, and an eighth sub superposition code word in the $m^{th}$ first sub superposition code block is arranged in the $i_5^{th}$ position, where the eighth sub superposition code word is a code word having a minimum code distance from the seventh sub superposition code word in the $m^{th}$ first sub superposition code block, and for a fifth local block code set that is formed by $m-1$ first sub superposition code blocks before the $m^{th}$ sub superposition code block and the initial code block and includes $2^K$ local block code words, a ninth local block code word arranged in the $i_5^{th}$ position is a code word having a maximum code distance from a tenth local block code word arranged in the first position in the $2^K$ local block code words;

in a sixth local block code set that is formed by the first sub superposition code blocks obtained after the fifth ordering processing and the initial code block and includes $2^K$ local block code words, performing sixth ordering processing on the second sub superposition code block according to an arrangement of the $2^K$ local block code words, where if code distances between the local block code words in the sixth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the sixth local block code set are not completely the same, when a code distance between an eleventh local block code word arranged in the $i_6^{th}$ position and a twelfth local block code word arranged in the $j_6^{th}$ position is not a maximum code distance in the code distances between the local block code words, a sub superposition code word arranged in the $i_6^{th}$ position is different from a sub superposition code word arranged in the $j_6^{th}$ position in the second sub superposition code block, or when a code distance between an eleventh local block code word arranged in the $i_6^{th}$ position and a twelfth local block code word arranged in the $j_6^{th}$ position is a maximum code distance in the code distances between the local block code words, a sub superposition code word arranged in the $i_6^{th}$ position is the same as a sub superposition code word arranged in the $j_6^{th}$ position in the second sub superposition code block; and generating the superposition code block according to the first sub superposition code blocks obtained after the fifth ordering processing and the second sub superposition code block obtained after the sixth ordering processing.

That is, in S530, the receive end may generate the block code set. This process may be similar to the process in which the transmit end determines the block code set in the foregoing method 300. Herein, for avoiding repetition, a detailed description thereof is omitted.

In S540, the receive end may receive a data packet through a radio channel, where the data packet may carry the target block code word generated by the transmit end by performing coding on the original code word.

In S550, the receive end acquires, through demodulation, the block code word from the data packet received from the transmit end, and search a stored mapping entry (for example, the foregoing Table 1) for the corresponding original code word, thereby completing decoding.

It should be noted that, in this embodiment of the present invention, affected by quality of a communication channel, a block code word (hereinafter denoted as a block code word A for ease of distinguishing) acquired by the receive end from the data coming from the transmit end may be different from a block code word (hereinafter denoted as a block code word B for ease of distinguishing) actually transmitted by the transmit end. In this case, the receive end may determine a code distance between the block code word A and each block code word in the block code set generated above. If a code distance between the block code word A and a unique block code word (hereinafter denoted as a block code word C for ease of distinguishing) in the block code set is a minimum code distance, the receive end may consider that the block code word C is the block code word B actually transmitted by the transmit end.

For example, when K=2 and L=4, the block code word B (0001) may become the block code word A (0011) if one bit is erroneous. A code distance between 0011 and 0001 (the block code word C) is 1, while a code distance between 0011 and 0100 is 3, a code distance between 0011 and 1010 is 2, and a code distance between 0011 and 1111 is 2, which are all greater than 1. Therefore, error correction performance can be improved.

In addition, to ensure correctness of data transmission, mapping entries stored by the receive end and the transmit end need to be consistent.

Alternatively, the receive end may perform decoding by using an algebraic method.

For example, if hard decision decoding is used, an algebraic decoding method may be used. If the block code word belongs to a linear block code, for example, the foregoing linear block codes 0000, 0111, 1001, and 1110, a parity-check matrix may be used to perform decoding. The parity-check matrix may be obtained from a generator matrix. Specifically, the generator matrix G is formed by combining a unit matrix and another matrix, that is, G=I|Q. The unit matrix is a matrix in which elements on a main diagonal are all 1 and remaining elements are all 0, where:

$$I = \begin{matrix} 1 & 0 \\ 0 & 1 \end{matrix}, \text{ and } Q = \begin{matrix} 0 & 1 \\ 1 & 1 \end{matrix}.$$

A generator matrix of a linear block code with a target code length L and an original code length K has K rows and L columns, a unit matrix I forming the generator matrix has K rows and K columns, and a Q matrix has K rows and (L−K) columns. The parity-check matrix is H=P|I, where $p=Q^T$, that is, the P matrix is a transposed matrix of the Q matrix, and the H matrix is formed by the P matrix and the unit matrix. Therefore, herein $$P = \begin{matrix} 0 & 1 \\ 1 & 1 \end{matrix},$$

and therefore $$H = \begin{matrix} 0 & 1 & 1 & 0 \\ 1 & 1 & 0 & 1 \end{matrix}.$$

During decoding, a bit vector R after a hard decision is multiplied by a parity-check matrix to obtain an error vector E, namely, E=H*R. If the error vector is a zero vector, it is determined that no bit error exists. Otherwise, it is determined that a bit error exists, and a position of the bit error may be obtained according to a specific status of the error vector, and thereby error correction may be implemented. For example, herein if a transmit code word is 0111, and a receive code word after a hard decision is also 0111, R=0111, and $E=R*H^T=00$, where $H^T$ is a transposed matrix of the H matrix. Therefore, it is determined that no bit error exists. If a transmit code word is 0111, and a receive code word after a hard decision is 0101, E=10, and it may be determined that a bit error is in the third position. If a receive code word after a hard decision is 0011, E=11, and it may be determined that a bit error is in the second position. If a receive code word after a hard decision is 1111 or 0110, E=01. In this case, a bit error position cannot be determined, and it is only known that a bit error exists. Therefore, an error correction table may be shown in the foregoing Table 2.

For a non-linear block code, a similar method may also be used. For example, for the non-linear block perfect codes 0001, 0100, 1010, and 1111 described above, their parity-check matrix may be generated by using a same method as linear coding, but same error correction can be performed only after a monitor vector is superposed on a result obtained by multiplying the parity-check matrix and a decision bit vector. The monitor vector is the last (L−K) bits of the generator vector, and herein the superposed monitor vector is 01. Certainly, the superposition operation may be reflected in adjustment of the error correction table, that is, the monitor vector may not be superposed, but a correspondence between the error vector and a bit error position is adjusted. For example, herein the error correction table may be shown in the foregoing Table 3, and no monitor vector needs to be superposed additionally.

Except the algebraic decoding method, regardless of a hard decision or a soft decision, generally, a method achieving best performance is a decoding method using a minimum mean square error criterion. That is, if an element vector after a decision is c={c1, c2, . . . , cn}, if the decision is a hard decision, each vector element is 0 or 1, or otherwise is a number indicated by multiple bits. The minimum mean square error criterion is to obtain a transmit code word vector with a minimum mean square error (corresponding to a square root of a square sum of differences between the vector elements) between all possible transmit code word vectors and the decided element vectors, and decide that the obtained transmit code word vector is a real receive code word.

However, generally, the minimum mean square error criterion involves a large amount of computation and is not practicable. A practicable method is an equivalent correlation decoding method. Compared with the minimum mean square error method for obtaining a mean square error, this method is to obtain a correlation (namely, a sum of products of elements in corresponding positions), and select a code word with a maximum correlation value as an output of decoding. During a soft decision, because the transmit code word may be indicated by a bit sequence and does not involve an amplitude, the correlation operations may be simplified to become addition and subtraction operations without a multiplication operation. Therefore, complexity is reduced greatly, but performance remains unchanged.

However, correlation decoding still requires a large quantity of addition and subtraction operations. In the case of a great code length n and a large quantity of code words, complexity is still high, but further simplification may be performed. Using the block code set {0000, 0111, 1001, 1110} described above as an example, during a correlation operation, in the transmit code word, 0 is mapped to −1, and 1 is mapped to 1. Assuming that a column vector formed by decided receive elements is $y=\{y1, y2, y3, y4\}^T$, and that a matrix formed by using each code word in the code block as a row is C, the correlation decoding method is to obtain a position of a maximum element in a column vector $z=C*y$, and thereby select a corresponding code word. It is easily known that, if the position of the maximum element is i, a position of a maximum element in $C/m*y$ is also i, where m is a positive constant, and a position of a maximum element in $(C+A)*y$ is also i. Herein A is a matrix, and each row of the matrix is formed by same vectors. The code word matrix C is transformed according to the two properties to obtain a transformation matrix $D=(C+A)/m$, where all rows of A are the same and each element of each row is a maximum value of an absolute value of each element of a corresponding column in C. In this way, all elements in (C+A) are greater than or equal to 0, and m is a common divisor of all the elements in (C+A). During binary coding, elements in the matrix D are changed to 0 or 1. Because operations corresponding to elements 0 in correlation operations may be omitted, an amount of computation may be reduced greatly. In addition, if 1 exists in two or more positions of two rows in the matrix D, the addition operation on the matrix D may be counted only once and recorded for use in computation of another row. For the example of the foregoing perfect code, a mapped code word matrix is:

$$C = \begin{matrix} -1 & -1 & -1 & -1 \\ -1 & 1 & 1 & 1 \\ 1 & -1 & -1 & 1 \\ 1 & 1 & 1 & -1 \end{matrix}.$$

Therefore, $$A = \begin{matrix} 1 & 1 & 1 & 1 \\ 1 & 1 & 1 & 1 \\ 1 & 1 & 1 & 1 \\ 1 & 1 & 1 & 1 \end{matrix}$$

and m=2 may be determined.

Further, $$(C+A)/m = \begin{matrix} 0 & 0 & 0 & 0 \\ 0 & 1 & 1 & 1 \\ 1 & 0 & 0 & 1 \\ 1 & 1 & 1 & 0 \end{matrix}$$

may be determined.

The addition operation needs to be performed (for five times) on only a position that includes a non-zero element. Compared with original 12 times, operations are reduced greatly. Further, because the second column and the third column of the second row and the fourth row are all 1, the addition operation may be performed only once (four times in total).

For further simplification, because a plurality of pairwise comparisons generally needs to be performed during a final comparison, determining, and decoding, but only two row vectors of D are actually required for computation in each comparison, every two row vectors of D form a new matrix represented by $D_{ij}$, where i<j, representing a matrix formed by row vectors of the $i^{th}$ row and the $j^{th}$ row. Assume $F_{ij}=D_{ij}+B$, where B is also a matrix formed by two same rows. According to the foregoing properties, a maximum value decision result is not changed. Herein there are as few non-zero elements in $F_{ij}$ as possible. That is, if elements of one column of two rows of $D_{ij}$ are the same, elements of the column in B may be negated values of the same elements, so that elements of the column corresponding to $F_{ij}$ become zero. In the foregoing example, $$D_{34} = \begin{matrix} 1 & 0 & 0 & 1 \\ 1 & 1 & 1 & 0 \end{matrix}$$

should become $$F_{34} = \begin{matrix} 0 & 0 & 0 & 1 \\ 0 & 1 & 1 & 0 \end{matrix}$$

according to the foregoing analysis.

After such transformation, the number of addition operation times is reduced by one again (only three times in total). In this case, a decoding operation becomes very simple.

Optionally, the generating a superposition code block according to the target code length and an arrangement order of the $2^K$ initial code words in the initial code block includes:

generating the superposition code block according to the target code length and the arrangement order of the $2^K$ initial code words in the initial code block, where the superposition code block includes t sub superposition code blocks, and each sub superposition code block includes $2^K$ sub superposition code words, where for a target local block code set that is formed by the initial code block and $t_0$ sub superposition code blocks and includes $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, where the $t_0$ sub superposition code blocks include a sub superposition code block arranged in the first position to a sub superposition code block arranged in the $t_0^{th}$ position in the t sub superposition code blocks, t≥1, and $t_0 \in [1, t]$.

Specifically, as described above, in this embodiment of the present invention, the superposition code block may include a plurality of sub superposition code blocks. For example, when K=2 and L=9, the superposition code block may include four sub superposition code blocks, where each superposition code word in the first three sub superposition code blocks includes two bits, and each superposition code word in a last sub superposition code block includes one bit. The foregoing Table 4 shows composition of the block code set when K=2 and L=9.

In addition, in this embodiment of the present invention, the foregoing initial code block and different sub superposition code blocks may form various block code sets with different target code lengths, and in each block code set, code distances between code words are equal or have a difference of ±1.

For example, the initial code block and the sub superposition code block A in Table 4 may form a block code set with K=2 and L=4, where a code distance between code words is 2 or 3.

For another example, the initial code block, the sub superposition code block A, and the sub superposition code block B in Table 4 may form a block code set with K=2 and L=6, where a code distance between code words is 4.

For another example, the initial code block, the sub superposition code block A, the sub superposition code block B, and the sub superposition code block C in Table 4 may form a block code set with K=2 and L=8, where a code distance between code words is 5 or 6.

As described above, in the block code sets formed according to the method in this embodiment of the present invention, a longer block code set may be generated based on superposition of shorter block code sets. Therefore, this feature can be used to perform the foregoing link adaptation, and specifically, HARQ processing.

Optionally, when t≥2, the target block code word includes a target initial code word that is in the initial code block and corresponding to the original code word, and a target sub superposition code word that is in each sub superposition code block and corresponding to the original code word; and the receiving a target block code word transmitted by a transmit end and corresponding to the original code word includes:

receiving a first sub target block code word at a first time, where the first sub target block code word includes the target initial code word and target sub superposition code words in a sub superposition code block arranged in the first position to a sub superposition code block arranged in the $c_1^{th}$ position in the sub superposition code blocks, where $c_1 \geq 1$; and receiving a second sub target block code word at a second time, where the second sub target block code word includes target sub superposition code words in a sub superposition code block arranged in the $c_2^{th}$ position to a sub superposition code block arranged in the $c_3^{th}$ position in the sub superposition code blocks, where the second time is later than the first time, $C_2=c_1+1$, and $c_3 \leq t$.

Specifically, HARQ is a fast link adaptation method. First, data is transmitted at a high rate. If the transmission fails, that is, if no correct acknowledgement ACK is received, or if a negative acknowledgement NACK is received, the data is retransmitted. However, different from an ordinary automatic repeat request, combination processing is performed on the retransmitted data and the already received data at the receive end. This undoubtedly increases a signal-to-noise ratio greatly. However, the data rate during retransmission is actually reduced. Therefore, under relatively good channel conditions, data transmission is implemented at a relatively high rate (in this case, a correct acknowledgement can be received), and under relatively bad channel conditions, data transmission is implemented at a relatively low rate (retransmission and combination are required). Ordinary retransmission and combination only increase energy of a receive signal, which is merely equivalent to increasing a signal-to-noise ratio of information bits. In retransmission and combination combined with error correction coding, different coding modes may be used in each transmission. For example, parity bits in different positions may be carried, or code words in different puncture positions are transmitted. In this way, additional error correction coding gains can also be obtained.

The foregoing block code set may be used in the HARQ process combined with error correction coding. For example, a block code word (hereinafter denoted as a block code word M for ease of understanding and distinguishing) of a code length corresponding to an original code word is transmitted at the first time, and a block code word (hereinafter denoted as a block code word N for ease of understanding and distinguishing) of a code length corresponding to an original code word is transmitted at the $i^{th}$ time, where the code length of the block code word N (namely, a target code length) is greater than the code length of the block code word M, and the block code word N may be generated by superposing one or more sub superposition code blocks on the block code word M. In this way, during transmission at the $i^{th}$ time, only the superposed code blocks need to be transmitted.

The receive end combines the code words received at each time, and performs decoding. For example, in the case of information bits with k=2, the foregoing Table 5 shows a transmission policy determined on a basis of the structure of each block code set shown in Table 4.

Herein, it should be noted that the code word transmitted at each time can be decoded independently, or possibly cannot be decoded independently. As shown in the foregoing example, for the superposition code words transmitted at the second time and the third time, transmit bits can be obtained independently, but independent reception processing cannot be performed on the superposition code word transmitted at the fourth time. According to the foregoing analysis, for any k≥2, there are a series of such block code sets. In such block code sets, code distances between code words are the same, and block codes with infinite lengths may be included in the block code sets. For example, when k=2, the target code length L may be any integer that is equal to 3 or greater than 3; when k=3, the target code length L may be a value of 7p−1, 7p, or 7p+1, where p is an integer that is greater than or equal to 1.

It should be understood that the foregoing illustrated transmission policy is for exemplary description only, and that the present invention is not limited thereto. For example, the quantity and length of code words transmitted at each time may also be determined according to a decoding decision made by the receive end for the received code words, that is, optionally, before the receiving a second sub target block code word at a second time, the method further includes:

determining a target average value, where a target code distance is an average value of minimum code distances between at least one receive code word received by the receive end and block code words in a first block code set, the at least one receive code word includes a first receive code word corresponding to the first sub target block code word, and a quantity of bits included in each block code word in the first block code set is the same as a quantity of bits included in each receive code word;

determining code distance information according to the target average value; and transmitting the code distance information to the transmit end.

Specifically, an error correction block code may also be checked for errors, that is, error severity may be determined according to values of code distances. When the receive end cannot perform decoding correctly, an average value e of minimum code distances between at least one received code word and all code words in the block code set may be calculated, and error severity may be determined. In addition, this information is added to a negative acknowledgement NACK packet and returned to the transmit end. For example, in a case in which a data packet includes Z code words (each code word is a code word coded according to the block code set determined above), first, a minimum code distance $e_1$ between the first code word and each block code word in the block code set is determined, then a minimum code distance $e_2$ between the second code word and each block code word in the block code set is determined, and so on, until a minimum code distance $e_z$ between a last code word and each block code word in the block code set is determined. Afterward, an average value of the minimum code distances is determined, that is, $e=(e_1+e_2+\ldots -e_z)/Z$.

It should be noted that, in this embodiment of the present invention, the data packet may include a plurality of code words, or may include only one code word. For example, only the target block code word determined above is included. In this case, the average value e of the minimum code distances is a minimum code distance between the target block code word and each block code word in the block code set.

The transmit end determines, according to the error severity, a block length of a code word to be transmitted at a next time. For example, if a minimum code distance between previously transmitted code words of accumulated code blocks is D, during transmission at a next time, a minimum code distance between new code words of accumulated code blocks needs to be changed to d, and d needs to be greater than e/f, where f is a preset target threshold.

Optionally, the determining code distance information according to the target average value includes:

determining, according to the target average value e and a target threshold f, code distance information that is used to indicate the target code distance d, where $d>e/f$, and $0<f<0.5$.

Specifically, for example, without limitation, a value range of the target threshold f is (0, 0.5). A larger value indicates a smaller granularity of link adaptation. In the case of relatively bad link conditions, more retransmissions may occur. However, in the case of relatively good link conditions, a higher average throughput is achieved. In the foregoing example, after the code blocks or superposition code blocks are transmitted at the first, second, third, and fourth times, the minimum code distances of accumulated code blocks are respectively 2, 4, 5, and 6. If f=0.4, the minimum code distance of code blocks transmitted at the first time is 2. If decoding cannot be performed correctly, and an average code distance of 1.5 is calculated, the minimum code distance of accumulated code blocks at the next time needs to be greater than e/f=3.75. Therefore, only a code word superposed at the second time may be transmitted, so that the minimum code distance of accumulated code blocks is 4. However, if the calculated average code distance is 1.8, the minimum code distance of accumulated code blocks at the next time needs to be greater than e/f=4.5. In this case, a superposition code word with a length of four bits needs to be transmitted, so that the minimum code distance of accumulated code blocks is 5.

Optionally, the target threshold f is determined according to a status of a channel between the transmit end and the receive end.

In addition, in this embodiment of the present invention, if the transmit end and the receive end can estimate communication channel quality, the foregoing target threshold f may be negotiated in advance. Therefore, in the foregoing HARQ process, the receive end needs to transmit only the foregoing average code distance e to the transmit end, that is, optionally, the determining code distance information according to the target average value includes:

determining the code distance information according to the target average value, where the code distance information is used to indicate the target average value e.

Therefore, according to the HARQ process provided in this embodiment of the present invention, operations with high performance and low complexity can be implemented. Because block codes with an infinite number of lengths may be constructed, it can be always ensured that additional coding gains can be obtained during each superposition operation, and that an amount of information retransmitted at each time can be controlled flexibly.

In the data transmission method according to this embodiment of the present invention, code distances between block code words in a block code set are the same or have a difference of ±1, a transmit end performs coding according to the block code set, and a receive end performs decoding according to the block code set, which can improve an error correction capability during decoding.

The data transmission methods according to the embodiments of the present invention are described above in detail with reference to FIG. 1 and FIG. 7. Data transmission apparatuses according to the embodiments of the present invention are described below in detail with reference to FIG. 8 and FIG. 9.

Figure 8:
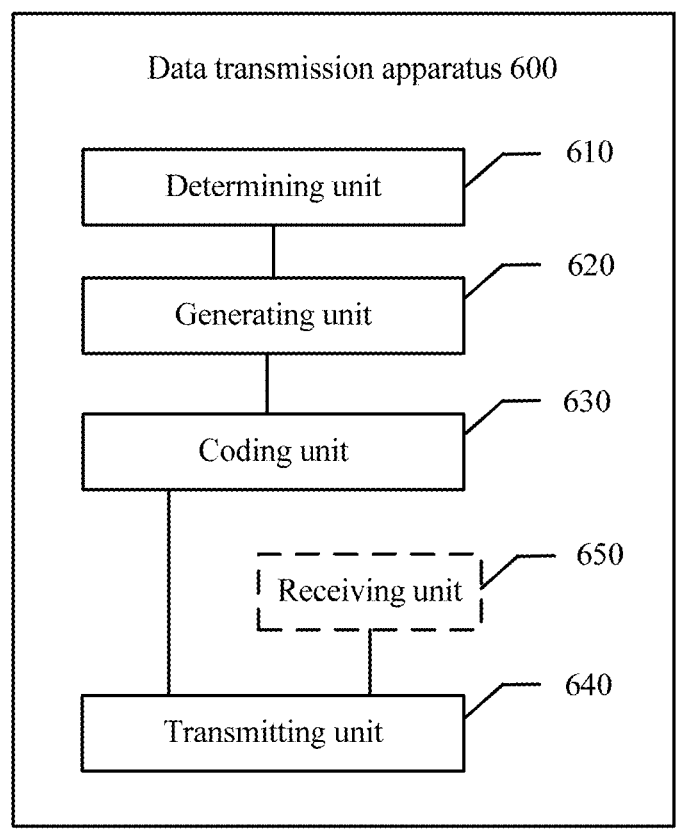
FIG. 8 is a structural block diagram of a data transmission apparatus according to an embodiment of the present invention.

FIG. 8 is a structural block diagram of a data transmission apparatus 600 according to an embodiment of the present invention. The data transmission apparatus 600 in FIG. 8 includes:

a determining unit 610, configured to determine a target code length L and an original code length K, where the target code length is a quantity of bits included in each block code word in a block code set to be generated, the original code length is a quantity of bits included in an original code word to be transmitted to a receive end, L≥3, and L>K≥2;

a generating unit 620, configured to generate an initial code block according to the original code length K, where the initial code block includes $2^K$ initial code words, generate a superposition code block according to the target code length and an arrangement order of the $2^K$ initial code words in the initial code block, where the superposition code block includes $2^K$ superposition code words, and the $2^K$ initial code words correspond to the $2^K$ superposition code words in a one-to-one manner, and superpose the initial code words and the corresponding superposition code words to generate the block code words in the block code set, so that a difference between feature code distances in the block code set is ±1 or 0, where the feature code distance is a code distance between the block code words;

a coding unit 630, configured to perform coding processing on the original code word according to the block code set, so as to determine, from the block code words in the block code set, a target block code word corresponding to the original code word; and a transmitting unit 640, configured to transmit the target block code word to the receive end.

Optionally, when K≤3, the initial code block includes $2^K$ different initial code words, and each initial code word includes K bits; and the generating unit 620 is specifically configured to determine a maximum code distance w between the superposition code words in the superposition code block according to the target code length L and the original code length K; and generate the superposition code block according to the arrangement order of the $2^K$ initial code words in the initial code block and the maximum code distance w between the superposition code words in the superposition code block.

Optionally, the generating unit 620 is specifically configured to: when K=2, if L is an integer multiple of 3, determine that the maximum code distance w between the superposition code words in the superposition code block is equal to 2L/3;

when K=2, if L is not an integer multiple of 3, determine that the maximum code distance w between the superposition code words in the superposition code block is equal to [2L/3]+1, where [2L/3] is a maximum integer that is less than or equal to 2L/3; and when K=3, determine that the maximum code distance w between the superposition code words in the superposition code block is equal to [4L/7], where [4L/7] is a maximum integer that is less than or equal to 4L/7.

Optionally, when K≥4, the generating unit 620 is specifically configured to determine a sub block code set, where the sub block code set includes $2^{K-1}$ sub block code words, a quantity of bits included in each sub block code word is $L_0$, the sub block code set is generated according to a first initial code block and a first superposition code block, the first initial code block includes $2^{K-1}$ different first initial code words, each first initial code word includes K−1 bits, the first superposition code block is determined according to the quantity $L_0$ of bits included in the sub block code word and an arrangement order of the $2^{K-1}$ first initial code words in the first initial code block, the superposition code block includes $2^{K-1}$ superposition code words, each superposition code word includes $L_0$−K+1 bits, and in the sub block code set, code distances between code words are all s, where $L_0$<L;

superpose four such sub block code sets to generate an intermediate block code set, where the intermediate block code set includes $2^K$ intermediate block code words, and intermediate block code words arranged in the $z^{th}$ and $(z+2^{K-1})^{th}$ positions in the intermediate block code set are formed by superposition of sub block code words arranged in the $z^{th}$ positions in two such sub block code sets;

interchange an intermediate block code word arranged in the $v^{th}$ position with an intermediate block code word arranged in the $(2^{K-1}-v+1)^{th}$ position in the intermediate block code set, and interchange an intermediate block code word arranged in the $(2^{K-1}+v)^{th}$ position with an intermediate block code word arranged in the $(2^K-v+1)^{th}$ position in the intermediate block code set to generate a sub initial code block, where the initial code block includes x such sub initial code blocks, v ∈ [1, $2^{K-2}$], and x≥1; and generate a superposition code block including y sub superposition code blocks, so that each sub superposition code block includes $2^K$ superposition code words with a code length $L_1$, where elements on an antidiagonal in a code distance matrix of each sub superposition code block are all q, and remaining non-zero elements are all p, where q>p>0, y≥11, and the following formulas are satisfied:

$x:y=(q-p):s$, and $x*L_0+y*L_1=L$.

Optionally, the $a^{th}$ initial code word in the $2^K$ initial code words corresponds to the $a^{th}$ superposition code word in the $2^K$ superposition code words, where a is a positive integer and a≤$2^K$.

Optionally, when K=2 and L is an even number, the initial code block includes $2^K$ different initial code words, and each initial code word includes K bits; and the generating unit 620 is specifically configured to generate L/2−1 sub superposition code blocks, where each sub superposition code block includes $2^K$ sub superposition code words, and each sub superposition code word includes two bits; and perform first ordering processing on each sub superposition code block according to the arrangement order of the $2^K$ initial code words in the initial code block, so as to determine an arrangement order of the sub superposition code words in each sub superposition code block, and generate the superposition code block according to each sub superposition code block obtained after the first ordering processing, where a first sub superposition code word arranged in the first position in the $m^{th}$ sub superposition code block obtained after the first ordering processing is any code word in the $m^{th}$ sub superposition code block, and a second sub superposition code word in the $m^{th}$ sub superposition code block is arranged in the $i_1^{th}$ position, where the second sub superposition code word is a code word having a maximum code distance from the first sub superposition code word in the $m^{th}$ sub superposition code block, and for a first local block code set that is formed by m−1 sub superposition code blocks before the $m^{th}$ sub superposition code block and the initial code block and includes $2^K$ local block code words, a first local block code word arranged in the $i_1^{th}$ position is a code word having a minimum code distance from a second local block code word arranged in the first position in the $2^K$ local block code words; or perform second ordering processing on each sub superposition code block according to the arrangement order of the $2^K$ initial code words in the initial code block, so as to determine an arrangement order of the sub superposition code words in each sub superposition code block, and generate the superposition code block according to each sub superposition code block obtained after the second ordering processing, where a third sub superposition code word arranged in the first position in the $m^{th}$ sub superposition code block obtained after the second ordering processing is any code word in the $m^{th}$ sub superposition code block, and a fourth sub superposition code word in the $m^{th}$ sub superposition code block is arranged in the $i_2^{th}$ position, where the fourth sub superposition code word is a code word having a minimum code distance from the third sub superposition code word in the $m^{th}$ sub superposition code block, and for a second local block code set that is formed by m−1 sub superposition code blocks before the $m^{th}$ sub superposition code block and the initial code block and includes $2^K$ local block code words, a third local block code word arranged in the $i_2^{th}$ position is a code word having a maximum code distance from a fourth local block code word arranged in the first position in the $2^K$ local block code words.

Optionally, when K=2 and L is an odd number, the initial code block includes $2^K$ different initial code words, and each initial code word includes K bits; and the generating unit 620 is specifically configured to generate (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks;

perform third ordering processing on each first sub superposition code block according to the arrangement order of the $2^K$ initial code words in the initial code block, so as to determine an arrangement order of the sub superposition code words in each first sub superposition code block, where a fifth sub superposition code word arranged in the first position in the $m^{th}$ first sub superposition code block is any code word in the $m^{th}$ first sub superposition code block, and a sixth sub superposition code word in the $m^{th}$ first sub superposition code block is arranged in the $i_3^{th}$ position, where the sixth sub superposition code word is a code word having a maximum code distance from the fifth sub superposition code word in the $m^{th}$ first sub superposition code block, and for a third local block code set that is formed by m−1 first sub superposition code blocks before the $m^{th}$ sub superposition code block and the initial code block and includes $2^K$ local block code words, a fifth local block code word arranged in the $i_3^{th}$ position is a code word having a minimum code distance from a sixth local block code word arranged in the first position in the $2^K$ local block code words;

in a fourth local block code set that is formed by the first sub superposition code blocks obtained after the third ordering processing and the initial code block and includes $2^K$ local block code words, perform fourth ordering processing on the second sub superposition code block according to an arrangement of the $2^K$ local block code words, where if code distances between the local block code words in the fourth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the fourth local block code set are not completely the same, when a code distance between a seventh local block code word arranged in the $i_4^{th}$ position and an eighth local block code word arranged in the $j_4^{th}$ position is not a maximum code distance in the code distances between the local block code words, a sub superposition code word arranged in the $i_4^{th}$ position is different from a sub superposition code word arranged in the $j_4^{th}$ position in the second sub superposition code block, or when a code distance between a seventh local block code word arranged in the $i_4^{th}$ position and an eighth local block code word arranged in the $j_4^{th}$ position is a maximum code distance in the code distances between the local block code words, a sub superposition code word arranged in the $i_4^{th}$ position is the same as a sub superposition code word arranged in the $j_4^{th}$ position in the second sub superposition code block; and generate the superposition code block according to the first sub superposition code blocks obtained after the third ordering processing and the second sub superposition code block obtained after the fourth ordering processing.

Optionally, when K=2 and L is an odd number, the generating unit 620 is specifically configured to generate (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks;

perform fifth ordering processing on each first sub superposition code block according to the arrangement order of the $2^K$ initial code words in the initial code block, so as to determine an arrangement order of the sub superposition code words in each first sub superposition code block, where a seventh sub superposition code word arranged in the first position in the $m^{th}$ first sub superposition code block is any code word in the $m^{th}$ first sub superposition code block, and an eighth sub superposition code word in the $m^{th}$ first sub superposition code block is arranged in the $i_5^{th}$ position, where the eighth sub superposition code word is a code word having a minimum code distance from the seventh sub superposition code word in the $m^{th}$ first sub superposition code block, and for a fifth local block code set that is formed by m−1 first sub superposition code blocks before the $m^{th}$ sub superposition code block and the initial code block and includes $2^K$ local block code words, a ninth local block code word arranged in the $i_5^{th}$ position is a code word having a maximum code distance from a tenth local block code word arranged in the first position in the $2^K$ local block code words;

in a sixth local block code set that is formed by the first sub superposition code blocks obtained after the fifth ordering processing and the initial code block and includes $2^K$ local block code words, perform sixth ordering processing on the second sub superposition code block according to an arrangement of the $2^K$ local block code words, where if code distances between the local block code words in the sixth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the sixth local block code set are not completely the same, when a code distance between an eleventh local block code word arranged in the $i_6^{th}$ position and a twelfth local block code word arranged in the $j_6^{th}$ position is not a maximum code distance in the code distances between the local block code words, a sub superposition code word arranged in the $i_6^{th}$ position is different from a sub superposition code word arranged in the $j_6^{th}$ position in the second sub superposition code block, or when a code distance between an eleventh local block code word arranged in the $i_6^{th}$ position and a twelfth local block code word arranged in the $j_6^{th}$ position is a maximum code distance in the code distances between the local block code words, a sub superposition code word arranged in the $i_6^{th}$ position is the same as a sub superposition code word arranged in the $j_6^{th}$ position in the second sub superposition code block; and generate the superposition code block according to the first sub superposition code blocks obtained after the fifth ordering processing and the second sub superposition code block obtained after the sixth ordering processing.

Optionally, the generating unit 620 is specifically configured to generate the superposition code block according to the target code length and the arrangement order of the $2^K$ initial code words in the initial code block, where the superposition code block includes t sub superposition code blocks, and each sub superposition code block includes $2^K$ sub superposition code words, where for a target local block code set that is formed by the initial code block and $t_0$ sub superposition code blocks and includes $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, where the $t_0$ sub superposition code blocks include a sub superposition code block arranged in the first position to a sub superposition code block arranged in the $t_0^{th}$ position in the t sub superposition code blocks, t≥1, and $t_0 \in [1, t]$.

Optionally, when t≥2, the target block code word includes a target initial code word that is in the initial code block and corresponding to the original code word, and a target sub superposition code word that is in each sub superposition code block and corresponding to the original code word; and the transmitting unit 640 is specifically configured to transmit a first sub target block code word at a first time, where the first sub target block code word includes the target initial code word and target sub superposition code words in a sub superposition code block arranged in the first position to a sub superposition code block arranged in the $c_1^{th}$ position in the sub superposition code blocks, where $c_1 \geq 1$; and transmit a second sub target block code word at a second time, where the second sub target block code word includes target sub superposition code words in a sub superposition code block arranged in the $c_2^{th}$ position to a sub superposition code block arranged in the $c_3^{th}$ position in the sub superposition code blocks, where the second time is later than the first time, $C_2 = c_1 + 1$, and $c_3 \leq t$.

Optionally, the apparatus 600 further includes:

a receiving unit 650, configured to receive code distance information transmitted by the receive end, where the code distance information is determined by the receive end according to a target average value, a target code distance is an average value of minimum code distances between at least one receive code word received by the receive end and block code words in a first block code set, the at least one receive code word includes a first receive code word corresponding to the first sub target block code word, and a quantity of bits included in each block code word in the first block code set is the same as a quantity of bits included in each receive code word; where the determining unit 610 is further configured to determine the target code distance according to the target code distance information, and determine the second sub target block code word according to the target code distance, so that in a first target local block code set that is formed by the initial code block and $c_3$ sub superposition code blocks and includes $2^K$ first target local block code words, a minimum value of code distances between the first target local block code words is greater than the target code distance.

Optionally, the code distance information is used to indicate the target code distance, where the target code distance d is determined by the receive end according to the target average value e and a target threshold f, where $d > e/f$, and $0 < f < 0.5$.

Optionally, the code distance information is used to indicate the target average value; and the determining unit 610 is specifically configured to determine the target code distance d according to the target average value e and a target threshold f, where $d > e/f$, and $0 < f < 0.5$.

Optionally, the target threshold f is determined according to a status of a channel between the apparatus 600 and the receive end.

Optionally, after each block code word in the block code set is generated, the generating unit 620 is further configured to interchange the $a^{th}$ bit and the $b^{th}$ bit of each block code word in the block code set.

The data transmission apparatus 600 according to this embodiment of the present invention may correspond to an entity that implements the data transmission method 300 according to an embodiment of the present invention. In addition, the units in the data transmission apparatus 600 and the foregoing other operations and/or functions are respectively intended to implement the corresponding processes in the method 300 in FIG. 3, and details are not repeated herein for brevity.

In the data transmission apparatus according to this embodiment of the present invention, code distances between block code words in a block code set are the same or have a difference of ±1, a transmit end performs coding according to the block code set, and a receive end performs decoding according to the block code set, which can improve an error correction capability during decoding.

Figure 9:
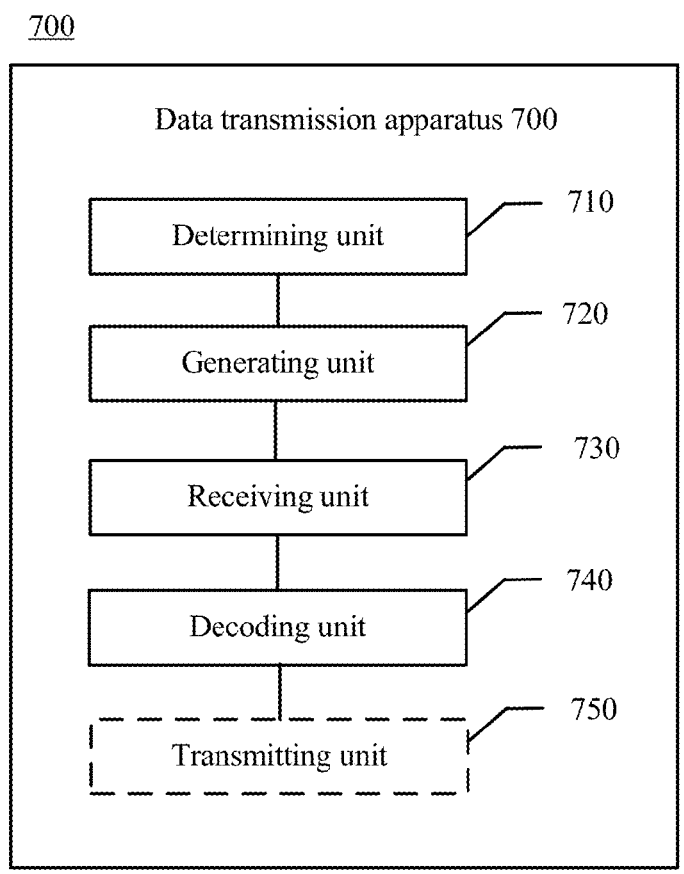
FIG. 9 is a structural block diagram of a data transmission apparatus according to another embodiment of the present invention.

FIG. 9 is a structural block diagram of a data transmission apparatus 700 according to another embodiment of the present invention. The data transmission apparatus 700 in FIG. 9 includes:

a determining unit 710, configured to determine a target code length L and an original code length K, where the target code length is a quantity of bits included in each block code word in a block code set to be generated, the original code length is a quantity of bits included in an original code word, L≥3, and L>K≥2;

a generating unit 720, configured to generate an initial code block according to the original code length K, where the initial code block includes $2^K$ initial code words, generate a superposition code block according to the target code length and an arrangement order of the $2^K$ initial code words in the initial code block, where the superposition code block includes $2^K$ superposition code words, and the $2^K$ initial code words correspond to the $2^K$ superposition code words in a one-to-one manner, and superpose the initial code words and the corresponding superposition code words to generate the block code words in the block code set, so that a difference between feature code distances in the block code set is ±1 or 0, where the feature code distance is a code distance between the block code words;

a receiving unit 730, configured to receive a target block code word transmitted by a transmit end and corresponding to the original code word, where the target block code word is determined from the block code words in the block code set by the transmit end by performing coding processing on the original code word according to the block code set; and a decoding unit 740, configured to perform decoding processing on the target block code word according to the block code set to acquire the original code word.

Optionally, when $K \leq 3$, the initial code block includes $2^K$ different initial code words, and each initial code word includes K bits; and the generating unit 720 is specifically configured to determine a maximum code distance w between the superposition code words in the superposition code block according to the target code length L and the original code length K; and generate the superposition code block according to the arrangement order of the $2^K$ initial code words in the initial code block and the maximum code distance between the superposition code words in the superposition code block.

Optionally, the generating unit 720 is specifically configured to: when K=2, if L is an integer multiple of 3, determine that the maximum code distance w between the superposition code words in the superposition code block is equal to 2L/3;

when K=2, if L is not an integer multiple of 3, determine that the maximum code distance w between the superposition code words in the superposition code block is equal to [2L/3]+1, where [2L/3] is a maximum integer that is less than or equal to 2L/3; and when K=3, determine that the maximum code distance w between the superposition code words in the superposition code block is equal to [4L/7], where [4L/7] is a maximum integer that is less than or equal to 4L/7.

Optionally, when $K \geq 4$, the generating unit 720 is specifically configured to determine a sub block code set, where the sub block code set includes $2^{K-1}$ sub block code words, a quantity of bits included in each sub block code word is $L_0$, the sub block code set is generated according to a first initial code block and a first superposition code block, the first initial code block includes $2^{K-1}$ different first initial code words, each first initial code word includes K-1 bits, the first superposition code block is determined according to the quantity $L_0$ of bits included in the sub block code word and an arrangement order of the $2^{K-1}$ first initial code words in the first initial code block, the superposition code block includes $2^{K-1}$ superposition code words, each superposition code word includes $L_0-K+1$ bits, and in the sub block code set, code distances between code words are all s, where $L_0 < L$;

superpose four such sub block code sets to generate an intermediate block code set, where the intermediate block code set includes $2^K$ intermediate block code words, and intermediate block code words arranged in the $z^{th}$ and $(z+2^{K-1})^{th}$ positions in the intermediate block code set are formed by superposition of sub block code words arranged in the $z^{th}$ positions in two such sub block code sets;

interchange an intermediate block code word arranged in the $v^{th}$ position with an intermediate block code word arranged in the $(2^{K-1}-v+1)^{th}$ position in the intermediate block code set, and interchange an intermediate block code word arranged in the $(2^{K-1}+v)^{th}$ position with an intermediate block code word arranged in the $(2^K-v+1)^{th}$ position in the intermediate block code set to generate a sub initial code block, where the initial code block includes x such sub initial code blocks, $v \in [1, 2^{K-2}]$, and $x \geq 1$; and generate a superposition code block including y sub superposition code blocks, so that each sub superposition code block includes $2^K$ superposition code words with a code length $L_1$, where elements on an antidiagonal in a code distance matrix of each sub superposition code block are all q, and remaining non-zero elements are all p, where $q > p > 0$, $y \geq 1$, and the following formulas are satisfied:

$$x:y=(q-p):s, \text{ and}$$

$$x*L_0+y*L_1=L.$$

Optionally, the $a^{th}$ initial code word in the $2^K$ initial code words corresponds to the $a^{th}$ superposition code word in the $2^K$ superposition code words, where a is a positive integer and $a \leq 2^K$.

Optionally, when K=2 and L is an even number, the initial code block includes $2^K$ different initial code words, and each initial code word includes K bits; and the generating unit 720 is specifically configured to generate L/2−1 sub superposition code blocks, where each sub superposition code block includes $2^K$ sub superposition code words, and each sub superposition code word includes two bits; and perform first ordering processing on each sub superposition code block according to the arrangement order of the $2^K$ initial code words in the initial code block, so as to determine an arrangement order of the sub superposition code words in each sub superposition code block, and generate the superposition code block according to each sub superposition code block obtained after the first ordering processing, where a first sub superposition code word arranged in the first position in the $m^{th}$ sub superposition code block obtained after the first ordering processing is any code word in the $m^{th}$ sub superposition code block, and a second sub superposition code word in the $m^{th}$ sub superposition code block is arranged in the $i_1^{th}$ position, where the second sub superposition code word is a code word having a maximum code distance from the first sub superposition code word in the $m^{th}$ sub superposition code block, and for a first local block code set that is formed by m−1 sub superposition code blocks before the $m^{th}$ sub superposition code block and the initial code block and includes $2^K$ local block code words, a first local block code word arranged in the $i_1^{th}$ position is a code word having a minimum code distance from a second local block code word arranged in the first position in the $2^K$ local block code words; or perform second ordering processing on each sub superposition code block according to the arrangement order of the $2^K$ initial code words in the initial code block, so as to determine an arrangement order of the sub superposition code words in each sub superposition code block, and generate the superposition code block according to each sub superposition code block obtained after the second ordering processing, where a third sub superposition code word arranged in the first position in the $m^{th}$ sub superposition code block obtained after the second ordering processing is any code word in the $m^{th}$ sub superposition code block, and a fourth sub superposition code word in the $m^{th}$ sub superposition code block is arranged in the $i_2^{th}$ position, where the fourth sub superposition code word is a code word having a minimum code distance from the third sub superposition code word in the $m^{th}$ sub superposition code block, and for a second local block code set that is formed by m−1 sub superposition code blocks before the $m^{th}$ sub superposition code block and the initial code block and includes $2^K$ local block code words, a third local block code word arranged in the $i_2^{th}$ position is a code word having a maximum code distance from a fourth local block code word arranged in the first position in the $2^K$ local block code words.

Optionally, when K=2 and L is an odd number, the initial code block includes $2^K$ different initial code words, and each initial code word includes K bits; and the generating unit 720 is specifically configured to generate (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks;

perform third ordering processing on each first sub superposition code block according to the arrangement order of the $2^K$ initial code words in the initial code block, so as to determine an arrangement order of the sub superposition code words in each first sub superposition code block, where a fifth sub superposition code word arranged in the first position in the $m^{th}$ first sub superposition code block is any code word in the $m^{th}$ first sub superposition code block, and a sixth sub superposition code word in the $m^{th}$ first sub superposition code block is arranged in the $i_3^{th}$ position, where the sixth sub superposition code word is a code word having a maximum code distance from the fifth sub superposition code word in the $m^{th}$ first sub superposition code block, and for a third local block code set that is formed by m−1 first sub superposition code blocks before the $m^{th}$ sub superposition code block and the initial code block and includes $2^K$ local block code words, a fifth local block code word arranged in the $i_3^{th}$ position is a code word having a minimum code distance from a sixth local block code word arranged in the first position in the $2^K$ local block code words;

in a fourth local block code set that is formed by the first sub superposition code blocks obtained after the third ordering processing and the initial code block and includes $2^K$ local block code words, perform fourth ordering processing on the second sub superposition code block according to an arrangement of the $2^K$ local block code words, where if code distances between the local block code words in the fourth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the fourth local block code set are not completely the same, when a code distance between a seventh local block code word arranged in the $i_4^{th}$ position and an eighth local block code word arranged in the $j_4^{th}$ position is not a maximum code distance in the code distances between the local block code words, a sub superposition code word arranged in the $i_4^{th}$ position is different from a sub superposition code word arranged in the $j_4^{th}$ position in the second sub superposition code block, or when a code distance between a seventh local block code word arranged in the $i_4^{th}$ position and an eighth local block code word arranged in the $j_4^{th}$ position is a maximum code distance in the code distances between the local block code words, a sub superposition code word arranged in the $i_4^{th}$ position is the same as a sub superposition code word arranged in the $j_4^{th}$ position in the second sub superposition code block; and generate the superposition code block according to the first sub superposition code blocks obtained after the third ordering processing and the second sub superposition code block obtained after the fourth ordering processing.

Optionally, when K=2 and L is an odd number, the generating unit 720 is specifically configured to generate (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks;

perform fifth ordering processing on each first sub superposition code block according to the arrangement order of the $2^K$ initial code words in the initial code block, so as to determine an arrangement order of the sub superposition code words in each first sub superposition code block, where a seventh sub superposition code word arranged in the first position in the $m^{th}$ first sub superposition code block is any code word in the $m^{th}$ first sub superposition code block, and an eighth sub superposition code word in the $m^{th}$ first sub superposition code block is arranged in the $i_5^{th}$ position, where the eighth sub superposition code word is a code word having a minimum code distance from the seventh sub superposition code word in the $m^{th}$ first sub superposition code block, and for a fifth local block code set that is formed by m−1 first sub superposition code blocks before the $m^{th}$ sub superposition code block and the initial code block and includes $2^K$ local block code words, a ninth local block code word arranged in the $i_5^{th}$ position is a code word having a maximum code distance from a tenth local block code word arranged in the first position in the $2^K$ local block code words;

in a sixth local block code set that is formed by the first sub superposition code blocks obtained after the fifth ordering processing and the initial code block and includes $2^K$ local block code words, perform sixth ordering processing on the second sub superposition code block according to an arrangement of the $2^K$ local block code words, where if code distances between the local block code words in the sixth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the sixth local block code set are not completely the same, when a code distance between an eleventh local block code word arranged in the $i_6^{th}$ position and a twelfth local block code word arranged in the $j_6^{th}$ position is not a maximum code distance in the code distances between the local block code words, a sub superposition code word arranged in the $i_6^{th}$ position is different from a sub superposition code word arranged in the $j_6^{th}$ position in the second sub superposition code block, or when a code distance between an eleventh local block code word arranged in the $i_6^{th}$ position and a twelfth local block code word arranged in the $j_6^{th}$ position is a maximum code distance in the code distances between the local block code words, a sub superposition code word arranged in the $i_6^{th}$ position is the same as a sub superposition code word arranged in the $j_6^{th}$ position in the second sub superposition code block; and generate the superposition code block according to the first sub superposition code blocks obtained after the fifth ordering processing and the second sub superposition code block obtained after the sixth ordering processing.

Optionally, the generating unit 720 is specifically configured to generate the superposition code block according to the target code length and the arrangement order of the $2^K$ initial code words in the initial code block, where the superposition code block includes t sub superposition code blocks, and each sub superposition code block includes $2^K$ sub superposition code words, where for a target local block code set that is formed by the initial code block and $t_0$ sub superposition code blocks and includes $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, where the $t_0$ sub superposition code blocks include a sub superposition code block arranged in the first position to a sub superposition code block arranged in the $t_0^{th}$ position in the t sub superposition code blocks, t≥1, and $t_0 \in [1, t]$.

Optionally, when t≥2, the target block code word includes a target initial code word that is in the initial code block and corresponding to the original code word, and a target sub superposition code word that is in each sub superposition code block and corresponding to the original code word; and the receiving unit 730 is specifically configured to receive a first sub target block code word at a first time, where the first sub target block code word includes the target initial code word and target sub superposition code words in a sub superposition code block arranged in the first position to a sub superposition code block arranged in the $c_1^{th}$ position in the sub superposition code blocks, where $c_1 \geq 1$; and receive a second sub target block code word at a second time, where the second sub target block code word includes target sub superposition code words in a sub superposition code block arranged in the $c_2^{th}$ position to a sub superposition code block arranged in the $c_3^{th}$ position in the sub superposition code blocks, where the second time is later than the first time, $c_2 = c_1 + 1$, and $c_3 \leq t$.

Optionally, the determining unit 710 is further configured to determine a target average value at the second time, where a target code distance is an average value of minimum code distances between at least one receive code word received by the receive end and block code words in a first block code set, the at least one receive code word includes a first receive code word corresponding to the first sub target block code word, and a quantity of bits included in each block code word in the first block code set is the same as a quantity of bits included in each receive code word; and determine code distance information according to the target average value; and the apparatus 700 further includes:

a transmitting unit 750, configured to transmit the code distance information to the transmit end.

Optionally, the determining unit 710 is specifically configured to determine, according to the target average value e and a target threshold f, code distance information that is used to indicate the target code distance d, where $d > e/f$, and $0 \leq f < 0.5$.

Optionally, the target threshold f is determined according to a status of a channel between the transmit end and the apparatus 700.

Optionally, the determining unit 710 is specifically configured to determine the code distance information according to the target average value, where the code distance information is used to indicate the target average value e.

Optionally, the generating unit 720 is further configured to interchange the $a^{th}$ bit with the $b^{th}$ bit of each block code word in the block code set.

The data transmission apparatus 700 according to this embodiment of the present invention may correspond to an entity that implements the data transmission method 500 according to an embodiment of the present invention. In addition, the units in the data transmission apparatus 700 and the foregoing other operations and/or functions are respectively intended to implement the corresponding processes in the method 500 in FIG. 7, and details are not repeated herein for brevity.

In the data transmission apparatus according to this embodiment of the present invention, code distances between block code words in a block code set are the same or have a difference of ±1, a transmit end performs coding according to the block code set, and a receive end performs decoding according to the block code set, which can improve an error correction capability during decoding.

Figure 10:
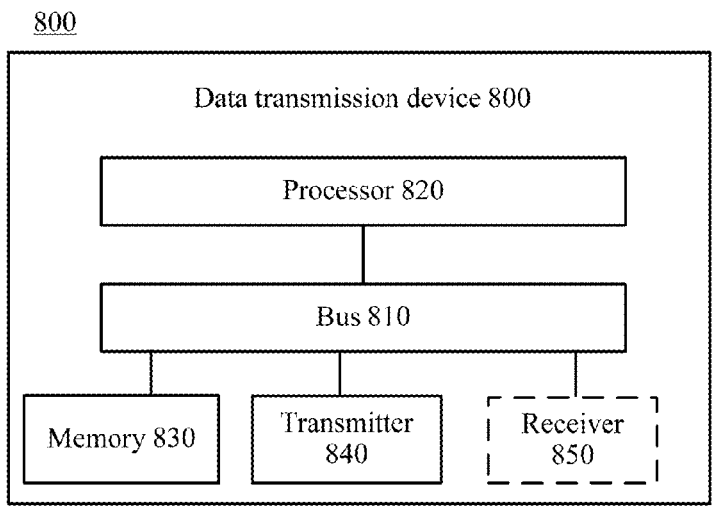
FIG. 10 is a schematic diagram of a device that can use the foregoing data transmission in a wireless communications environment.

FIG. 10 is a schematic diagram of a device 800 that can use the foregoing data transmission in a wireless communications environment. As shown in FIG. 10, the device 800 includes:

a bus 810;

a processor 820 connected to the bus 810;

a memory 830 connected to the bus 810; and a transmitter 840 connected to the bus 810.

The processor 820 invokes, by using the bus 810, a program stored in the memory 830, so that the processor is configured to determine a target code length L, where the target code length is a quantity of bits included in each block code word in a block code set to be generated, and L≥3;

determine an original code length K, where the original code length is a quantity of bits included in an original code word to be transmitted to a receive end, and L>K≥2;

generate an initial code block according to the original code length K, where the initial code block includes $2^K$ initial code words;

generate a superposition code block according to the target code length and an arrangement order of the $2^K$ initial code words in the initial code block, where the superposition code block includes $2^K$ superposition code words, and the $2^K$ initial code words correspond to the $2^K$ superposition code words in a one-to-one manner, and superpose the initial code words and the corresponding superposition code words to generate the block code words in the block code set, so that a difference between feature code distances in the block code set is ±1 or 0, where the feature code distance is a code distance between the block code words;

perform coding processing on the original code word according to the block code set, so as to determine, from the block code words in the block code set, a target block code word corresponding to the original code word; and control the transmitter 840 to transmit the target block code word to the receive end.

Optionally, when K≤3, the initial code block includes $2^K$ different initial code words, and each initial code word includes K bits; and the processor 820 is specifically configured to determine a maximum code distance w between the superposition code words in the superposition code block according to the target code length L and the original code length K; and generate the superposition code block according to the arrangement order of the $2^K$ initial code words in the initial code block and the maximum code distance between the superposition code words in the superposition code block.

Optionally, the processor 820 is specifically configured to:

when K=2, if L is an integer multiple of 3, determine that the maximum code distance w between the superposition code words in the superposition code block is equal to 2L/3;

when K=2, if L is not an integer multiple of 3, determine that the maximum code distance w between the superposition code words in the superposition code block is equal to [2L/3]+1, where [2L/3] is a maximum integer that is less than or equal to 2L/3; and when K=3, determine that the maximum code distance w between the superposition code words in the superposition code block is equal to [4L/7], where [4L/7] is a maximum integer that is less than or equal to 4L/7.

Optionally, when K≥4, the processor 820 is specifically configured to determine a sub block code set, where the sub block code set includes $2^{K-1}$ sub block code words, a quantity of bits included in each sub block code word is $L_0$, the sub block code set is generated according to a first initial code block and a first superposition code block, the first initial code block includes $2^{K-1}$ different first initial code words, each first initial code word includes K−1 bits, the first superposition code block is determined according to the quantity $L_0$ of bits included in the sub block code word and an arrangement order of the $2^{K-1}$ first initial code words in the first initial code block, the superposition code block includes $2^{K-1}$ superposition code words, each superposition code word includes $L_0$−K+1 bits, and in the sub block code set, code distances between code words are all s, where $L_0$<L;

superpose four such sub block code sets to generate an intermediate block code set, where the intermediate block code set includes $2^K$ intermediate block code words, and intermediate block code words arranged in the $z^{th}$ and $(z+2^{K-1})^{th}$ positions in the intermediate block code set are formed by superposition of sub block code words arranged in the $z^{th}$ positions in two such sub block code sets;

interchange an intermediate block code word arranged in the $v^{th}$ position with an intermediate block code word arranged in the $(2^{K-1}-v+1)^{th}$ position in the intermediate block code set, and interchange an intermediate block code word arranged in the $(2^{K-1}+v)^{th}$ position with an intermediate block code word arranged in the $(2^K-v+1)^{th}$ position in the intermediate block code set to generate a sub initial code block, where the initial code block includes x such sub initial code blocks, v ∈ [1, $2^{K-2}$], and x≥1; and generate a superposition code block including y sub superposition code blocks, so that each sub superposition code block includes $2^K$ superposition code words with a code length $L_1$, where elements on an antidiagonal in a code distance matrix of each sub superposition code block are all q, and remaining non-zero elements are all p, where q>p>0, y≥1, and the following formulas are satisfied:

$x{:}y=(q-p){:}s$, and $x*L_0+y*L_1=L$.

Optionally, the $a^{th}$ initial code word in the $2^K$ initial code words corresponds to the $a^{th}$ superposition code word in the $2^K$ superposition code words, where a is a positive integer and a≤$2^K$.

Optionally, when K=2 and L is an even number, the initial code block includes $2^K$ different initial code words, and each initial code word includes K bits; and the processor 820 is specifically configured to generate L/2−1 sub superposition code blocks, where each sub superposition code block includes $2^K$ sub superposition code words, and each sub superposition code word includes two bits; and perform first ordering processing on each sub superposition code block according to the arrangement order of the $2^K$ initial code words in the initial code block, so as to determine an arrangement order of the sub superposition code words in each sub superposition code block, and generate the superposition code block according to each sub superposition code block obtained after the first ordering processing, where a first sub superposition code word arranged in the first position in the $m^{th}$ sub superposition code block obtained after the first ordering processing is any code word in the $m^{th}$ sub superposition code block, and a second sub superposition code word in the $m^{th}$ sub superposition code block is arranged in the $i_1^{th}$ position, where the second sub superposition code word is a code word having a maximum code distance from the first sub superposition code word in the $m^{th}$ sub superposition code block, and for a first local block code set that is formed by m−1 sub superposition code blocks before the $m^{th}$ sub superposition code block and the initial code block and includes $2^K$ local block code words, a first local block code word arranged in the $i_1^{th}$ position is a code word having a minimum code distance from a second local block code word arranged in the first position in the $2^K$ local block code words; or perform second ordering processing on each sub superposition code block according to the arrangement order of the $2^K$ initial code words in the initial code block, so as to determine an arrangement order of the sub superposition code words in each sub superposition code block, and generate the superposition code block according to each sub superposition code block obtained after the second ordering processing, where a third sub superposition code word arranged in the first position in the $m^{th}$ sub superposition code block obtained after the second ordering processing is any code word in the $m^{th}$ sub superposition code block, and a fourth sub superposition code word in the $m^{th}$ sub superposition code block is arranged in the $i_2^{th}$ position, where the fourth sub superposition code word is a code word having a minimum code distance from the third sub superposition code word in the $m^{th}$ sub superposition code block, and for a second local block code set that is formed by m−1 sub superposition code blocks before the $m^{th}$ sub superposition code block and the initial code block and includes $2^K$ local block code words, a third local block code word arranged in the $i_2^{th}$ position is a code word having a maximum code distance from a fourth local block code word arranged in the first position in the $2^K$ local block code words.

Optionally, when K=2 and L is an odd number, the initial code block includes $2^K$ different initial code words, and each initial code word includes K bits; and the processor 820 is specifically configured to generate (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks;

perform third ordering processing on each first sub superposition code block according to the arrangement order of the $2^K$ initial code words in the initial code block, so as to determine an arrangement order of the sub superposition code words in each first sub superposition code block, where a fifth sub superposition code word arranged in the first position in the $m^{th}$ first sub superposition code block is any code word in the $m^{th}$ first sub superposition code block, and a sixth sub superposition code word in the $m^{th}$ first sub superposition code block is arranged in the $i_3^{th}$ position, where the sixth sub superposition code word is a code word having a maximum code distance from the fifth sub superposition code word in the $m^{th}$ first sub superposition code block, and for a third local block code set that is formed by m−1 first sub superposition code blocks before the $m^{th}$ sub superposition code block and the initial code block and includes $2^K$ local block code words, a fifth local block code word arranged in the $i_3^{th}$ position is a code word having a minimum code distance from a sixth local block code word arranged in the first position in the $2^K$ local block code words;

in a fourth local block code set that is formed by the first sub superposition code blocks obtained after the third ordering processing and the initial code block and includes $2^K$ local block code words, perform fourth ordering processing on the second sub superposition code block according to an arrangement of the $2^K$ local block code words, where if code distances between the local block code words in the fourth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the fourth local block code set are not completely the same, when a code distance between a seventh local block code word arranged in the $i_4^{th}$ position and an eighth local block code word arranged in the $j_4^{th}$ position is not a maximum code distance in the code distances between the local block code words, a sub superposition code word arranged in the $i_4^{th}$ position is different from a sub superposition code word arranged in the $j_4^{th}$ position in the second sub superposition code block, or when a code distance between a seventh local block code word arranged in the $i_4^{th}$ position and an eighth local block code word arranged in the $j_4^{th}$ position is a maximum code distance in the code distances between the local block code words, a sub superposition code word arranged in the $i_4^{th}$ position is the same as a sub superposition code word arranged in the $j_4^{th}$ position in the second sub superposition code block; and generate the superposition code block according to the first sub superposition code blocks obtained after the third ordering processing and the second sub superposition code block obtained after the fourth ordering processing.

Optionally, when K=2 and L is an odd number, the processor 820 is specifically configured to generate (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks;

perform fifth ordering processing on each first sub superposition code block according to the arrangement order of the $2^K$ initial code words in the initial code block, so as to determine an arrangement order of the sub superposition code words in each first sub superposition code block, where a seventh sub superposition code word arranged in the first position in the $m^{th}$ first sub superposition code block is any code word in the $m^{th}$ first sub superposition code block, and an eighth sub superposition code word in the $m^{th}$ first sub superposition code block is arranged in the $i_5^{th}$ position, where the eighth sub superposition code word is a code word having a minimum code distance from the seventh sub superposition code word in the $m^{th}$ first sub superposition code block, and for a fifth local block code set that is formed by m−1 first sub superposition code blocks before the $m^{th}$ sub superposition code block and the initial code block and includes $2^K$ local block code words, a ninth local block code word arranged in the $i_5^{th}$ position is a code word having a maximum code distance from a tenth local block code word arranged in the first position in the $2^K$ local block code words;

in a sixth local block code set that is formed by the first sub superposition code blocks obtained after the fifth ordering processing and the initial code block and includes $2^K$ local block code words, perform sixth ordering processing on the second sub superposition code block according to an arrangement of the $2^K$ local block code words, where if code distances between the local block code words in the sixth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the sixth local block code set are not completely the same, when a code distance between an eleventh local block code word arranged in the $i_6^{th}$ position and a twelfth local block code word arranged in the $j_6^{th}$ position is not a maximum code distance in the code distances between the local block code words, a sub superposition code word arranged in the $i_6^{th}$ position is different from a sub superposition code word arranged in the $j_6^{th}$ position in the second sub superposition code block, or when a code distance between an eleventh local block code word arranged in the $i_6^{th}$ position and a twelfth local block code word arranged in the $j_6^{th}$ position is a maximum code distance in the code distances between the local block code words, a sub superposition code word arranged in the $i_6^{th}$ position is the same as a sub superposition code word arranged in the $j_6^{th}$ position in the second sub superposition code block; and generate the superposition code block according to the first sub superposition code blocks obtained after the fifth ordering processing and the second sub superposition code block obtained after the sixth ordering processing.

Optionally, the processor 820 is specifically configured to generate the superposition code block according to the target code length and the arrangement order of the $2^K$ initial code words in the initial code block, where the superposition code block includes t sub superposition code blocks, and each sub superposition code block includes $2^K$ sub superposition code words, where for a target local block code set that is formed by the initial code block and $t_0$ sub superposition code blocks and includes $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, where the $t_0$ sub superposition code blocks include a sub superposition code block arranged in the first position to a sub superposition code block arranged in the $t_0{}^{th}$ position in the t sub superposition code blocks, $t \geq 1$, and $t_0 \in [1, t]$.

Optionally, when $t \geq 2$, the target block code word includes a target initial code word that is in the initial code block and corresponding to the original code word, and a target sub superposition code word that is in each sub superposition code block and corresponding to the original code word; and the processor 820 is specifically configured to control, at a first time, the transmitter 840 to transmit a first sub target block code word, where the first sub target block code word includes the target initial code word and target sub superposition code words in a sub superposition code block arranged in the first position to a sub superposition code block arranged in the $c_1{}^{th}$ position in the sub superposition code blocks, where $c_1 \geq 1$; and control, at a second time, the transmitter 840 to transmit a second sub target block code word, where the second sub target block code word includes target sub superposition code words in a sub superposition code block arranged in the $c_2{}^{th}$ position to a sub superposition code block arranged in the $c_3{}^{th}$ position in the sub superposition code blocks, where the second time is later than the first time, $C_2 = C_{1+1}$, and $c_3 \leq t$.

Optionally, the device 800 further includes a receiver 850, and the processor 820 is specifically configured to control the receiver 850 to receive code distance information transmitted by the receive end, where the code distance information is determined by the receive end according to a target average value, a target code distance is an average value of minimum code distances between at least one receive code word received by the receive end and block code words in a first block code set, the at least one receive code word includes a first receive code word corresponding to the first sub target block code word, and a quantity of bits included in each block code word in the first block code set is the same as a quantity of bits included in each receive code word; and determine the target code distance according to the target code distance information; and the transmitter 840 is specifically configured to:

determine the second sub target block code word according to the target code distance, so that in a first target local block code set that is formed by the initial code block and $c_3$ sub superposition code blocks and includes $2^K$ first target local block code words, a minimum value of code distances between the first target local block code words is greater than the target code distance.

Optionally, the code distance information is used to indicate the target code distance, where the target code distance d is determined by the receive end according to the target average value e and a target threshold f, where $d > e/f$, and $0 \leq f < 0.5$.

Optionally, the code distance information is used to indicate the target average value, and the processor 820 is specifically configured to determine the target code distance d according to the target average value e and a target threshold f, where $d > e/f$, and $0 \leq f < 0.5$.

Optionally, the target threshold f is determined according to a status of a channel between the device 800 and the receive end.

Optionally, the processor 820 is further configured to interchange the $a^{th}$ bit with the $b^{th}$ bit of each block code word in the block code set.

In this embodiment of the present invention, the processor may also be referred to as a CPU. The memory may include a read-only memory and a random access memory, and provide an instruction and a signal to the processor. A part of the memory may further include a non-volatile random access memory (NVRAM). In a specific application, the data transmission device may be built in or may be, for example, a standard Ethernet communications device such as a personal computer; modules of the data transmission device are coupled together by using a bus system, where the bus system further includes a power bus, a control bus, and a status signal bus in addition to a signal bus.

The processor may implement or execute steps and logical block diagrams disclosed in the method embodiments of the present invention. A general purpose processor may be a microprocessor, or the processor may be any conventional processor, decoder, or the like. Steps of the methods disclosed with reference to the embodiments of the present invention may be directly executed and completed by means of a hardware processor, or may be executed and completed by using a combination of hardware and software modules in the decoder. The software modules may be located in a mature storage medium in the art, such as a random access memory, a flash memory, a read-only memory, a programmable read-only memory, an electrically-erasable programmable memory, or a register. The storage medium is located in the memory, and a decoding unit or a processing unit reads information in the memory and completes the steps in the foregoing methods in combination with hardware of the decoding unit or the processing unit.

It should be understood that in the embodiments of the present invention, the processor may be a central processing unit (Central Processing Unit, "CPU" for short), or the processor may be another general purpose processor, a digital signal processor (DSP), an application-specific integrated circuit (ASIC), a field programmable gate array (FPGA), or another programmable logical device, discrete gate or transistor logical device, discrete hardware component, or the like. The general purpose processor may be a microprocessor, or the processor may be any conventional processor or the like.

In an implementation process, each step of the foregoing methods may be completed by using an integrated logic circuit of hardware in the processor or an instruction in a form of software. Steps of the methods disclosed with reference to the embodiments of the present invention may be directly executed and completed by a hardware processor, or may be executed and completed by using a combination of hardware and software modules in the processor. The software modules may be located in a mature storage medium in the art, such as a random access memory, a flash memory, a read-only memory, a programmable read-only memory, an electrically-erasable programmable memory, or a register. The storage medium is located in the memory, and the processor reads information in the memory and completes the steps in the foregoing methods in combination with hardware of the processor. To avoid repetition, details are not described herein again.

The data transmission device 800 according to this embodiment of the present invention may correspond to the transmit end in the method embodiment of the present invention, and furthermore, each unit, namely, each module, in the data transmission device 800 and the foregoing other operations and/or functions are respectively intended to implement the corresponding processes in the method 300 in FIG. 3, and details are not repeated herein for brevity.

In the data transmission device according to this embodiment of the present invention, code distances between block code words in a block code set are the same or have a difference of ±1, a transmit end performs coding according to the block code set, and a receive end performs decoding according to the block code set, which can improve an error correction capability during decoding.

Figure 11:
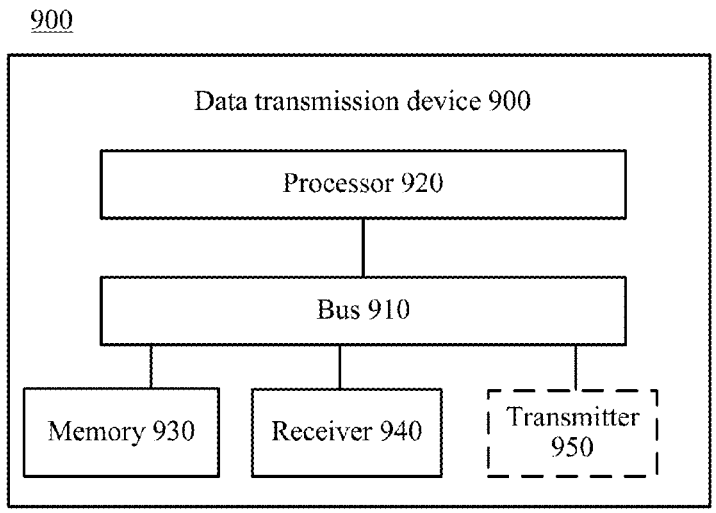
FIG. 11 is a schematic diagram of another device that can use the foregoing data transmission in a wireless communications environment.

FIG. 11 is a schematic diagram of another device 900 that can use the foregoing data transmission method in a wireless communications environment. As shown in FIG. 13, the device 900 includes:

a bus 910;

a processor 920 connected to the bus 910;

a memory 930 connected to the bus 910; and a receiver 940 connected to the bus 910.

The processor 920 invokes, by using the bus 910, a program stored in the memory 930, so that the processor is configured to determine a target code length L and an original code length K, where the target code length is a quantity of bits included in each block code word in a block code set to be generated, the original code length is a quantity of bits included in an original code word, L≥3, and L>K≥2;

configured to generate an initial code block according to the original code length K, where the initial code block includes $2^K$ initial code words, generate a superposition code block according to the target code length and an arrangement order of the $2^K$ initial code words in the initial code block, where the superposition code block includes $2^K$ superposition code words, and the $2^K$ initial code words correspond to the $2^K$ superposition code words in a one-to-one manner, and superpose the initial code words and the corresponding superposition code words to generate the block code words in the block code set, so that a difference between feature code distances in the block code set is ±1 or 0, where the feature code distance is a code distance between the block code words;

configured to control the receiver 940 to receive a target block code word transmitted by a transmit end and corresponding to the original code word, where the target block code word is determined from the block code words in the block code set by the transmit end by performing coding processing on the original code word according to the block code set; and configured to perform decoding processing on the target block code word according to the block code set to acquire the original code word.

Optionally, when K≤3, the initial code block includes $2^K$ different initial code words, and each initial code word includes K bits; and the processor 920 is specifically configured to determine a maximum code distance w between the superposition code words in the superposition code block according to the target code length L and the original code length K; and generate the superposition code block according to the arrangement order of the $2^K$ initial code words in the initial code block and the maximum code distance between the superposition code words in the superposition code block.

Optionally, the processor 920 is specifically configured to:

when K=2, if L is an integer multiple of 3, determine that the maximum code distance w between the superposition code words in the superposition code block is equal to 2L/3;

when K=2, if L is not an integer multiple of 3, determine that the maximum code distance w between the superposition code words in the superposition code block is equal to [2L/3]+1, where [2L/3] is a maximum integer that is less than or equal to 2L/3; and when K=3, determine that the maximum code distance w between the superposition code words in the superposition code block is equal to [4L/7], where [4L/7] is a maximum integer that is less than or equal to 4L/7.

Optionally, when K≥4, the processor 920 is specifically configured to determine a sub block code set, where the sub block code set includes $2^{K-1}$ sub block code words, a quantity of bits included in each sub block code word is $L_0$, the sub block code set is generated according to a first initial code block and a first superposition code block, the first initial code block includes $2^{K-1}$ different first initial code words, each first initial code word includes K−1 bits, the first superposition code block is determined according to the quantity $L_0$ of bits included in the sub block code word and an arrangement order of the $2^{K-1}$ first initial code words in the first initial code block, the superposition code block includes $2^{K-1}$ superposition code words, each superposition code word includes $L_0-K+1$ bits, and in the sub block code set, code distances between code words are all s, where $L_0<L$;

superpose four such sub block code sets to generate an intermediate block code set, where the intermediate block code set includes $2^K$ intermediate block code words, and intermediate block code words arranged in the $z^{th}$ and $(z+2^{K-1})^{th}$ positions in the intermediate block code set are formed by superposition of sub block code words arranged in the $z^{th}$ positions in two such sub block code sets;

interchange an intermediate block code word arranged in the $v^{th}$ position with an intermediate block code word arranged in the $(2^{K-1}-v+1)^{th}$ position in the intermediate block code set, and interchange an intermediate block code word arranged in the $(2^{K-1}+v)^{th}$ position with an intermediate block code word arranged in the $(2^K-v+1)^{th}$ position in the intermediate block code set to generate a sub initial code block, where the initial code block includes x such sub initial code blocks, $v \in [1, 2^{K-2}]$, and x≥1; and generate a superposition code block including y sub superposition code blocks, so that each sub superposition code block includes $2^K$ superposition code words with a code length $L_1$, where elements on an antidiagonal in a code distance matrix of each sub superposition code block are all q, and remaining non-zero elements are all p, where q>p>0, y≥1, and the following formulas are satisfied:

$$x:y=(q-p):s, \text{ and}$$

$$x*L_0+y*L_1=L.$$

Optionally, the $a^{th}$ initial code word in the $2^K$ initial code words corresponds to the $a^{th}$ superposition code word in the $2^K$ superposition code words, where a is a positive integer and $a \leq 2^K$.

Optionally, when K=2 and L is an even number, the initial code block includes $2^K$ different initial code words, and each initial code word includes K bits; and the processor 920 is specifically configured to generate L/2−1 sub superposition code blocks, where each sub superposition code block includes $2^K$ sub superposition code words, and each sub superposition code word includes two bits; and perform first ordering processing on each sub superposition code block according to the arrangement order of the $2^K$ initial code words in the initial code block, so as to determine an arrangement order of the sub superposition code words in each sub superposition code block, and generate the superposition code block according to each sub superposition code block obtained after the first ordering processing, where a first sub superposition code word arranged in the first position in the $m^{th}$ sub superposition code block obtained after the first ordering processing is any code word in the $m^{th}$ sub superposition code block, and a second sub superposition code word in the $m^{th}$ sub superposition code block is arranged in the $i_1^{th}$ position, where the second sub superposition code word is a code word having a maximum code distance from the first sub superposition code word in the $m^{th}$ sub superposition code block, and for a first local block code set that is formed by m−1 sub superposition code blocks before the $m^{th}$ sub superposition code block and the initial code block and includes $2^K$ local block code words, a first local block code word arranged in the $i_1^{th}$ position is a code word having a minimum code distance from a second local block code word arranged in the first position in the $2^K$ local block code words; or perform second ordering processing on each sub superposition code block according to the arrangement order of the $2^K$ initial code words in the initial code block, so as to determine an arrangement order of the sub superposition code words in each sub superposition code block, and generate the superposition code block according to each sub superposition code block obtained after the second ordering processing, where a third sub superposition code word arranged in the first position in the $m^{th}$ sub superposition code block obtained after the second ordering processing is any code word in the $m^{th}$ sub superposition code block, and a fourth sub superposition code word in the $m^{th}$ sub superposition code block is arranged in the $i_2^{th}$ position, where the fourth sub superposition code word is a code word having a minimum code distance from the third sub superposition code word in the $m^{th}$ sub superposition code block, and for a second local block code set that is formed by m−1 sub superposition code blocks before the $m^{th}$ sub superposition code block and the initial code block and includes $2^K$ local block code words, a third local block code word arranged in the $i_2^{th}$ position is a code word having a maximum code distance from a fourth local block code word arranged in the first position in the $2^K$ local block code words.

Optionally, when K=2 and L is an odd number, the initial code block includes $2^K$ different initial code words, and each initial code word includes K bits; and the processor 920 is specifically configured to generate (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks;

perform third ordering processing on each first sub superposition code block according to the arrangement order of the $2^K$ initial code words in the initial code block, so as to determine an arrangement order of the sub superposition code words in each first sub superposition code block, where a fifth sub superposition code word arranged in the first position in the $m^{th}$ first sub superposition code block is any code word in the $m^{th}$ first sub superposition code block, and a sixth sub superposition code word in the $m^{th}$ first sub superposition code block is arranged in the $i_3^{th}$ position, where the sixth sub superposition code word is a code word having a maximum code distance from the fifth sub superposition code word in the $m^{th}$ first sub superposition code block, and for a third local block code set that is formed by m−1 first sub superposition code blocks before the $m^{th}$ sub superposition code block and the initial code block and includes $2^K$ local block code words, a fifth local block code word arranged in the $i_3^{th}$ position is a code word having a minimum code distance from a sixth local block code word arranged in the first position in the $2^K$ local block code words;

in a fourth local block code set that is formed by the first sub superposition code blocks obtained after the third ordering processing and the initial code block and includes $2^K$ local block code words, perform fourth ordering processing on the second sub superposition code block according to an arrangement of the $2^K$ local block code words, where if code distances between the local block code words in the fourth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the fourth local block code set are not completely the same, when a code distance between a seventh local block code word arranged in the $i_4^{th}$ position and an eighth local block code word arranged in the $j_4^{th}$ position is not a maximum code distance in the code distances between the local block code words, a sub superposition code word arranged in the $i_4^{th}$ position is different from a sub superposition code word arranged in the $j_4^{th}$ position in the second sub superposition code block, or when a code distance between a seventh local block code word arranged in the $i_4^{th}$ position and an eighth local block code word arranged in the $j_4^{th}$ position is a maximum code distance in the code distances between the local block code words, a sub superposition code word arranged in the $i_4^{th}$ position is the same as a sub superposition code word arranged in the $j_4^{th}$ position in the second sub superposition code block; and generate the superposition code block according to the first sub superposition code blocks obtained after the third ordering processing and the second sub superposition code block obtained after the fourth ordering processing.

Optionally, when K=2 and L is an odd number, the processor 920 is specifically configured to generate (L−1)/2 sub superposition code blocks, where a first sub superposition code block includes $2^K$ sub superposition code words, each sub superposition code word includes two bits, and first sub superposition code blocks are the first (L−1)/2−1 sub superposition code blocks in the (L−1)/2 sub superposition code blocks; and a second sub superposition code block includes $2^K$ sub superposition code words, each sub superposition code word includes one bit, and the second sub superposition code block is a last sub superposition code block in the (L−1)/2 sub superposition code blocks;

perform fifth ordering processing on each first sub superposition code block according to the arrangement order of the $2^K$ initial code words in the initial code block, so as to determine an arrangement order of the sub superposition code words in each first sub superposition code block, where a seventh sub superposition code word arranged in the first position in the $m^{th}$ first sub superposition code block is any code word in the $m^{th}$ first sub superposition code block, and an eighth sub superposition code word in the $m^{th}$ first sub superposition code block is arranged in the $i_5{}^{th}$ position, where the eighth sub superposition code word is a code word having a minimum code distance from the seventh sub superposition code word in the $m^{th}$ first sub superposition code block, and for a fifth local block code set that is formed by $m-1$ first sub superposition code blocks before the $m^{th}$ sub superposition code block and the initial code block and includes $2^K$ local block code words, a ninth local block code word arranged in the $i_5{}^{th}$ position is a code word having a maximum code distance from a tenth local block code word arranged in the first position in the $2^K$ local block code words;

in a sixth local block code set that is formed by the first sub superposition code blocks obtained after the fifth ordering processing and the initial code block and includes $2^K$ local block code words, perform sixth ordering processing on the second sub superposition code block according to an arrangement of the $2^K$ local block code words, where if code distances between the local block code words in the sixth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the sixth local block code set are not completely the same, when a code distance between an eleventh local block code word arranged in the $i_6{}^{th}$ position and a twelfth local block code word arranged in the $j_6{}^{th}$ position is not a maximum code distance in the code distances between the local block code words, a sub superposition code word arranged in the $i_6{}^{th}$ position is different from a sub superposition code word arranged in the $j_6{}^{th}$ position in the second sub superposition code block, or when a code distance between an eleventh local block code word arranged in the $i_6{}^{th}$ position and a twelfth local block code word arranged in the $j_6{}^{th}$ position is a maximum code distance in the code distances between the local block code words, a sub superposition code word arranged in the $i_6{}^{th}$ position is the same as a sub superposition code word arranged in the $j_6{}^{th}$ position in the second sub superposition code block; and generate the superposition code block according to the first sub superposition code blocks obtained after the fifth ordering processing and the second sub superposition code block obtained after the sixth ordering processing.

Optionally, the processor 920 is specifically configured to generate the superposition code block according to the target code length and the arrangement order of the $2^K$ initial code words in the initial code block, where the superposition code block includes t sub superposition code blocks, and each sub superposition code block includes $2^K$ sub superposition code words, where for a target local block code set that is formed by the initial code block and $t_0$ sub superposition code blocks and includes $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, where the $t_0$ sub superposition code blocks include a sub superposition code block arranged in the first position to a sub superposition code block arranged in the $t_0{}^{th}$ position in the t sub superposition code blocks, $t \geq 1$, and $t_0 \in [1, t]$.

Optionally, when $t \geq 2$, the target block code word includes a target initial code word that is in the initial code block and corresponding to the original code word, and a target sub superposition code word that is in each sub superposition code block and corresponding to the original code word; and the processor 920 is specifically configured to control, at a first time, the receiver 940 to receive a first sub target block code word, where the first sub target block code word includes the target initial code word and target sub superposition code words in a sub superposition code block arranged in the first position to a sub superposition code block arranged in the $c_1{}^{th}$ position in the sub superposition code blocks, where $c_1 \geq 1$; and control, at a second time, the receiver 940 to receive a second sub target block code word, where the second sub target block code word includes target sub superposition code words in a sub superposition code block arranged in the $c_2{}^{th}$ position to a sub superposition code block arranged in the $c_3{}^{th}$ position in the sub superposition code blocks, where the second time is later than the first time, $C_2 = c_1 + 1$, and $c_3 \leq t$.

Optionally, the processor 920 is further configured to determine a target average value at the second time, where a target code distance is an average value of minimum code distances between at least one receive code word received by the receive end and block code words in a first block code set, the at least one receive code word includes a first receive code word corresponding to the first sub target block code word, and a quantity of bits included in each block code word in the first block code set is the same as a quantity of bits included in each receive code word; and determine code distance information according to the target average value; and the device 900 further includes:

a transmitter 950, configured to transmit the code distance information to the transmit end.

Optionally, the processor 920 is specifically configured to determine, according to the target average value e and a target threshold f, code distance information that is used to indicate the target code distance d, where $d > e/f$, and $0 < f < 0.5$.

Optionally, the target threshold f is determined according to a status of a channel between the transmit end and the device 900.

Optionally, the processor 920 is specifically configured to determine the code distance information according to the target average value, where the code distance information is used to indicate the target average value e.

Optionally, the processor 920 is further configured to interchange the $a^{th}$ bit with the $b^{th}$ bit of each block code word in the block code set.

In this embodiment of the present invention, the processor may also be referred to as a CPU. The memory may include a read-only memory and a random access memory, and provide an instruction and a signal to the processor. A part of the memory may further include a non-volatile random access memory (NVRAM). In a specific application, the data transmission device may be built in or may be, for example, a standard Ethernet communications device such as a personal computer; modules of the data transmission device are coupled together by using a bus system, where the bus system further includes a power bus, a control bus, and a status signal bus in addition to a signal bus.

The processor may implement or execute steps and logical block diagrams disclosed in the method embodiments of the present invention. A general purpose processor may be a microprocessor, or the processor may be any conventional processor, decoder, or the like. Steps of the methods disclosed with reference to the embodiments of the present invention may be directly executed and completed by means of a hardware processor, or may be executed and completed by using a combination of hardware and software modules in the decoder. The software modules may be located in a mature storage medium in the art, such as a random access memory, a flash memory, a read-only memory, a programmable read-only memory, an electrically-erasable programmable memory, or a register. The storage medium is located in the memory, and a decoding unit or a processing unit reads information in the memory and completes the steps in the foregoing methods in combination with hardware of the decoding unit or the processing unit.

It should be understood that in the embodiments of the present invention, the processor may be a central processing unit (Central Processing Unit, "CPU" for short), or the processor may be another general purpose processor, a digital signal processor (DSP), an application-specific integrated circuit (ASIC), a field programmable gate array (FPGA), or another programmable logical device, discrete gate or transistor logical device, discrete hardware component, or the like. The general purpose processor may be a microprocessor, or the processor may be any conventional processor or the like.

In an implementation process, each step of the foregoing methods may be completed by using an integrated logic circuit of hardware in the processor or an instruction in a form of software. Steps of the methods disclosed with reference to the embodiments of the present invention may be directly executed and completed by a hardware processor, or may be executed and completed by using a combination of hardware and software modules in the processor. The software modules may be located in a mature storage medium in the art, such as a random access memory, a flash memory, a read-only memory, a programmable read-only memory, an electrically-erasable programmable memory, or a register. The storage medium is located in the memory, and the processor reads information in the memory and completes the steps in the foregoing methods in combination with hardware of the processor. To avoid repetition, details are not described herein again.

The data transmission device 900 according to this embodiment of the present invention may correspond to an entity that implements the data transmission method 500 according to an embodiment of the present invention. In addition, the units in the data transmission device 900 and the foregoing other operations and/or functions are respectively intended to implement the corresponding processes in the method 500 in FIG. 7, and details are not repeated herein for brevity.

In the data transmission device according to this embodiment of the present invention, code distances between block code words in a block code set are the same or have a difference of ±1, a transmit end performs coding according to the block code set, and a receive end performs decoding according to the block code set, which can improve an error correction capability during decoding.

It should be understood that sequence numbers of the foregoing processes do not mean execution sequences in various embodiments of the present invention. The execution sequences of the processes should be determined according to functions and internal logic of the processes, and should not be construed as any limitation on the implementation processes of the embodiments of the present invention.

It should be noted that, in this embodiment of the present invention, ±1 indicates that the numeric value is 1 or −1. For example, a difference between 2 and 3 may be expressed as 2−3=−1, or may be expressed as 3−2=1, both of which indicate the difference between 2 and 3 and only differ in selections of minuends and subtrahends.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A data transmission method, comprising:
   determining, by a transmit end, a target code length L, wherein the target code length is a quantity of bits comprised in each block code word in a block code set to be generated, and $L \geq 3$;
   determining an original code length K, wherein the original code length is a quantity of bits comprised in an original code word to be transmitted to a receive end, and $L > K \geq 2$;
   generating an initial code block according to the original code length K, wherein the initial code block comprises $2^K$ initial code words;
   generating a superposition code block according to the target code length and an arrangement order of the $2^K$ initial code words in the initial code block, wherein the superposition code block comprises $2^K$ superposition code words, and the $2^K$ initial code words correspond to the $2^K$ superposition code words in a one-to-one manner, and superposing the initial code words and the corresponding superposition code words to generate the block code words in the block code set, so that a difference between feature code distances in the block code set is $\pm 1$ or 0, wherein the feature code distance is a code distance between the block code words;
   performing coding processing on the original code word according to the block code set, so as to determine, from the block code words in the block code set, a target block code word corresponding to the original code word; and
   transmitting the target block code word to the receive end.

2. The method according to claim 1, wherein:
   when $K \leq 3$, the initial code block comprises $2^K$ different initial code words, and each initial code word comprises K bits; and
   generating a superposition code block according to the target code length and an arrangement order of the $2^K$ initial code words in the initial code block comprises:
   determining a maximum code distance w between the superposition code words in the superposition code block according to the target code length L and the original code length K, and
   generating the superposition code block according to the arrangement order of the $2^K$ initial code words in the initial code block and the maximum code distance between the superposition code words in the superposition code block.

3. The method according to claim 1, wherein:
   when $K \geq 4$, generating an initial code block according to the original code length K, wherein the initial code block comprises $2^K$ initial code words, comprises:
   determining a sub block code set, wherein the sub block code set comprises $2^{K-1}$ sub block code words, a quantity of bits comprised in each sub block code word is $L_0$, the sub block code set is generated according to a first initial code block and a first superposition code block, the first initial code block comprises $2^{K-1}$ different first initial code words, each first initial code word comprises K-1 bits, the first superposition code block is determined according to the quantity $L_0$ of bits comprised in the sub block code word and an arrangement order of the $2^{K-1}$ first initial code words in the first initial code block, the superposition code block comprises $2^{K-1}$ superposition code words, each superposition code word comprises $L_0-K+1$ bits, and in the sub block code set, code distances between code words are all s, wherein $L_0 < L$,
   superposing four such sub block code sets to generate an intermediate block code set, wherein the intermediate block code set comprises $2^K$ intermediate block code words, and intermediate block code words arranged in the $z^{th}$ and $(z+2^{K-1})^{th}$ positions in the intermediate block code set are formed by superposition of sub block code words arranged in the $z^{th}$ positions in two such sub block code sets, and
   interchanging an intermediate block code word arranged in the $v^{th}$ position with an intermediate block code word arranged in the $(2^{K-1}-v+1)^{th}$ position in the intermediate block code set, and interchanging an intermediate block code word arranged in the $(2^{K-1}+v)^{th}$ position with an intermediate block code word arranged in the $(2^K-v+1)^{th}$ position in the intermediate block code set to generate a sub initial code block, wherein the initial code block comprises x such sub initial code blocks, $v \in [1, 2^{K-2}]$, and $x \geq 1$; and
   generating a superposition code block according to the target code length and an arrangement order of the $2^K$ initial code words in the initial code block comprises:
   generating a superposition code block comprising y sub superposition code blocks, so that each sub superposition code block comprises $2^K$ superposition code words with a code length $L_1$, wherein elements on an antidiagonal in a code distance matrix of each sub superposition code block are all q, and remaining non-zero elements are all p, wherein $q > p > 0$, $y \geq 1$, and the following formulas are satisfied:

$x:y=(q-p):s$, and $x*L_0+y*L_1=L$.

4. The method according to claim 1, wherein the $a^{th}$ initial code word in the $2^K$ initial code words corresponds to the $a^{th}$ superposition code word in the $2^K$ superposition code words, wherein a is a positive integer and $a \leq 2^K$.

5. The method according to claim 4, wherein:
   when K=2 and L is an even number, the initial code block comprises $2^K$ different initial code words, and each initial code word comprises K bits; and
   generating a superposition code block according to the target code length and an arrangement order of the $2^K$ initial code words in the initial code block comprises:
   generating L/2-1 sub superposition code blocks, wherein each sub superposition code block comprises $2^K$ sub superposition code words, and each sub superposition code word comprises two bits, and
   performing first ordering processing on each sub superposition code block according to the arrangement order of the $2^K$ initial code words in the initial code block, so as to determine an arrangement order of the sub superposition code words in each sub superposition code block, and generating the superposition code block according to each sub superposition code block obtained after the first ordering processing, wherein a first sub superposition code word arranged in the first position in the $m^{th}$ sub superposition code block obtained after the first ordering processing is any code word in the $m^{th}$ sub superposition code block, and a second sub superposition code word in the $m^{th}$ sub superposition code block is arranged in the $i_1^{th}$ position, wherein the second sub superposition code word is a code word having a maximum code distance from the first sub superposition code word in the $m^{th}$ sub superposition code block, and for a first local block code set that is formed by m−1 sub superposition code blocks before the $m^{th}$ sub superposition code block and the initial code block and comprises $2^K$ local block code words, a first local block code word arranged in the $i_1^{th}$ position is a code word having a minimum code distance from a second local block code word arranged in the first position in the $2^K$ local block code words; or performing second ordering processing on each sub superposition code block according to the arrangement order of the $2^K$ initial code words in the initial code block, so as to determine an arrangement order of the sub superposition code words in each sub superposition code block, and generating the superposition code block according to each sub superposition code block obtained after the second ordering processing, wherein a third sub superposition code word arranged in the first position in the $m^{th}$ sub superposition code block obtained after the second ordering processing is any code word in the $m^{th}$ sub superposition code block, and a fourth sub superposition code word in the $m^{th}$ sub superposition code block is arranged in the $i_2^{th}$ position, wherein the fourth sub superposition code word is a code word having a minimum code distance from the third sub superposition code word in the $m^{th}$ sub superposition code block, and for a second local block code set that is formed by m−1 sub superposition code blocks before the $m^{th}$ sub superposition code block and the initial code block and comprises $2^K$ local block code words, a third local block code word arranged in the $i_2^{th}$ position is a code word having a maximum code distance from a fourth local block code word arranged in the first position in the $2^K$ local block code words.

6. The method according to claim 4, wherein:

when K=2 and L is an odd number, the initial code block comprises $2^K$ different initial code words, and each initial code word comprises K bits; and generating a superposition code block according to the target code length and an arrangement order of the $2^K$ initial code words in the initial code block comprises:

generating (L−1)/2 sub superposition code blocks, wherein a first sub superposition code block comprises $2^K$ sub superposition code words, each sub superposition code word comprises two bits, and first sub superposition code blocks are the first (L−1)/2−1 sub superposition code blocks in the (L−1)/2 sub superposition code blocks; and a second sub superposition code block comprises $2^K$ sub superposition code words, each sub superposition code word comprises one bit, and the second sub superposition code block is a last sub superposition code block in the (L−1)/2 sub superposition code blocks, performing third ordering processing on each first sub superposition code block according to the arrangement order of the $2^K$ initial code words in the initial code block, so as to determine an arrangement order of the sub superposition code words in each first sub superposition code block, wherein a fifth sub superposition code word arranged in the first position in the $m^{th}$ first sub superposition code block is any code word in the $m^{th}$ first sub superposition code block, and a sixth sub superposition code word in the $m^{th}$ first sub superposition code block is arranged in the $i_3^{th}$ position, wherein the sixth sub superposition code word is a code word having a maximum code distance from the fifth sub superposition code word in the $m^{th}$ first sub superposition code block, and for a third local block code set that is formed by m−1 first sub superposition code blocks before the $m^{th}$ sub superposition code block and the initial code block and comprises $2^K$ local block code words, a fifth local block code word arranged in the $i_3^{th}$ position is a code word having a minimum code distance from a sixth local block code word arranged in the first position in the $2^K$ local block code words, and in a fourth local block code set that is formed by the first sub superposition code blocks obtained after the third ordering processing and the initial code block and comprises $2^K$ local block code words, performing fourth ordering processing on the second sub superposition code block according to an arrangement of the $2^K$ local block code words, wherein:

if code distances between the local block code words in the fourth local block code set are completely the same, a quantity of code words 0 and a quantity of code words 1 in the second sub superposition code block are equal, and an arrangement order of the sub superposition code words in the second sub superposition code block is determined randomly; or if code distances between the local block code words in the fourth local block code set are not completely the same, when a code distance between a seventh local block code word arranged in the $i_4^{th}$ position and an eighth local block code word arranged in the $j_4^{th}$ position is not a maximum code distance in the code distances between the local block code words, a sub superposition code word arranged the an $i_4^{th}$ position is different from a sub superposition code word arranged in the $j_4^{th}$ position in the second sub superposition code block, or when a code distance between a seventh local block code word arranged in the $i_4^{th}$ position and an eighth local block code word arranged in the $j_4^{th}$ position is a maximum code distance in the code distances between the local block code words, a sub superposition code word arranged in the $i_4^{th}$ position is the same as a sub superposition code word arranged in the $j_4^{th}$ position in the second sub superposition code block, and generating the superposition code block according to the first sub superposition code blocks obtained after the third ordering processing and the second sub superposition code block obtained after the fourth ordering processing.

7. The method according to claim 4, wherein when K=2 and L is an odd number, generating a superposition code block according to the target code length and an arrangement order of the $2^K$ initial code words in the initial code block comprises:

generating (L−1)/2 sub superposition code blocks, wherein a first sub superposition code block comprises $2^K$ sub superposition code words, each sub superposition code word comprises two bits, and first sub superposition code blocks are the first $(L-1)/2-1$ sub superposition code blocks in the $(L-1)/2$ sub superposition code blocks; and a second sub superposition code block comprises $2^K$ sub superposition code words, each sub superposition code word comprises one bit, and the second sub superposition code block is a last sub superposition code block in the $(L-1)/2$ sub superposition code blocks;

performing fifth ordering processing on each first sub superposition code block according to the arrangement order of the $2^K$ initial code words in the initial code block, so as to determine an arrangement order of the sub superposition code words in each first sub superposition code block, wherein a seventh sub superposition code word arranged in the first position in the $m^{th}$ first sub superposition code block is any code word in the $m^{th}$ first sub superposition code block, and an eighth sub superposition code word in the $m^{th}$ first sub superposition code block is arranged in the $i_5^{th}$ position, wherein the eighth sub superposition code word is a code word having a minimum code distance from the seventh sub superposition code word in the $m^{th}$ first sub superposition code block, and for a fifth local block code set that is formed by m−1 first sub superposition code blocks before the $m^{th}$ sub superposition code block and the initial code block and comprises $2^K$ local block code words, a ninth local block code word arranged in the $i_5^{th}$ position is a code word having a maximum code distance from a tenth local block code word arranged in the first position in the $2^K$ local block code words;

in a sixth local block code set that is formed by the first sub superposition code blocks obtained after the fifth ordering processing and the initial code block and comprises $2^K$ local block code words, performing sixth ordering processing on the second sub superposition code block according to an arrangement of the $2^K$ local block code words, wherein if code distances between the local block code words in the sixth local block code set are completely the same, a quantity of code words 0 and a quantity of code words 1 in the second sub superposition code block are equal, and an arrangement order of the sub superposition code words in the second sub superposition code block is determined randomly, or if code distances between the local block code words in the sixth local block code set are not completely the same, when a code distance between an eleventh local block code word arranged in the $i_6^{th}$ position and a twelfth local block code word arranged in the $j_6^{th}$ position is not a maximum code distance in the code distances between the local block code words, a sub superposition code word arranged in the $i_6^{th}$ position is different from a sub superposition code word arranged in the $j_6^{th}$ position in the second sub superposition code block, or when a code distance between an eleventh local block code word arranged in the $i_6^{th}$ position and a twelfth local block code word arranged in the $j_6^{th}$ position is a maximum code distance in the code distances between the local block code words, a sub superposition code word arranged in the $i_6^{th}$ position is the same as a sub superposition code word arranged in the $j_6^{th}$ position in the second sub superposition code block; and generating the superposition code block according to the first sub superposition code blocks obtained after the fifth ordering processing and the second sub superposition code block obtained after the sixth ordering processing.

8. The method according to claim 1, wherein generating a superposition code block according to the target code length and an arrangement order of the $2^K$ initial code words in the initial code block comprises:

generating the superposition code block according to the target code length and the arrangement order of the $2^K$ initial code words in the initial code block, wherein the superposition code block comprises t sub superposition code blocks, and each sub superposition code block comprises $2^K$ sub superposition code words, wherein for a target local block code set that is formed by the initial code block and $t_0$ sub superposition code blocks and comprises $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, wherein the $t_0$ sub superposition code blocks comprise a sub superposition code block arranged in the first position to a sub superposition code block arranged in the $t_0^{th}$ position in the t sub superposition code blocks, $t \geq 1$, and $t_0 \in [1, t]$.

9. The method according to claim 8, wherein:

when $t \geq 2$, the target block code word comprises a target initial code word that is in the initial code block and corresponding to the original code word, and a target sub superposition code word that is in each sub superposition code block and corresponding to the original code word; and transmitting the target block code word to the receive end comprises:

transmitting a first sub target block code word at a first time, wherein the first sub target block code word comprises the target initial code word and target sub superposition code words in a sub superposition code block arranged in the first position to a sub superposition code block arranged in the $c_1^{th}$ position in the sub superposition code blocks, wherein $c_1 \geq 1$, and transmitting a second sub target block code word at a second time, wherein the second sub target block code word comprises target sub superposition code words in a sub superposition code block arranged in the $c_2^{th}$ position to a sub superposition code block arranged in the $c_3^{th}$ position in the sub superposition code blocks, wherein the second time is later than the first time, $c_2 = c_1 + 1$, and $c_3 \leq t$.

10. The method according to claim 9, wherein:

before transmitting a second sub target block code word at a second time, the method further comprises:

receiving code distance information transmitted by the receive end, wherein the code distance information is determined by the receive end according to a target average value, the target average value is an average value of minimum code distances between at least one receive code word received by the receive end and block code words in a first block code set, the at least one receive code word comprises a first receive code word corresponding to the first sub target block code word, and a quantity of bits comprised in each block code word in the first block code set is the same as a quantity of bits comprised in each receive code word, and determining a target code distance according to the code distance information; and transmitting a second sub target block code word at a second time comprises:

determining the second sub target block code word according to the target code distance, so that in a first target local block code set that is formed by the initial code block and $c_3$ sub superposition code blocks and comprises $2^K$ first target local block code words, a minimum value of code distances between the first target local block code words is greater than the target code distance, and transmitting the second sub target block code word at the second time.

11. A data transmission method, comprising:

determining, by a receive end, a target code length L, wherein the target code length is a quantity of bits comprised in each block code word in a block code set to be generated, and L≥3;

determining an original code length K, wherein the original code length is a quantity of bits comprised in an original code word, and L>K≥2;

generating an initial code block according to the original code length K, wherein the initial code block comprises $2^K$ initial code words;

generating a superposition code block according to the target code length and an arrangement order of the $2^K$ initial code words in the initial code block, wherein the superposition code block comprises $2^K$ superposition code words, and the $2^K$ initial code words correspond to the $2^K$ superposition code words in a one-to-one manner, and superposing the initial code words and the corresponding superposition code words to generate the block code words in the block code set, so that a difference between feature code distances in the block code set is ±1 or 0, wherein the feature code distance is a code distance between the block code words;

receiving a target block code word transmitted by a transmit end and corresponding to the original code word, wherein the target block code word is determined from the block code words in the block code set by the transmit end by performing coding processing on the original code word according to the block code set; and performing decoding processing on the target block code word according to the block code set to acquire the original code word.

12. The method according to claim 11, wherein when K≤3, the initial code block comprises $2^K$ different initial code words, and each initial code word comprises K bits; and generating a superposition code block according to the target code length and an arrangement order of the $2^K$ initial code words in the initial code block comprises:

determining a maximum code distance w between the superposition code words in the superposition code block according to the target code length L and the original code length K, and generating the superposition code block according to the arrangement order of the $2^K$ initial code words in the initial code block and the maximum code distance between the superposition code words in the superposition code block.

13. The method according to claim 11, wherein:

when K≥4, generating an initial code block according to the original code length K, wherein the initial code block comprises $2^K$ initial code words, comprises:

determining a sub block code set, wherein the sub block code set comprises $2^{K-1}$ sub block code words, a quantity of bits comprised in each sub block code word is $L_0$, the sub block code set is generated according to a first initial code block and a first superposition code block, the first initial code block comprises $2^{K-1}$ different first initial code words, each first initial code word comprises K−1 bits, the first superposition code block is determined according to the quantity $L_0$ of bits comprised in the sub block code word and an arrangement order of the $2^{K-1}$ first initial code words in the first initial code block, the superposition code block comprises $2^{K-1}$ superposition code words, each superposition code word comprises $L_0-K+1$ bits, and in the sub block code set, code distances between code words are all s, wherein $L_0<L$, superposing four such sub block code sets to generate an intermediate block code set, wherein the intermediate block code set comprises $2^K$ intermediate block code words, and intermediate block code words arranged in the $z^{th}$ and $(z+2^{K-1})^{th}$ positions in the intermediate block code set are formed by superposition of sub block code words arranged in the $z^{th}$ positions in two such sub block code sets, and interchanging an intermediate block code word arranged in the $v^{th}$ position with an intermediate block code word arranged in the $(2^{K-1}-v+1)^{th}$ position in the intermediate block code set, and interchanging an intermediate block code word arranged in the $(2^{K-1}+v)^{th}$ position with an intermediate block code word arranged in the $(2^K-v+1)^{th}$ position in the intermediate block code set to generate a sub initial code block, wherein the initial code block comprises x such sub initial code blocks, v ∈ [1, $2^{K-2}$], and x≥1; and generating a superposition code block according to the target code length and an arrangement order of the $2^K$ initial code words in the initial code block comprises:

generating a superposition code block comprising y sub superposition code blocks, so that each sub superposition code block comprises $2^K$ superposition code words with a code length $L_1$, wherein elements on an antidiagonal in a code distance matrix of each sub superposition code block are all q, and remaining non-zero elements are all p, wherein q>p>0, y≥1, and the following formulas are satisfied:

$x{:}y=(q-p){:}s$, and $x*L_0+y*L_1=L.$

14. The method according to claim 11, wherein generating a superposition code block according to the target code length and an arrangement order of the $2^K$ initial code words in the initial code block comprises:

generating the superposition code block according to the target code length and the arrangement order of the $2^K$ initial code words in the initial code block, wherein the superposition code block comprises t sub superposition code blocks, and each sub superposition code block comprises $2^K$ sub superposition code words, wherein for a target local block code set that is formed by the initial code block and $t_0$ sub superposition code blocks and comprises $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, wherein the $t_0$ sub superposition code blocks comprise a sub superposition code block arranged in the first position to a sub superposition code block arranged in the $t_0^{th}$ position in the t sub superposition code blocks, t≥1, and $t_0 \in [1, t]$.

15. A data transmission apparatus, comprising:
a processor, configured to:
  determine a target code length L and an original code length K, wherein the target code length is a quantity of bits comprised in each block code word in a block code set to be generated, the original code length is a quantity of bits comprised in an original code word to be transmitted to a receive end, L≥3, and L>K≥2,
  generate an initial code block according to the original code length K, wherein the initial code block comprises $2^K$ initial code words, generate a superposition code block according to the target code length and an arrangement order of the $2^K$ initial code words in the initial code block, wherein the superposition code block comprises $2^K$ superposition code words, and the $2^K$ initial code words correspond to the $2^K$ superposition code words in a one-to-one manner, and superpose the initial code words and the corresponding superposition code words to generate the block code words in the block code set, so that a difference between feature code distances in the block code set is ±1 or 0, wherein the feature code distance is a code distance between the block code words, and
  perform coding processing on the original code word according to the block code set, so as to determine, from the block code words in the block code set, a target block code word corresponding to the original code word; and
a transmitter, configured to transmit the target block code word to the receive end.

16. The apparatus according to claim 15, wherein:
when K≤3, the initial code block comprises $2^K$ different initial code words, and each initial code word comprises K bits; and
the processor is configured to:
  determine a maximum code distance w between the superposition code words in the superposition code block according to the target code length L and the original code length K, and generate the superposition code block according to the arrangement order of the $2^K$ initial code words in the initial code block and the maximum code distance w between the superposition code words in the superposition code block.

17. The apparatus according to claim 15, wherein the processor is configured to generate the superposition code block according to the target code length and the arrangement order of the $2^K$ initial code words in the initial code block, wherein the superposition code block comprises t sub superposition code blocks, and each sub superposition code block comprises $2^K$ sub superposition code words, wherein for a target local block code set that is formed by the initial code block and $t_0$ sub superposition code blocks and comprises $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, wherein the $t_0$ sub superposition code blocks comprise a sub superposition code block arranged in the first position to a sub superposition code block arranged in the $t_0^{th}$ position in the t sub superposition code blocks, t≥1, and $t_0 \in [1, t]$.

18. A data transmission apparatus, comprising:
a processor, configured to:
  determine a target code length L and an original code length K, wherein the target code length is a quantity of bits comprised in each block code word in a block code set to be generated, the original code length is a quantity of bits comprised in an original code word, L≥3, and L>K≥2, and
  generate an initial code block according to the original code length K, wherein the initial code block comprises $2^K$ initial code words, generate a superposition code block according to the target code length and an arrangement order of the $2^K$ initial code words in the initial code block, wherein the superposition code block comprises $2^K$ superposition code words, and the $2^K$ initial code words correspond to the $2^K$ superposition code words in a one-to-one manner, and superpose the initial code words and the corresponding superposition code words to generate the block code words in the block code set, so that a difference between feature code distances in the block code set is ±1 or 0, wherein the feature code distance is a code distance between the block code words;
a receiver, configured to receive a target block code word transmitted by a transmit end and corresponding to the original code word, wherein the target block code word is determined from the block code words in the block code set by the transmit end by performing coding processing on the original code word according to the block code set; and
wherein the processor is further configured to perform decoding processing on the target block code word according to the block code set to acquire the original code word.

19. The apparatus according to claim 18, wherein:
when K≤3, the initial code block comprises $2^K$ different initial code words, and each initial code word comprises K bits; and
the processor is configured to:
  determine a maximum code distance w between the superposition code words in the superposition code block according to the target code length L and the original code length K, and
  generate the superposition code block according to the arrangement order of the $2^K$ initial code words in the initial code block and the maximum code distance between the superposition code words in the superposition code block.

20. The apparatus according to claim 18, wherein the processor is configured to generate the superposition code block according to the target code length and the arrangement order of the $2^K$ initial code words in the initial code block, wherein the superposition code block comprises t sub superposition code blocks, and each sub superposition code block comprises $2^K$ sub superposition code words, wherein for a target local block code set that is formed by the initial code block and $t_0$ sub superposition code blocks and comprises $2^K$ target local block code words, a target local block code word arranged in the $u^{th}$ position is formed by superposition of an initial code word arranged in the $u^{th}$ position in the initial code block and a sub superposition code word arranged in the $u^{th}$ position in each of the $t_0$ sub superposition code blocks, a difference between target feature code distances in the target local block code set is 0, and the target feature code distance is a code distance between the target local block code words, wherein the $t_0$ sub superposition code blocks comprise a sub superposition code block arranged in the first position to a sub superposition code block arranged in the $t_0^{th}$ position in the t sub superposition code blocks, $t \geq 1$, and $t_0 \in [1,t]$.

* * * * *